(12) United States Patent
Wang

(10) Patent No.: US 10,312,304 B2
(45) Date of Patent: Jun. 4, 2019

(54) ORGANIC LIGHT-EMITTING DIODE PANEL AND MANUFACTURING METHOD USING THE SAME

(71) Applicant: FOCALTECH SYSTEMS CO., LTD., Hsinchu (TW)

(72) Inventor: Chun-Fu Wang, Hsinchu (TW)

(73) Assignee: FOCALTECH SYSTEMS CO., LTD., Hsinchu (TW)

( * ) Notice: Subject to any disclaimer, the term of this patent is extended or adjusted under 35 U.S.C. 154(b) by 0 days.

(21) Appl. No.: 16/006,621

(22) Filed: Jun. 12, 2018

(65) Prior Publication Data

US 2018/0294321 A1 Oct. 11, 2018

Related U.S. Application Data

(62) Division of application No. 15/787,310, filed on Oct. 18, 2017, now Pat. No. 10,038,036.

(30) Foreign Application Priority Data

Oct. 19, 2016 (TW) .............................. 105133678 A
Jun. 30, 2017 (TW) .............................. 106121905 A

(51) Int. Cl.
*H01L 51/52* (2006.01)
*H01L 27/32* (2006.01)
(Continued)

(52) U.S. Cl.
CPC ...... *H01L 27/3244* (2013.01); *H01L 27/3262* (2013.01); *H01L 51/0508* (2013.01);
(Continued)

(58) Field of Classification Search
CPC ............. H01L 27/3244; H01L 51/5012; H01L 27/3218; H01L 51/5056
See application file for complete search history.

(56) References Cited

U.S. PATENT DOCUMENTS 5,405,709 A * 4/1995 Littman ................. C09K 11/06
313/501
7,405,514 B2 * 7/2008 Tsujimura ........... H01L 51/5231
313/498

(Continued)

FOREIGN PATENT DOCUMENTS

TW I267320 B 11/2006

*Primary Examiner* — Donald L Raleigh
(74) *Attorney, Agent, or Firm* — Muncy, Geissler, Olds & Lowe, P.C.

(57) ABSTRACT

An organic light-emitting diode panel and a manufacturing method using the same are provided in the present invention. The OLED panel includes at least a pixel. The pixel includes an anode conducting layer, an insulation layer, an emitting layer (EML), a cathode layer and a reference voltage layer. The anode conducting layer is disposed on a transparent substrate. The insulation layer is disposed on the anode conducting layer and has a first cavity and a second cavity, wherein there is a distance between the first anode layer and the bottom of second cavity. There are a hole injection layer (HIL) and a hole transmission layer (HTL). The HIL is disposed on the first anode conducting layer. The HTL is disposed on the HIL. There are a cathode layer, an electronic injection layer (EIL) and an electronic transmission layer (ETL) in the second cavity. The cathode layer is exposed by the bottom of the second cavity. The EIL is disposed on the cathode layer. The ETL is disposed on the EIL. The EML is disposed on the insulation layer. The reference voltage layer is disposed on the EML.

16 Claims, 61 Drawing Sheets

(51) Int. Cl.
*H01L 51/05* (2006.01)
*H01L 51/50* (2006.01)

(52) U.S. Cl.
CPC .......... *H01L 51/5012* (2013.01); *H01L 51/52* (2013.01); *H01L 51/5203* (2013.01); *H01L 51/5206* (2013.01); *H01L 51/5221* (2013.01); H01L 51/504 (2013.01); H01L 51/5036 (2013.01); H01L 51/5056 (2013.01); H01L 51/5072 (2013.01); H01L 51/5296 (2013.01); H01L 2251/5392 (2013.01)

(56) References Cited

U.S. PATENT DOCUMENTS

| | | | |
|---|---|---|---|
| 2004/0075096 A1* | 4/2004 | Grushin | C07D 213/26 |
| | | | 257/79 |
| 2006/0001366 A1* | 1/2006 | Chung | H01L 27/3276 |
| | | | 313/506 |
| 2014/0167016 A1* | 6/2014 | Yoo | H01L 51/5028 |
| | | | 257/40 |
| 2016/0293670 A1* | 10/2016 | Chen | H01L 27/322 |

* cited by examiner

| Cathode |
| EIL+ETL |
| EML |
| HTL |
| HIL |
| Anode |
| Cathode |
| EIL+ETL |
| EML |
| HTL |
| HIL |
| Anode |
| Cathode |
| EIL+ETL |
| EML |
| HTL |
| HIL |
| Anode |
| Substrate |

201

ORGANIC LIGHT-EMITTING DIODE PANEL AND MANUFACTURING METHOD USING THE SAME

This application is a Divisional of co-pending application Ser. No. 15/787,310, filed on Oct. 18, 2017, for which priority is claimed under 35 U.S.C. § 120; and this application claims priorities of Application No. 105133678 filed in Taiwan R.O.C. on Oct. 19, 2016 and Application No. 106121905 filed in Taiwan R.O.C. on Jun. 30, 2017 under 35 U.S.C. § 119; the entire contents of all of which are hereby incorporated by reference.

BACKGROUND OF THE INVENTION

Field of the Invention

The present invention relates to the technology of an organic light-emitting diode, and more particularly, to an organic light-emitting diode panel and a manufacturing method thereof.

Description of the Related Art

The conventional organic light-emitting diode (OLED) device has a vertical stacked layer of the organic material layers by evaporating process as shown in FIG. 1. FIG. 1 illustrates a structure of the current OLED device. Referring to FIG. 1, the OLED device includes a glass substrate 100, an anode layer 101, a hole injection layer (HIL) 102, a hole transport layer (HTL) 103, an organic emitting layer (EML) 104, an electron transport layer (ETL) 105, an electron injection layer (EIL) 106 and a cathode layer 107. The total thickness of those stacked layers is also marked in FIG. 1.

In the prior art, there are drawbacks appear as follows:

1. Because the organic materials are very thin, about 1000~2000 Å in total, the circuits between the anode and cathode would be easily short circuit. It causes dot defect of the OLED display, unusual high current and the reduction of the production yield.

2. Because the low aperture ratio of the glass substrate of the thin film transistor, the bottom emission OLED has insufficient brightness.

3. The top emission OLED requires a high conduction and a high transparent material to serve as cathode. However, the cathode material is generally made of metal. If the cathode metal is too thin, its impedance is too high. If the cathode metal is too thick, the luminous efficiency would be reduced.

FIG. 2 illustrates a schematic depicting a current white OLED device. The 201 is the equivalent circuit of the white OLED device. In FIG. 2, the white OLED device is composed of red, green and blue OLED devices stacked in vertical direction. Because three OLED devices 201 are series, the driving voltage would be increased several times.

Moreover, the luminous efficiency of OLED materials depends on magnitude of the current flowing through the emitting layer, and the currents required by different color materials of the emitting layer to reach the best luminous efficiency are various. The currents flowing through the emitting layer in series structure (vertical stack) of the white OLED are the same, and it is difficult to find and employ a current value suitable for all the color emitting materials with their best luminous efficiency. Thus, the color shift of the white light occurs easily. Furthermore, in the manufacture of traditional tandem organic light emitting diodes, the organic materials must be formed by evaporating layer by layer. The manufacturing cost would be increased as number of stacked layers increases.

SUMMARY OF THE INVENTION

An objective of the present invention is to provide an organic light-emitting diode panel and a manufacturing method thereof to change the structure of OLED to achieve high luminous efficiency, production yield improvement and reduction in circuit complexity.

In view of this, the present invention provides an organic light-emitting diode panel, which includes at least a pixel. The pixel includes an anode layer, a first insulator, a cathode layer, a second insulator, a hole injection layer, a hole transport layer, an electron injection layer, an electron transport layer, an emitting layer and a reference voltage layer. The anode layer is disposed on a transparent substrate. The first insulator is disposed on the anode layer. The cathode layer is disposed on the first insulator. The second insulator is disposed on the anode layer and has a first cavity and a second cavity, wherein a bottom of the second cavity exposes the cathode layer and a bottom of the first cavity exposes the anode layer. The hole injection layer is disposed in the first cavity and disposed on the anode layer. The hole transport layer is disposed in the first cavity and disposed on the hole injection layer. The electron injection layer is disposed in the second cavity and disposed on the cathode layer. The electron transport layer is disposed in the second cavity and disposed on the electron injection layer. The emitting layer is disposed on the second insulator. The reference voltage layer is disposed on a side of the emitting layer, wherein a three-terminal OLED is formed by the anode layer, the cathode layer and the reference voltage layer.

In the organic light-emitting diode panel according to the preferred embodiment of the present invention, the pixel further includes a thin film insulator disposed between the reference voltage layer and the emitting layer such that its operation is similar to the MOSFET. In a preferred embodiment of the present invention, the pixel further includes a thin film transistor and a capacitor. The gate terminal of the thin film transistor is coupled to a scan line, the first source/drain terminal of the thin film transistor is coupled to a data line, the second source/drain terminal of the thin film transistor is coupled to the reference voltage layer. The first terminal of the capacitor is coupled to the second source/drain terminal of the thin film transistor, and the second terminal of the capacitor is coupled to a common voltage. Thus, the panel can be served as an active-matrix OLED panel.

In the organic light-emitting diode panel according to the preferred embodiment of the present invention, the voltage of the reference voltage layer is used to control a current from the anode layer to the cathode layer through the emitting layer, and a current path in the emitting layer. In addition, the emitting layer further includes a first color emitting material, a second color emitting material and a third color emitting material. The second color emitting material is disposed by a side of the first color emitting material, and the third color emitting material is disposed by a side of the second color emitting material. In this embodiment, these color emitting materials are arranged at the same level. The pixel emits the white light by mixing a first color light, a second color light and a third color light respectively emitting from the first color emitting material, the second color emitting material and the third color emitting material.

In another preferred embodiment, the emitting layer also includes a first color emitting material, a second color emitting material and a third color emitting material, and these color emitting materials are stacked vertically. That is, the second color emitting material is disposed on the first color emitting material, and the third color emitting material is disposed on the second color emitting material. In a preferred embodiment of the present invention, the pixel further includes a third insulator, disposed on the second insulator and covering the reference voltage layer.

The present invention further provides a manufacturing method for organic light-emitting diode panel. The manufacturing method includes: performing a sputtering process to form an anode layer on a transparent substrate; disposing a first insulator on the anode layer; disposing a cathode layer on the first insulator; disposing a second insulator on the first insulator; etching the first insulator and the second insulator to form a first cavity and a second cavity, wherein a bottom of the second cavity exposes the cathode layer; evaporating a hole injection layer in the first cavity, wherein the hole injection layer is disposed on the anode layer; evaporating a hole transport layer on the hole injection layer; evaporating an electron injection layer on the cathode layer; evaporating an electron transport layer on the electron injection layer; evaporating an emitting layer on the second insulator; and disposing a reference voltage layer on a side of the emitting layer.

In the organic light-emitting diode panel according to the preferred embodiment of the present invention, the pixel further includes a low impedance conductor layer, disposed on the emitting layer. By the current shunt, the OLED pixel breakdown is eliminated. In the other embodiment, the doping process is performed to the emitting layer, and the dopant may be donor or acceptor. Thus, the current flowing through the emitting layer is prevented from being excessively inclined toward the bottom of the emitting layer such that the OLED pixel breakdown is eliminated.

The present invention further provides a manufacturing method for organic light-emitting diode panel. Compared with the abovementioned method, the difference is that the reference voltage layer is disposed between the first cavity and the second cavity after the anode layer and the cathode layer are exposed respectively by the first cavity and the second cavity. In this preferred embodiment, it further includes disposing a low impedance organic layer, a transparent conductor layer or a thin metal layer on the emitting layer.

In the organic light-emitting diode panel according to the preferred embodiment of the present invention, the pixel further includes a low impedance conductor layer, disposed on the emitting layer. By the current shunt, the OLED pixel breakdown is avoided. In the other embodiment, the doping process is performed to implant a dopant in the emitting layer, and the dopant may be donor or acceptor. Thus, the carrier concentration of the upper side of the emitting layer is greater than the carrier concentration of lower side of the emitting layer. And, the current flowing through the emitting layer is prevented from being excessively inclined toward the lower side of the emitting layer, and then the OLED pixel breakdown is eliminated.

The spirit of the present invention is to change and improve the structure of OLED. The traditional stack manufacturing process is changed to an in-plane process, and the aperture ratio is increased. Furthermore, a reference voltage layer is further added on the emitting layer such that the pixel can be operated as 3-terminal device. As such, if the OLED pixel in the present invention is able to function as an active matrix OLED panel, at least one TFT can be removed in each pixel as compared to the traditional OLED pixel design. Thus, the process and the circuit complexity can be greatly reduced and the manufacturing cost can be also reduced.

The present invention will become more fully understood from the detailed description given hereinbelow and the accompanying drawings which are given by way of illustration only, and thus are not limitative of the present invention.

DETAILED DESCRIPTION OF THE INVENTION

Figure 1:
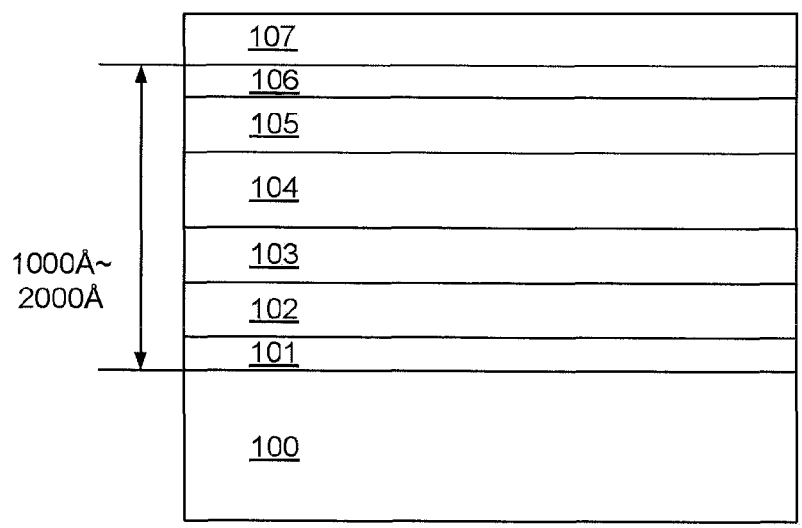
FIG. 1 illustrates a diagram depicting a current OLED device.
Figure 2:
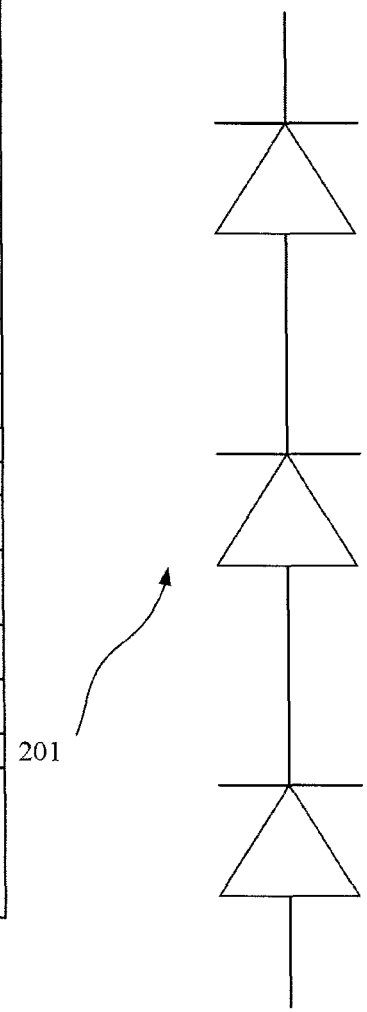
FIG. 2 illustrates a schematic depicting a white OLED device structure.

In the embodiments and claims, spatially relative terms, such as "underlying," "below," "lower," "overlying," "upper" and the like, may be used herein for ease of description to describe one element or feature's relationship to another element(s) or feature(s) as illustrated in the figures. Those skilled in the art may understand that the spatially relative terms are intended to encompass different orientations of the apparatus in use or operation in addition to the orientation depicted in the figures. For example, if an apparatus in the drawing is turned over, elements or features described as "below" or "beneath" other elements or features would then be oriented "above" the other elements. The terms "below" or "beneath" can, therefore, encompass both an orientation of above and below. If the apparatus may be otherwise oriented (rotated 90 degrees or at other orientations), then the spatially relative descriptors used herein may likewise be interpreted accordingly.

Figure 3:
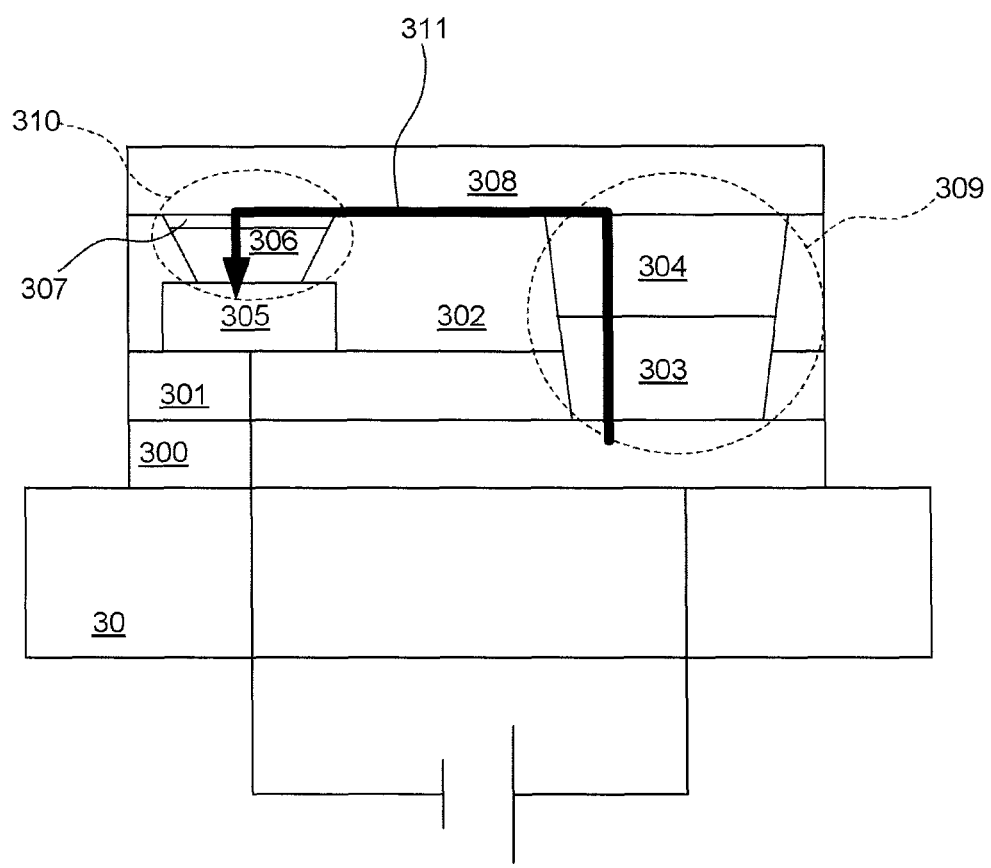
FIG. 3 illustrates a structure diagram depicting a pixel of the OLED panel according to a preferred embodiment of the present invention.

FIG. 3 illustrates a structure diagram depicting a pixel of the OLED panel according to a preferred embodiment of the present invention. Referring to FIG. 3, the pixel structure is non-stacked structure. The pixel includes an anode layer 300, a first insulator 301, a second insulator 302, a hole injection layer (HIL) 303, a hole transport layer (HTL) 304, a cathode layer 305, an electron injection layer (EIL) 306, an electron transport layer (ETL) 307 and an emitting layer 308. The anode layer 300 is disposed on the transparent substrate 30. The first insulator 301 is disposed on the anode layer 300. The cathode layer 305 is disposed on the first insulator 301. The second insulator 302 is disposed on the first insulator 301 and the cathode layer 305. The first insulator 301 and the second insulator 302 have a first cavity 309 and a second cavity 310. Further, the HIL 303 and HTL 304 are disposed in the first cavity 309. In the second cavity 310, the cathode layer 305, the EIL 306 and the ETL 307 is disposed from the bottom to top of the second cavity 310. In addition, the emitting layer 308 is disposed on the second insulator 302, the first cavity 309 and the second cavity 310.

According to the embodiment of the present invention, the emitting layer is disposed on a plane to achieve top emission. However, when the pixel is driven, the current would flow through the emitting layer 308 by a shortest path, as indicated by the reference numeral 311. So, the current would be accumulated at the lower side of the emitting layer 308. Under long-term operation, the material at the bottom of the emitting layer 308 would break down, and it also causes damage to the pixel.

Figure 4:
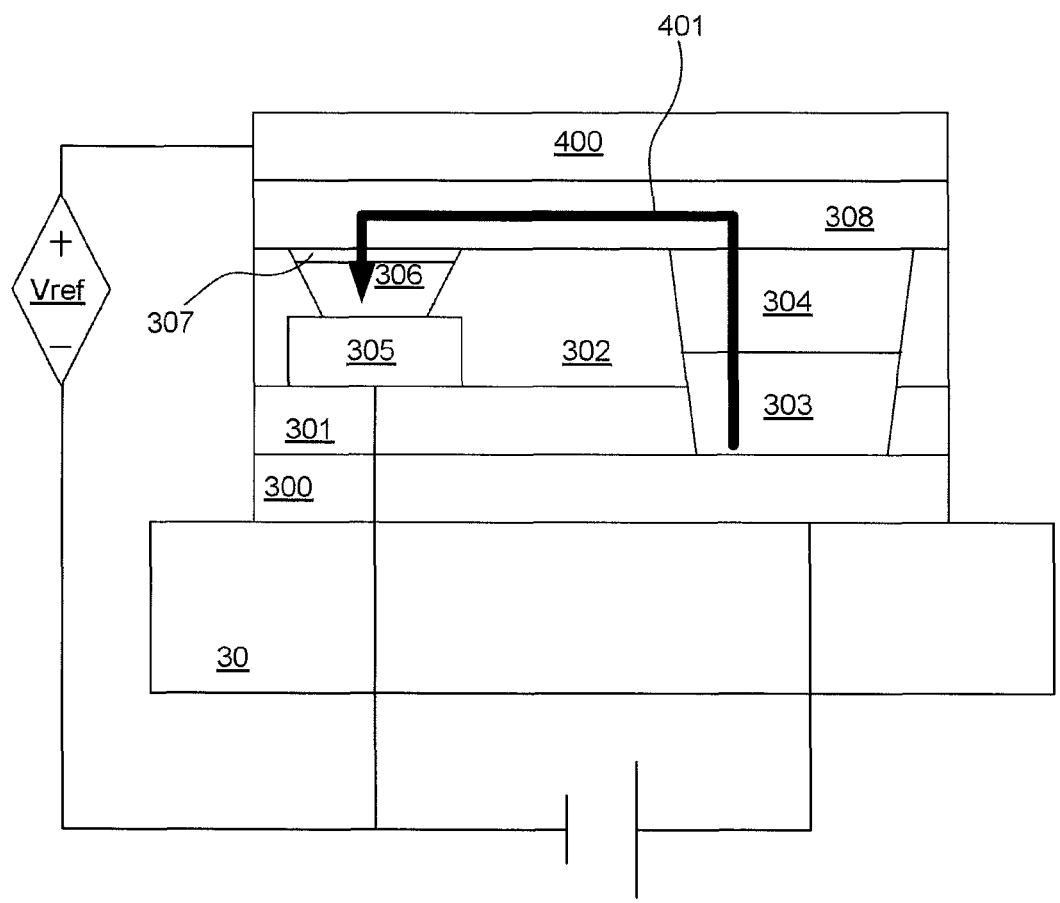
FIG. 4 illustrates a structure diagram depicting a pixel of the OLED panel according to a preferred embodiment of the present invention.

FIG. 4 illustrates a structure diagram depicting a pixel of the OLED panel according to a preferred embodiment of the present invention. Referring to FIG. 4, to avoid the breakdown of the material at the bottom of the emitting layer 308, in this embodiment, a reference voltage layer 400 is disposed on the emitting layer 308. The reference voltage layer 400 is served as a reference electrode. To control the pixel, a reference voltage Vref is additionally applied to the reference voltage layer 400, and the reference voltage Vref would induce more minority carriers generated from the upper side of the emitting layer 308. Thus, the electrons in the emitting layer 308 are more easily combined with the holes to produce photons. The lower driving voltage between the anode and the cathode is required to make the pixel emit light. And, the luminous efficiency of the pixel would be increased.

Similarly, a reference voltage is additionally applied to the reference voltage layer 400, the opposite polarity of the charge carrier would be attracted away from the bottom of the emitting layer 308 by the reference voltage Vref, and moves in the direction of the reference voltage layer 400, as indicated by the current path 401 illustrated in FIG. 4. Thus, the breakdown at the bottom of the emitting layer 308 would be eliminated.

Figure 5:
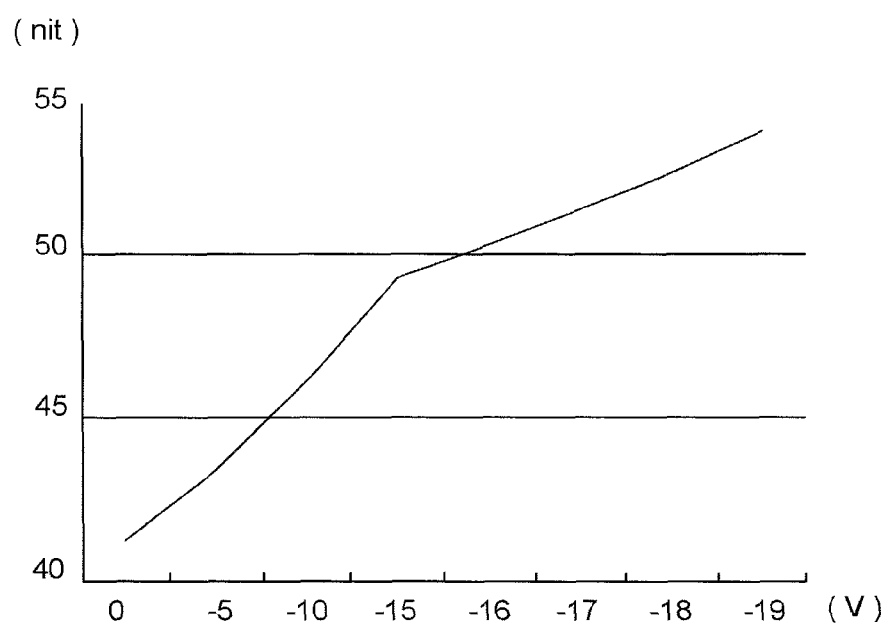
FIG. 5 illustrates a drawing depicting the luminance of the pixel of the OLED panel in respect to the reference voltage when the voltage between the anode and cathode is constant according to a preferred embodiment of the present invention.

FIG. 5 illustrates a drawing depicting the luminance of the pixel of the OLED panel in respect to the reference voltage when the voltage between the anode and cathode is constant according to a preferred embodiment of the present invention. Referring to FIG. 5, the voltage between the anode and the cathode is about 23V, and the shortest distance between the HTL and ETL is 18.41 um. That is the reason why the driving voltage is so high. In this embodiment, the reference voltage Vref is from 0 to −19V, and the luminance is changed from 40 to 55 nits. In this embodiment, because there is no insulation between the reference voltage layer 400 and the emitting layer 308, a partial current leakage from the reference voltage layer 400 may occur.

Figure 6:
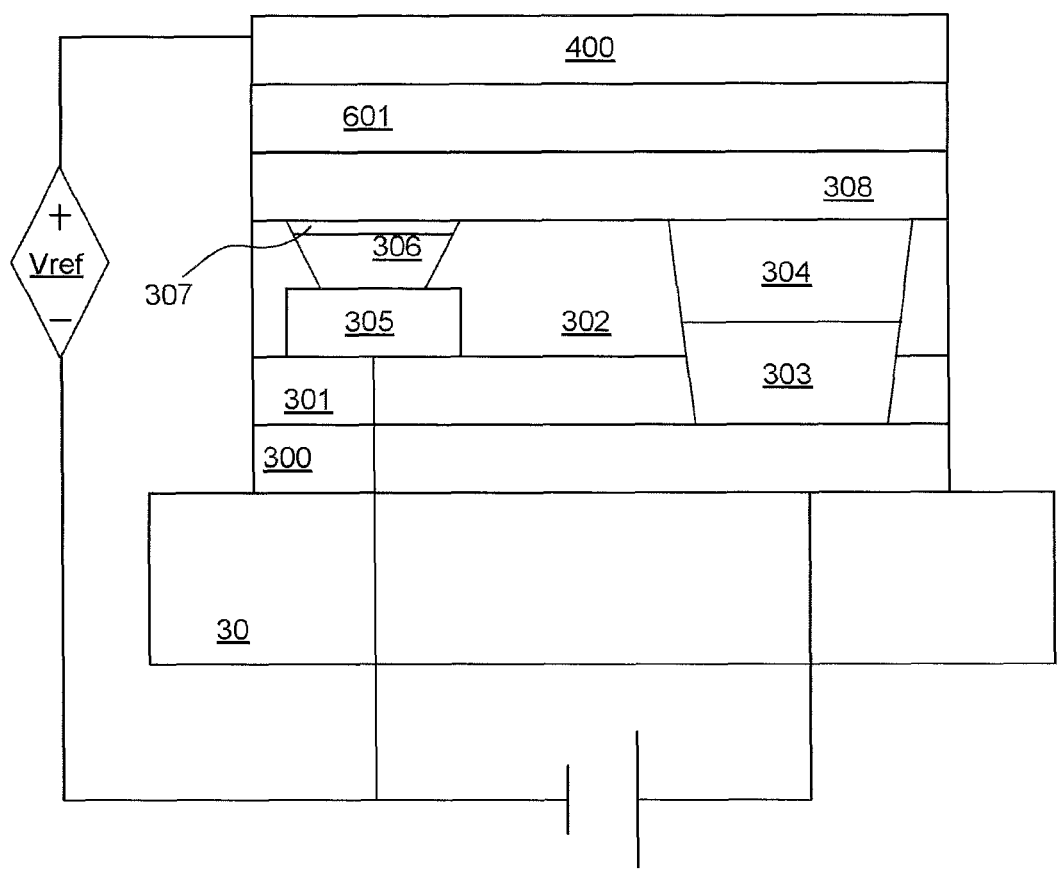
FIG. 6 illustrates a structure diagram depicting a pixel of the OLED panel according to a preferred embodiment of the present invention.

FIG. 6 illustrates a structure diagram depicting a pixel of the OLED panel according to a preferred embodiment of the present invention. Referring to FIG. 4 and FIG. 6, an insulator 601 is disposed between the reference voltage layer 400 and the emitting layer 308. The insulator 601 is used to block the current leakage from the emitting layer 308 to the reference voltage layer 400. Thus, the luminance control range would become greater. In one embodiment, the reference voltage layer 400 may be made of transparent conductor material.

Figure 7:
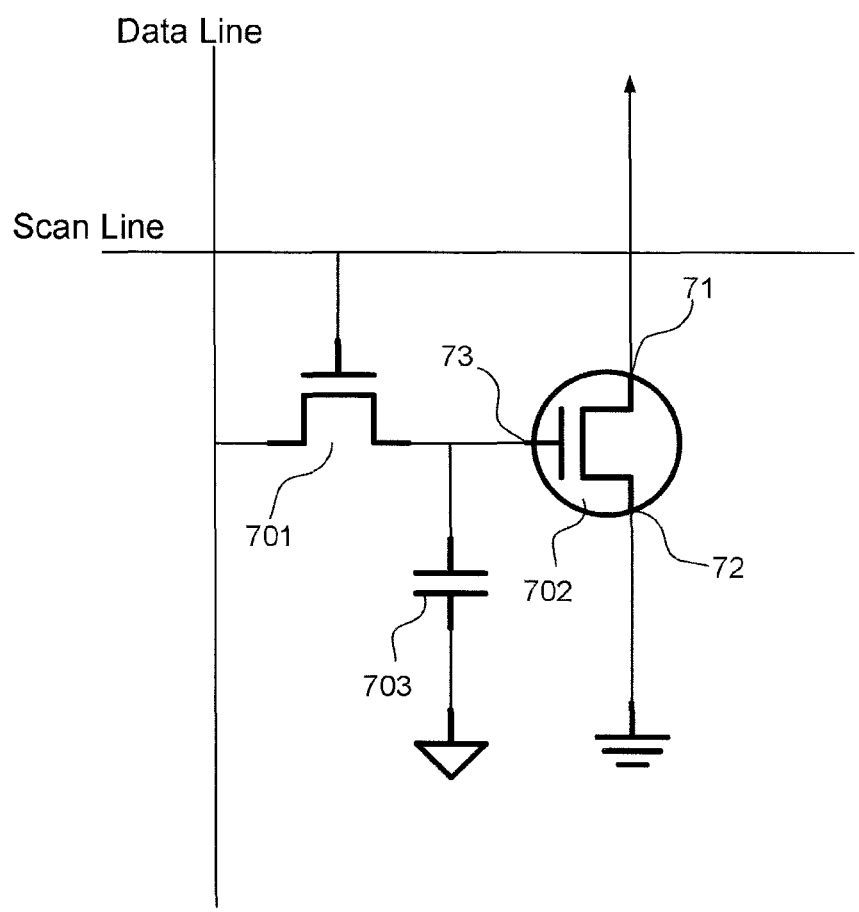
FIG. 7 illustrates an equivalent circuit diagram depicting a pixel of the OLED panel according to a preferred embodiment of the present invention.

FIG. 7 illustrates an equivalent circuit diagram depicting a pixel of the OLED panel according to a preferred embodiment of the present invention. Referring to FIG. 7, the equivalent circuit of the OLED pixel includes a TFT 701, a capacitor 703 and the OLED pixel 702. In this embodiment, the OLED pixel 702 includes an anode terminal 71, a cathode terminal 72 and a reference voltage terminal 73.

According to the abovementioned embodiment of the present invention, to apply a reference voltage Vref to the reference voltage layer 400 can increase the minority carrier injection. On the contrary, to change the polarity of the reference voltage Vref would reduce the minority carrier injection and the efficiency of photons production by recombination of electrons and holes. The brightness of the pixel is thus reduced and even the pixel may be unable to emit light. Therefore, by adjusting the polarity and/or the magnitude of the reference voltage Vref, the reference voltage layer can be used to serve as a switch of the OLED pixel 702 or the means for adjusting the luminance of the OLED pixel 702. Based on this, each pixel only requires one TFT 701 as compared with at least two TFTs that the conventional OLED pixel requires. Thus, the present invention can achieve the same display effect with lesser components such as TFTs.

In addition, the anode layer 300 and the reference voltage layer 400 may be implemented by ITO (Indium Tin Oxide), FTO (F2:SnO2), AZO (ZnO:Al) and so on. The present invention is not limited thereto. In one embodiment, the anode layer 300 can also be made of a non-transparent conductor material.

Figure 8A:
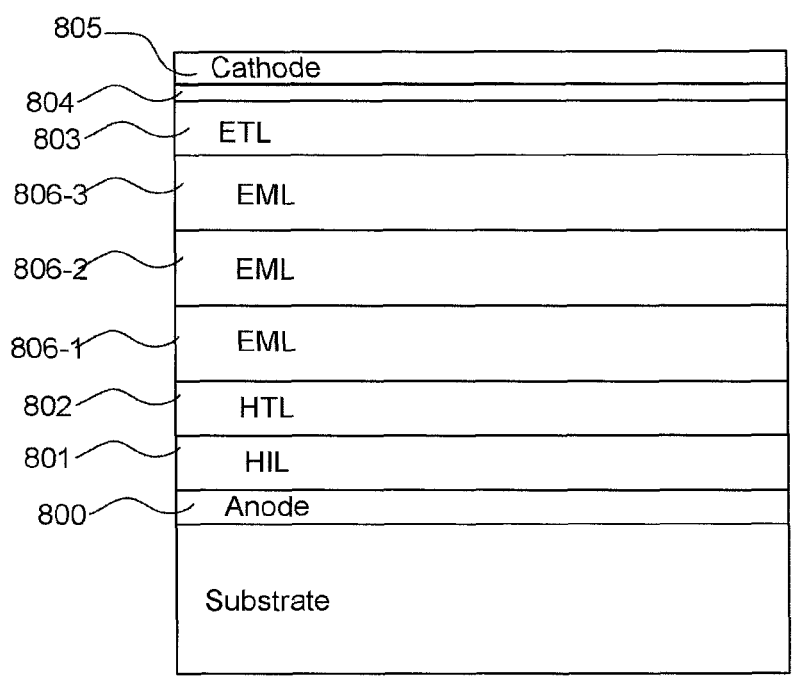
FIG. 8A illustrates a structure diagram depicting a white light pixel of the OLED panel according to a preferred embodiment of the present invention.

FIG. 8A illustrates a structure depicting a white light pixel of the OLED panel according to a preferred embodiment of the present invention. Referring to FIG. 8, the white light OLED is formed by stacking. The white light OLED includes an anode layer 800, an HIL 801, an HTL 802, an ETL 803, an EIL 804, a cathode layer 805 and emitting layers capable of emitting at least two colors. In one embodiment, for example, three emitting layers 806-1, 806-2 and 806-3, which respectively are the red emitting material, the green emitting material and the blue emitting material, are adopted. When the current flows through the cathode layer from the anode layer, the current would pass through three emitting layers 806-1, 806-2 and 806-3. By mixing the red, green and blue lights, the white light is obtained. Moreover, when the red, green and blue materials are driven by a constant current, their luminous efficiencies are different. In this embodiment, the thickness of the three emitting layers 806-1, 806-2 and 806-3 are modified to change the mixing light by the red, green and blue lights, such that the color temperature of the white light can be adjusted.

Figure 8B:
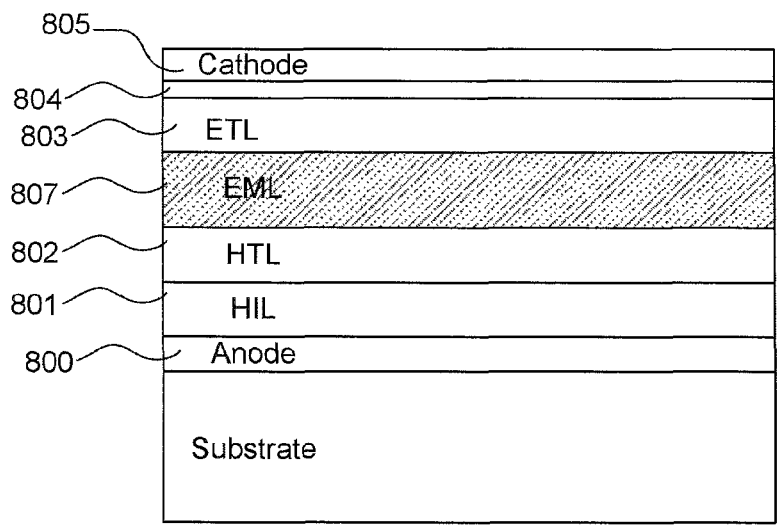
FIG. 8B illustrates a structure diagram depicting a white light pixel of the OLED panel according to a preferred embodiment of the present invention.

Similarly, FIG. 8B illustrates a structure diagram depicting a white light pixel of the OLED panel according to a preferred embodiment of the present invention. Referring to FIG. 8A and FIG. 8B, the difference between two figures is that the three emitting layers 806-1, 806-2 and 806-3 are replaced by one emitting layer 807. However, the emitting layer 807 adopts the material mixed by the red emitting material, the green emitting material and blue emitting material. Thus, when the current flows through the emitting layer 807, the white light is emitted by mixing the red, green and blue lights. Furthermore, the color temperature can be also modified by changing the proportion of the red emitting material, the green emitting material and blue emitting material to modify or adjust the mixing light of the red, green and blue lights. In another embodiment, the emitting layer 807 can also adopt two different color emitting materials, such as the yellow and blue emitting materials, to emit white light. Similarly, the color temperature can be also adjusted by changing the proportion of two materials.

Figure 8C:
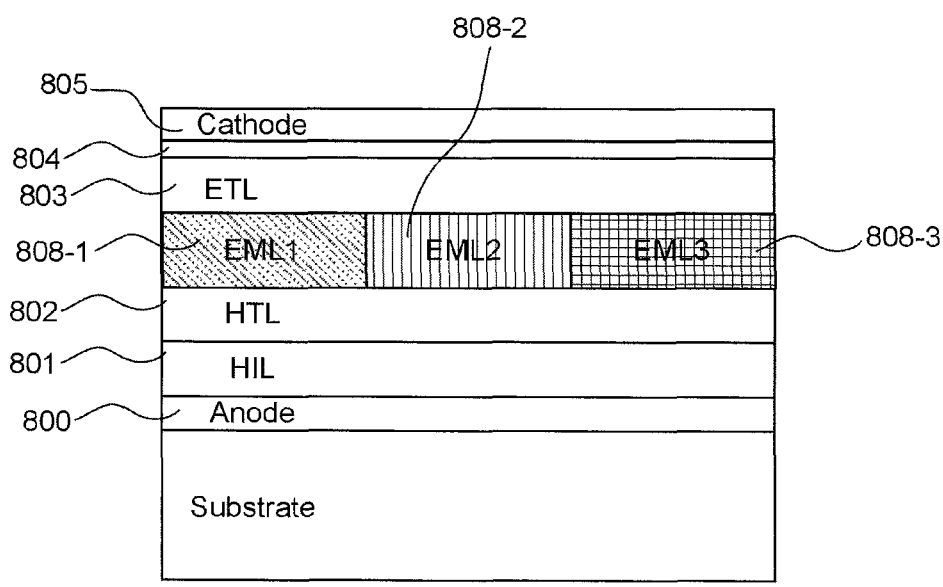
FIG. 8C illustrates a structure diagram depicting a white light pixel of the OLED panel according to a preferred embodiment of the present invention.
Figure 9A:
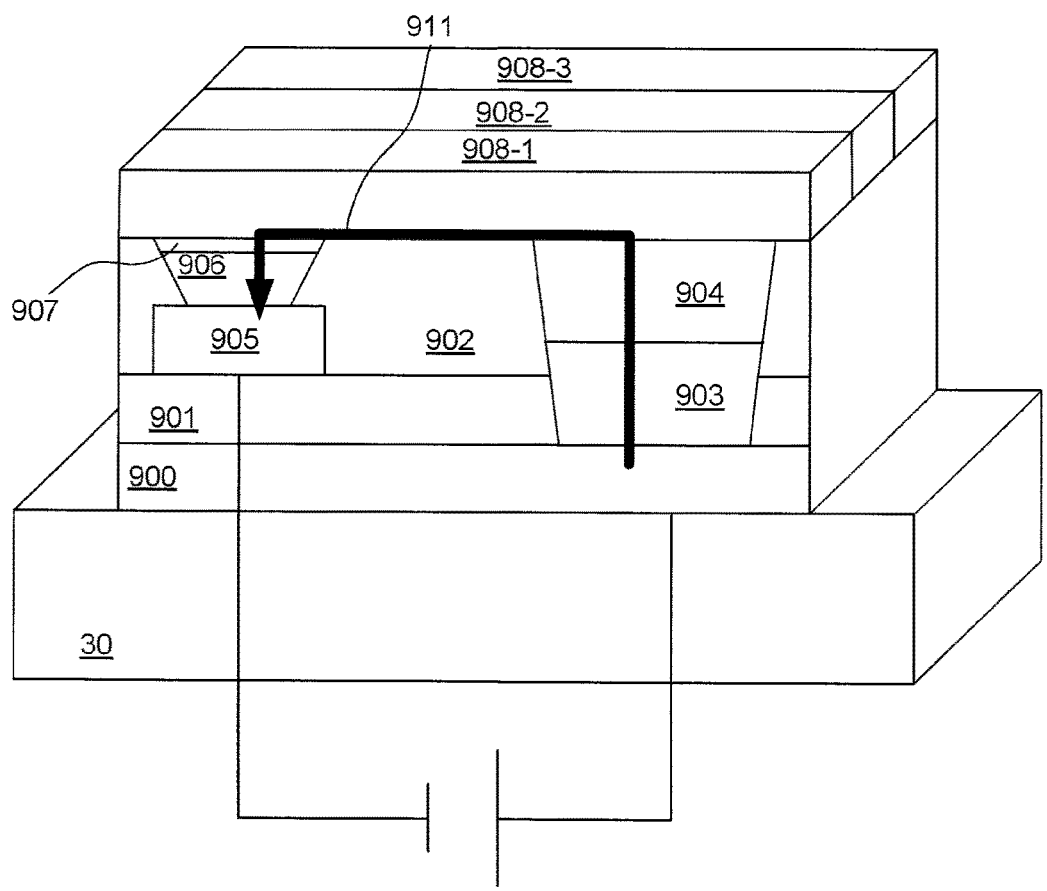
FIG. 9A illustrates a structure diagram depicting a white light pixel of the OLED panel according to a preferred embodiment of the present invention.

FIG. 8C illustrates a structure diagram depicting a white light pixel of the OLED panel according to a preferred embodiment of the present invention. Referring to FIG. 8A and FIG. 8C, the difference between two figures is that the three emitting layers 806-1, 806-2, 806-3 become a stacked structure. In FIG. 8C, the three emitting layers 806-1, 806-2, 806-3 are disposed on different positions of the same layer. When the current flows through the emitting layers 806-1, 806-2, 806-3, the white light is emitted by mixing the red, green and blue lights. Besides, the color temperature can be also modified by changing the proportion of the sizes of the red emitting material, the green emitting material and blue emitting material to modify the mixing light of the red, green and blue lights. Understandably, the two emitting layers can be adopted in this embodiment instead of three emitting layer, such as the yellow and blue emitting layers, to emit the white light FIG. 9A illustrates a structure diagram depicting a white light pixel of the OLED panel according to a preferred embodiment of the present invention. Referring to FIG. 9A, the pixel includes an anode layer 900, a first insulator 901, a second insulator 902, an HIL 903, an HTL 904, a cathode layer 905, an EIL 306, an ETL 307 and three emitting layers 908-1, 908-2 and 908-3. Compared with the embodiment in FIG. 3, the three emitting layers 908-1, 908-2 and 908-3 respectively are the red emitting material, the green emitting material and the blue emitting material. When the current flows from the anode to cathode, the current would pass through the three emitting layers 908-1, 908-2 and 908-3. The white light is emitted by mixing the red, green and blue lights. Besides, when the red, green and blue materials are driven by a constant current, the luminous efficiencies are different. In this embodiment, the occupied areas of the three emitting layers 908-1, 908-2, and 908-3 can be modified to change the mixing light by the red, green and blue lights, such that the color temperature of the white light can be adjusted.

Figure 9B:
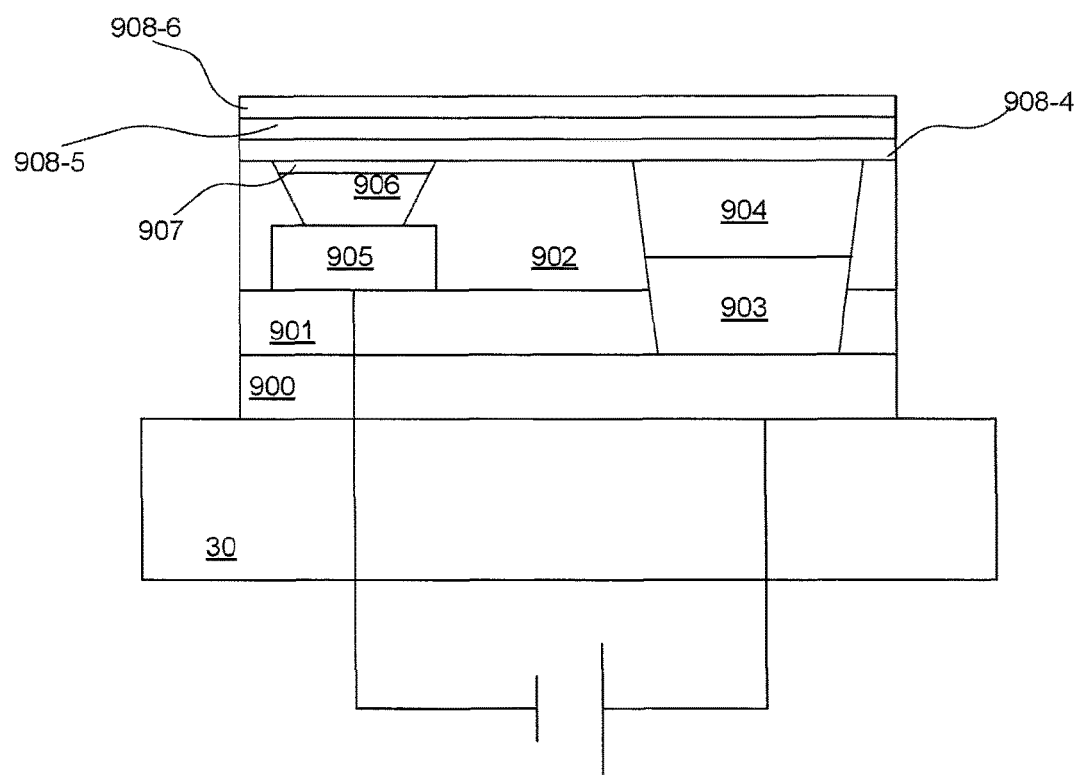
FIG. 9B illustrates a structure diagram depicting a white light pixel of the OLED panel according to a preferred embodiment of the present invention.
Figure 9C:
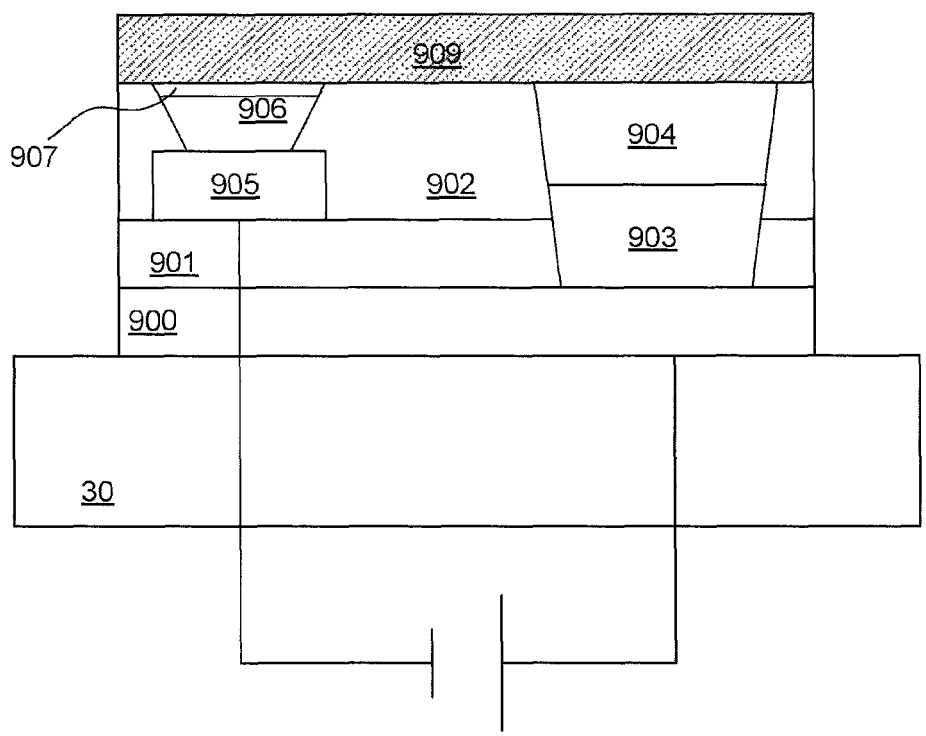
FIG. 9C illustrates a structure diagram depicting a white light pixel of the OLED panel according to a preferred embodiment of the present invention.

FIG. 9B illustrates a structure diagram depicting a white light pixel of the OLED panel according to a preferred embodiment of the present invention. Referring to FIG. 9B, similarly, the three emitting layers 908-4, 908-5 and 908-6 are adopted in this embodiment. However, the three emitting layers 908-4, 908-5 and 908-6 are disposed in stack. FIG. 9C illustrates a structure diagram depicting a white light pixel of the OLED panel according to a preferred embodiment of the present invention. Referring to FIG. 9C, similarly, the three emitting layers can be integrated into one emitting layer 909 as FIG. 8B. Therefore, it is only necessary to adjust the proportion of those emitting materials. The present invention is not limited thereto. Furthermore, although the embodiment adopts three emitting layers as an example, two emitting layers can be also implemented to emit white light, such as the blue emitting material and yellow material as described above. Thus, the present invention is not limited thereto.

Figure 10A:
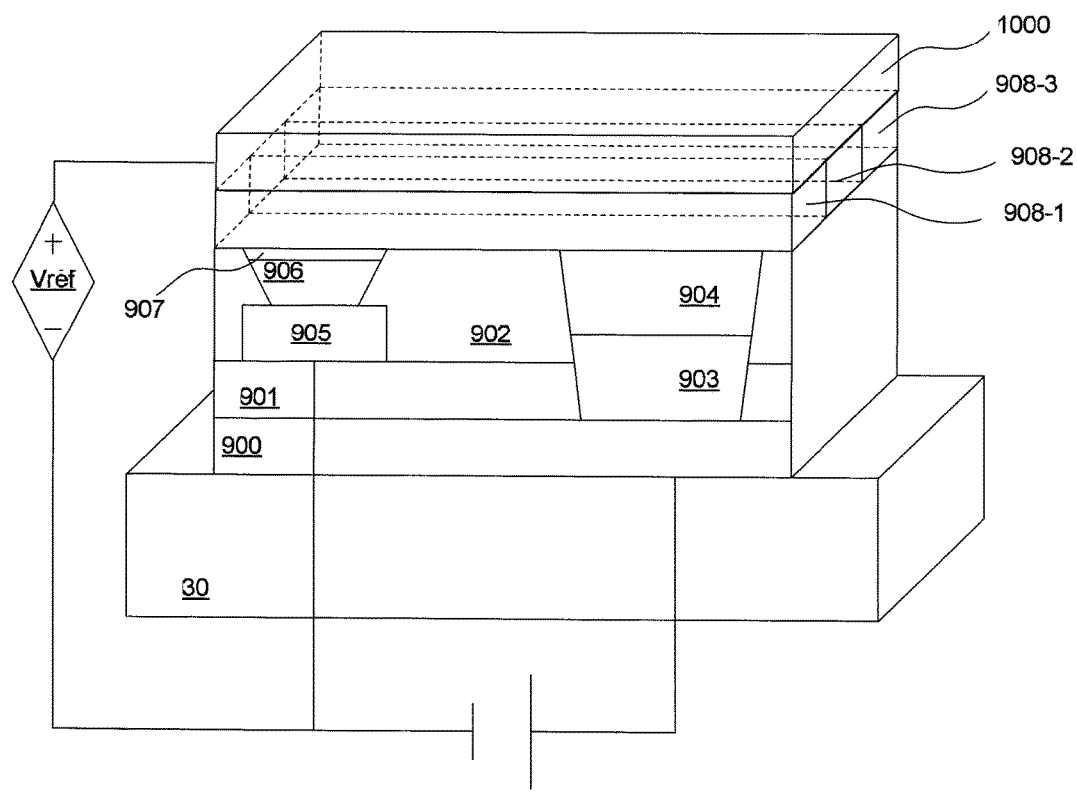
FIG. 10A illustrates a structure diagram depicting a white light pixel of the OLED panel according to a preferred embodiment of the present invention.

Similarly, FIGS. 9A, 9B and 9C disclose a top emission by horizontally disposing the emitting layer in a plane. However, when the pixel is illuminated, the current would flow through a shortest path (the lowest resistance path), as labeled by reference numeral 911. As such, the current is accumulated at the bottom of the emitting layers 908-1, 908-2 and 908-3. Under long-term operation, the bottom of the emitting layer would break down, and it also causes damage to the pixel FIG. 10A illustrates a structure diagram depicting a white light pixel of the OLED panel according to a preferred embodiment of the present invention. Referring to FIG. 9A and FIG. 10A, in order to avoid the breakdown of the bottom of the emitting layer, in this embodiment, a reference voltage layer 1000 is disposed on the emitting layers 908-1, 908-2, and 908-3. The reference voltage layer 1000 is used to serve as a reference voltage electrode. To control the pixel, a reference voltage Vref is additionally applied to the reference voltage layer 1000, and the reference voltage Vref would induce more minority carriers generating from the upper side of the emitting layers 908-1, 908-2, and 908-3. Thus, the electrons in the emitting layers 908-1, 908-2 and 908-3 are more easily combined with the holes to produce photons. The lower driving voltage between the anode and the cathode can be used to illuminate the pixel. And, the luminous efficiency of the pixel would be increased. Since the operation in FIG. 10A is similar to the operation in FIG. 4, the detail description is omitted.

Figure 10B:
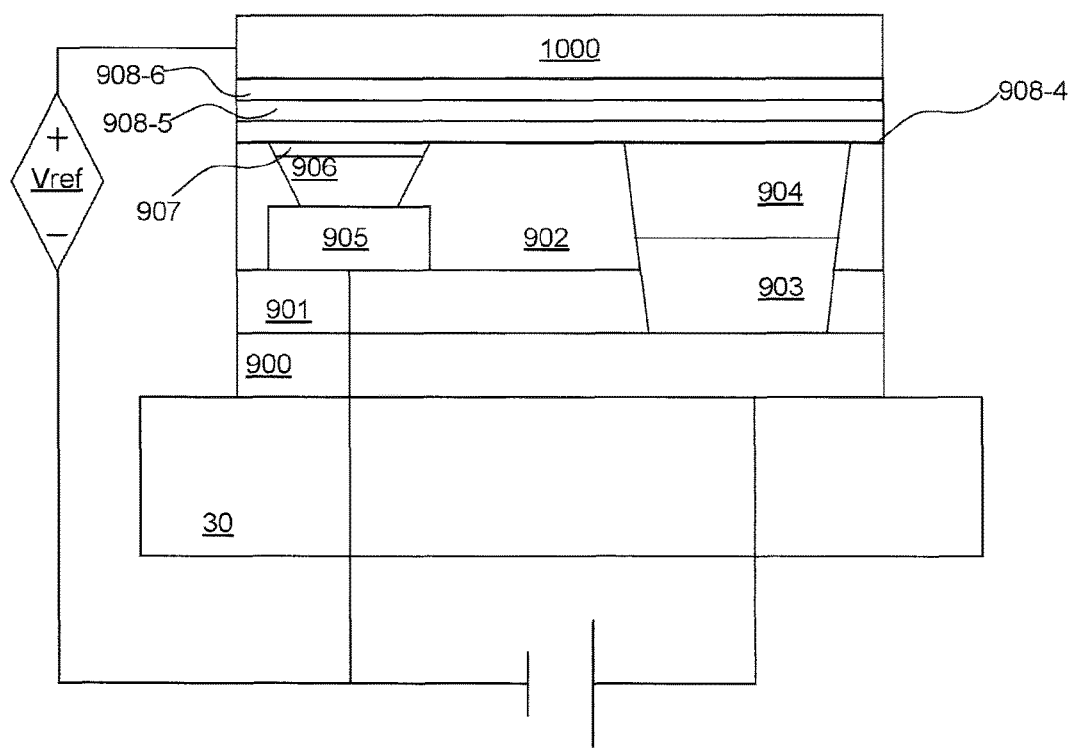
FIG. 10B illustrates a structure diagram depicting a white light pixel of the OLED panel according to a preferred embodiment of the present invention.
Figure 10C:
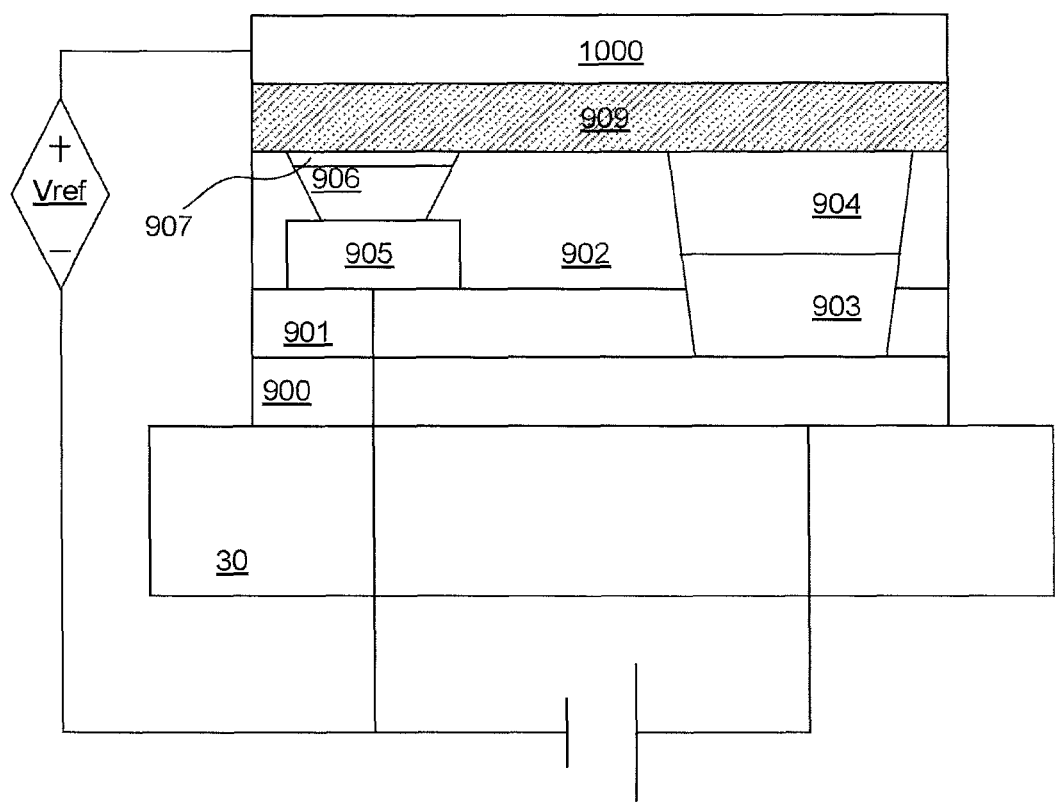
FIG. 10C illustrates a structure diagram depicting a white light pixel of the OLED panel according to a preferred embodiment of the present invention.

FIG. 10B illustrates a structure diagram depicting a white light pixel of the OLED panel according to a preferred embodiment of the present invention. Referring to FIG. 9B and FIG. 10B, the current path can be changed by applying the reference voltage Vref to the reference voltage layer 1000. The operation in FIG. 10B is similar to the operation in FIG. 10A, so the detail description is omitted. FIG. 10C illustrates a structure diagram depicting a white light pixel of the OLED panel according to a preferred embodiment of the present invention. Referring to FIG. 9C and FIG. 10C, the current path can be changed by applying the reference voltage Vref to the reference voltage layer 1000. The operation in FIG. 10C is similar to the operation in FIG. 10A, so the detailed description is omitted.

Figure 11:
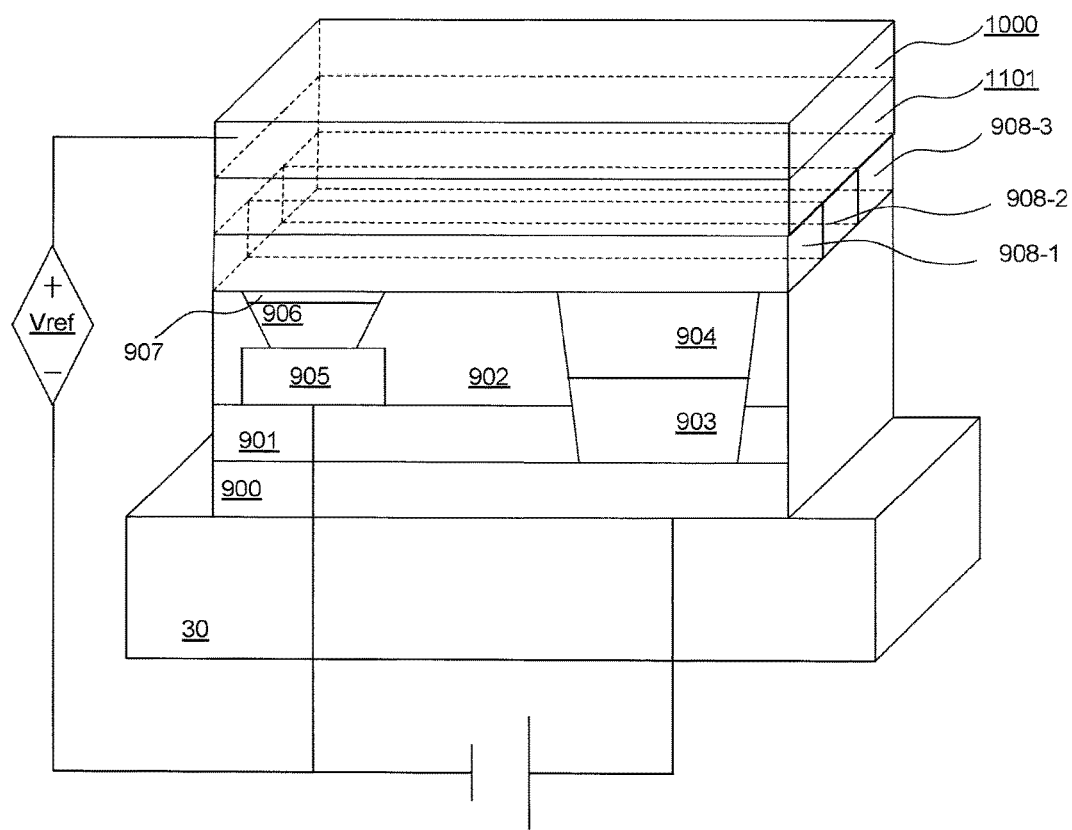
FIG. 11 illustrates a structure diagram depicting a white light pixel of the OLED panel according to a preferred embodiment of the present invention.

FIG. 11 illustrates a structure diagram depicting a white light pixel of the OLED panel according to a preferred embodiment of the present invention. Referring to FIG. 10A, FIG. 11 and FIG. 6, similarly, in this embodiment, an insulator 1101 is disposed between the reference voltage layer 1000 and the emitting layers 908-1, 908-2, 908-3. The insulator 1101 is used for blocking the current leakage from the emitting layers 908-1, 908-2 and 908-3 to the reference voltage layer 1000. Thus, the luminance control range would be greater. The same insulator 1101 can be also adopted in FIG. 10B and FIG. 10C. The detailed description is omitted herein for simplicity.

Figure 12:
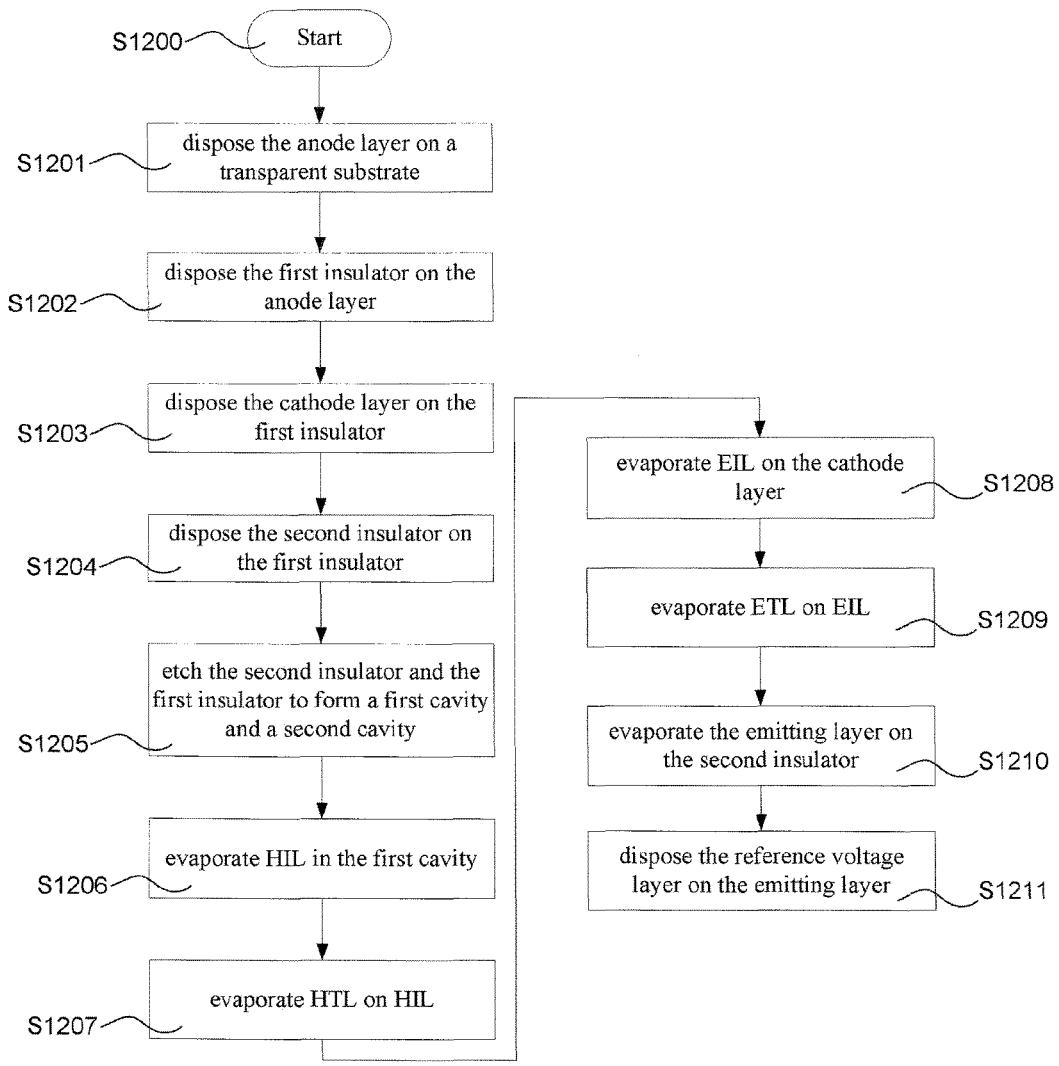
FIG. 12 illustrates a flowchart depicting a manufacturing method for organic light-emitting diode panel in FIG. 4 according to a preferred embodiment of the present invention.

FIG. 12 illustrates a flowchart depicting a manufacturing method for organic light-emitting diode panel in FIG. 4 according to a preferred embodiment of the present invention. Referring to FIG. 12, the manufacturing method for organic light-emitting diode panel includes the steps as follow.

In steps S1200, the method starts.

Figure 12A:
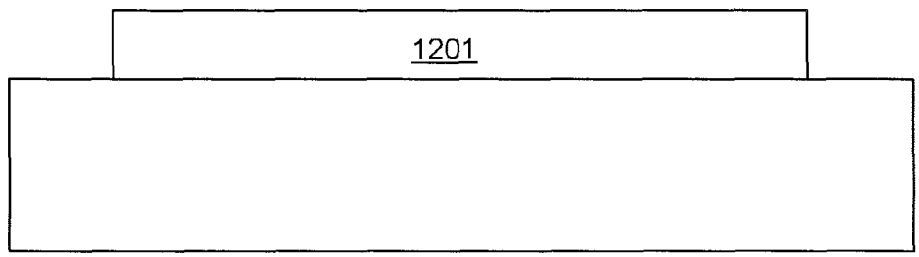
FIG. 12A illustrates a diagram depicting the step S1201 in the manufacturing method for organic light-emitting diode panel according to a preferred embodiment of the present invention.
Figure 12B:
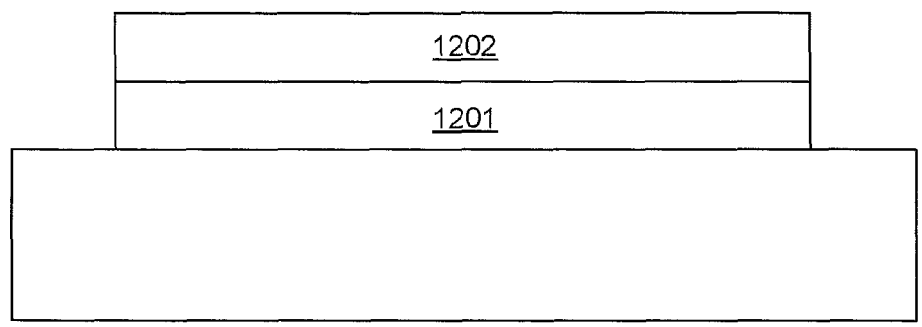
FIG. 12B illustrates a diagram depicting the step S1202 in the manufacturing method for organic light-emitting diode panel according to a preferred embodiment of the present invention.

In step S1201, the anode layer 1201 is disposed on a transparent substrate, such as a glass substrate. As shown in FIG. 12A, it illustrates a diagram depicting the step S1201 in the manufacturing method for organic light-emitting diode panel according to a preferred embodiment of the present invention. In step S1202, the first insulator 1202 is disposed on the anode layer 1201. FIG. 12B illustrates a diagram depicting the step S1202 in the manufacturing method for organic light-emitting diode panel according to a preferred embodiment of the present invention. In one embodiment, the transparent substrate can be a flexible one made of plastic material.

Figure 12C:
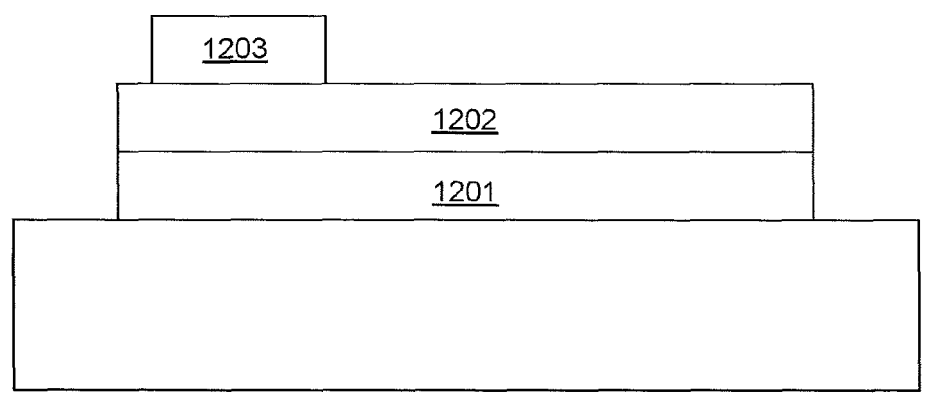
FIG. 12C illustrates a diagram depicting the step S1203 in the manufacturing method for organic light-emitting diode panel according to a preferred embodiment of the present invention.
Figure 12D:
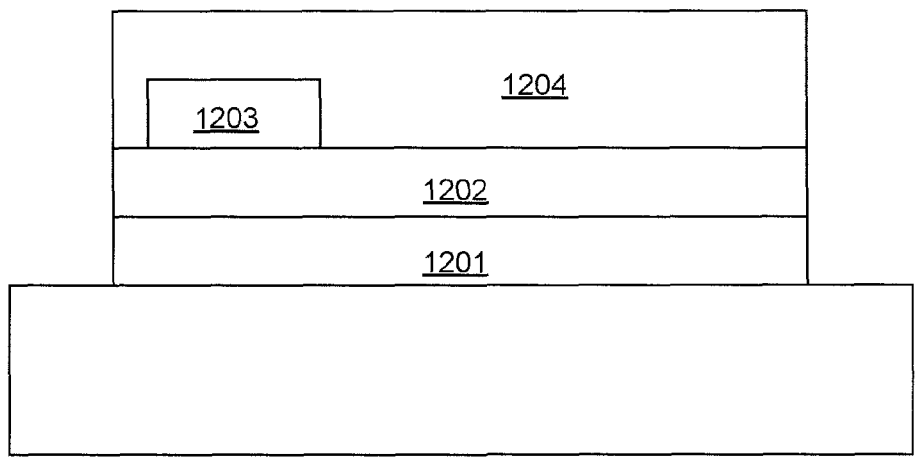
FIG. 12D illustrates a diagram depicting the step S1204 in the manufacturing method for organic light-emitting diode panel according to a preferred embodiment of the present invention.

In step S1203, the cathode layer 1203 is disposed on the first insulator 1202. FIG. 12C illustrates a diagram depicting the step S1203 in the manufacturing method for organic light-emitting diode panel according to a preferred embodiment of the present invention. In step S1204, the second insulator 1204 is disposed on the first insulator 1202. FIG.

12D illustrates a diagram depicting the step S1204 in the manufacturing method for organic light-emitting diode panel according to a preferred embodiment of the present invention.

Figure 12E:
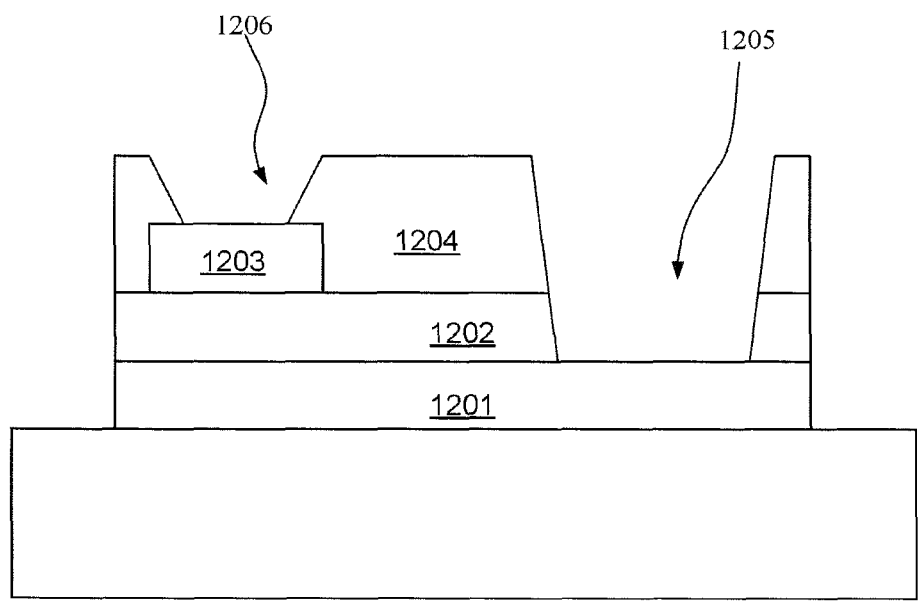
FIG. 12E illustrates a diagram depicting the step S1205 in the manufacturing method for organic light-emitting diode panel according to a preferred embodiment of the present invention.

In step S1205, the second insulator 1204 and the first insulator 1202 are etched to form a first cavity 1205 and a second cavity 1206. FIG. 12E illustrates a diagram depicting the step S1205 in the manufacturing method for organic light-emitting diode panel according to a preferred embodiment of the present invention. In this illustration, the first cavity 1205 and the second cavity 1206 is form by the etching process. In addition, the bottom of the second cavity 1206 exposes the cathode layer 1203. The cathode layer 1203 is generally made of a metal material, which is not able to be etched during this etching process.

Figure 12F:
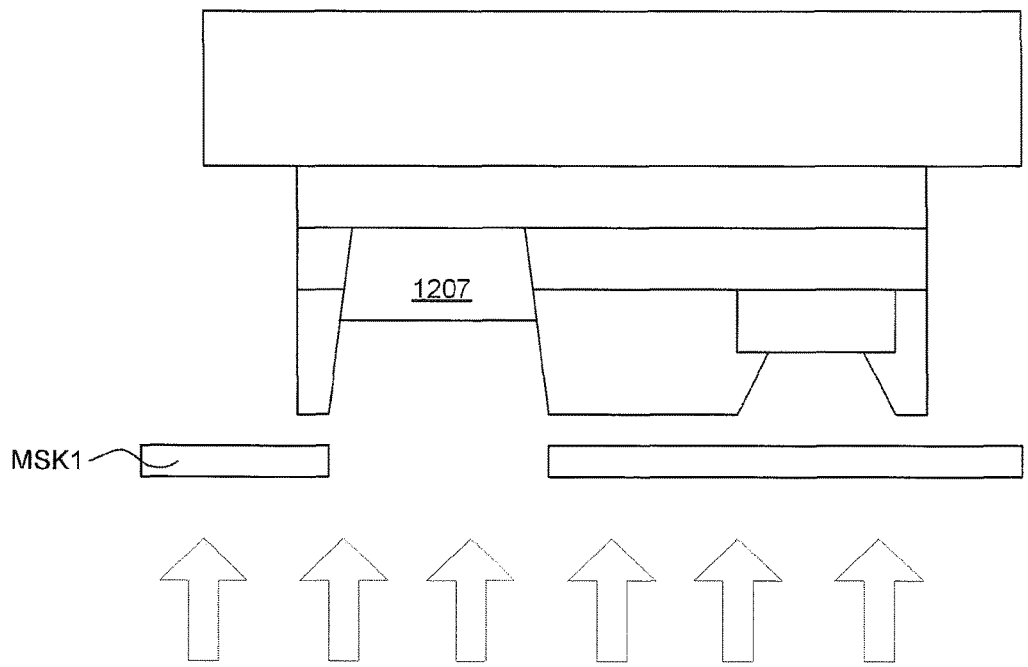
FIG. 12F illustrates a diagram depicting the step S1206 in the manufacturing method for organic light-emitting diode panel according to a preferred embodiment of the present invention.
Figure 12G:
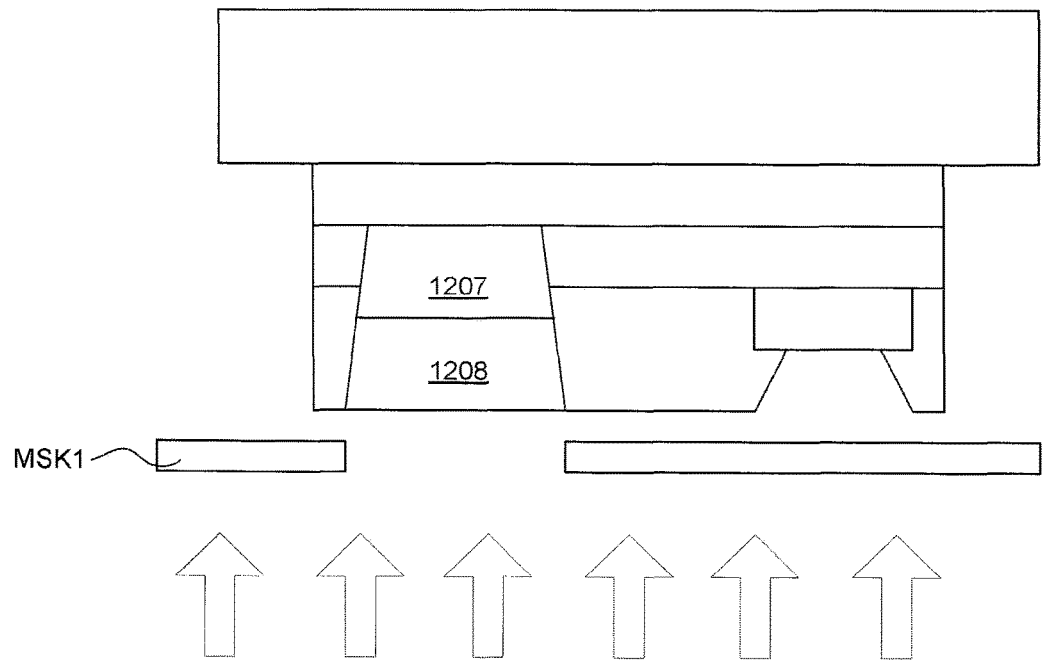
FIG. 12G illustrates a diagram depicting the step S1207 in the manufacturing method for organic light-emitting diode panel according to a preferred embodiment of the present invention.

In step S1206, the HIL 1207 is evaporated in the first cavity 1205. FIG. 12F illustrates a diagram depicting the step S1206 in the manufacturing method for organic light-emitting diode panel according to a preferred embodiment of the present invention. Referring to FIG. 12F, through the metal mask MSK1, the material of HIL is accurately evaporated into the first cavity 1205. In step S1207, the HTL 1208 is evaporated on the HIL 1207. FIG. 12G illustrates a diagram depicting the step S1207 in the manufacturing method for organic light-emitting diode panel according to a preferred embodiment of the present invention. Referring to FIG. 12G, through the metal mask MSK1, the material of HTL is accurately evaporated into the first cavity 1205 and stacked on the HIL 1207.

Figure 12H:
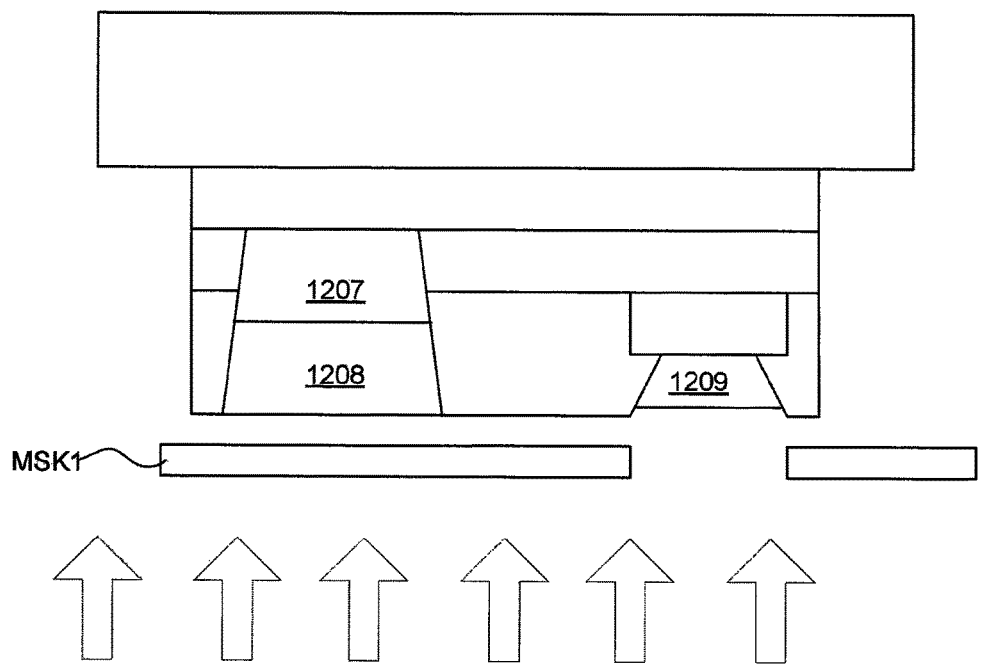
FIG. 12H illustrates a diagram depicting the step S1208 in the manufacturing method for organic light-emitting diode panel according to a preferred embodiment of the present invention.

In step S1208, the EIL 1209 is evaporated on the cathode layer 1203. FIG. 12H illustrates a diagram depicting the step S1208 in the manufacturing method for organic light-emitting diode panel according to a preferred embodiment of the present invention. In FIG. 12H, the opening area of the metal mask MSK1 is shifted to the upper side of the second cavity 1206. After that, evaporating EIL is performed, such that the material of the EIL is stacked on the cathode layer 1203.

Figure 12I:
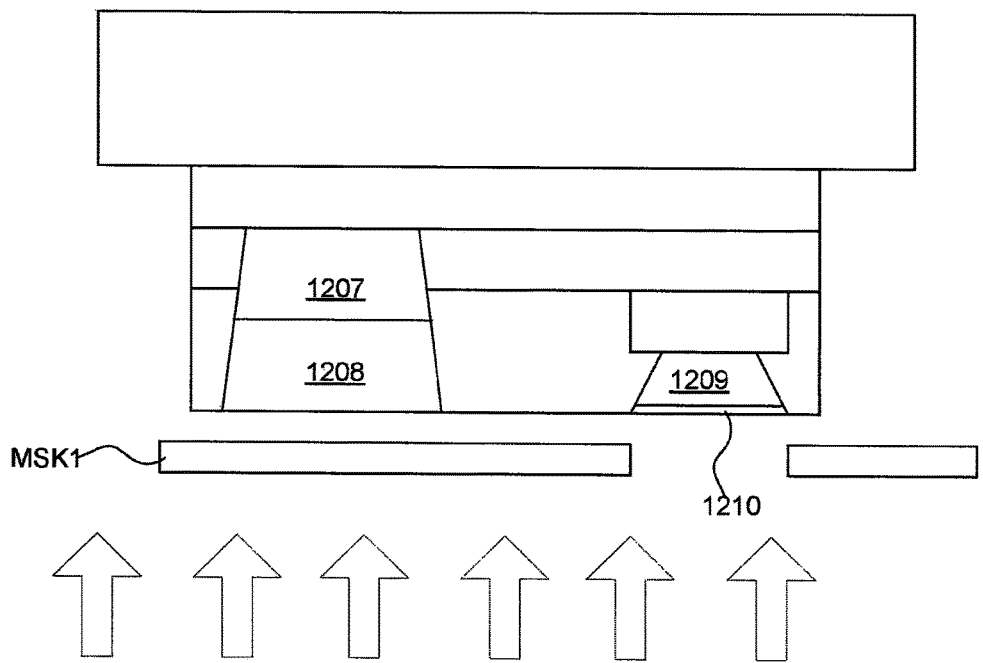
FIG. 12I illustrates a diagram depicting the step S1209 in the manufacturing method for organic light-emitting diode panel according to a preferred embodiment of the present invention.

In step S1209, the ETL 1210 is evaporated on the EIL 1209. FIG. 12I illustrates a diagram depicting the step S1209 in the manufacturing method for organic light-emitting diode panel according to a preferred embodiment of the present invention. Referring to FIG. 12I, evaporating the ETL 1210 is performed such that the material of the ETL 1210 is stacked on the EIL 1209. Generally, the ETL 1210 is very thin. This diagram is only a schematic illustration, not a real proportion.

Figure 12J:
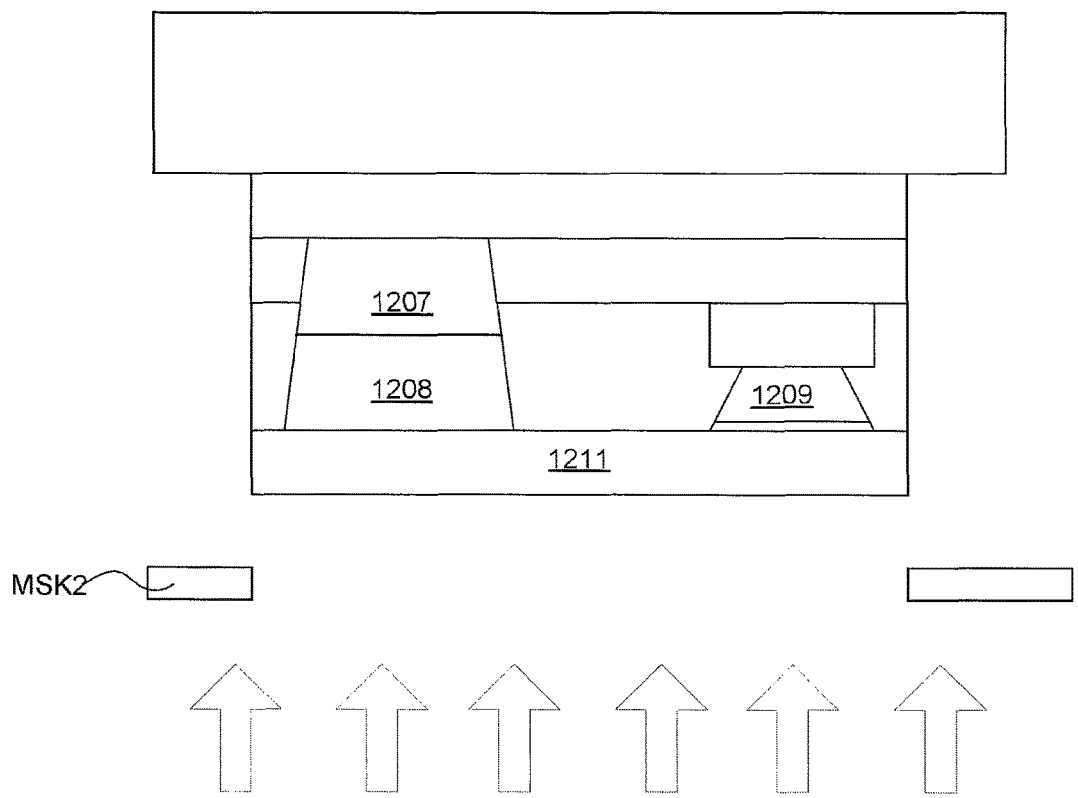
FIG. 12J illustrates a diagram depicting the step S1210 in the manufacturing method for organic light-emitting diode panel according to a preferred embodiment of the present invention.

In step S1210, the emitting layer 1211 is evaporated on the second insulator 1204, wherein the emitting layer 1211 covers the first cavity 1205 and the second cavity 1206. FIG. 12J illustrates a diagram depicting the step S1210 in the manufacturing method for organic light-emitting diode panel according to a preferred embodiment of the present invention. Referring to FIG. 12J, the emitting layer 1211 also adopts the evaporating process. Thus, another metal mask MSK2 is required. Generally, the emitting layer 1211 is red, green or blue organic emitting materials.

Figure 12K:
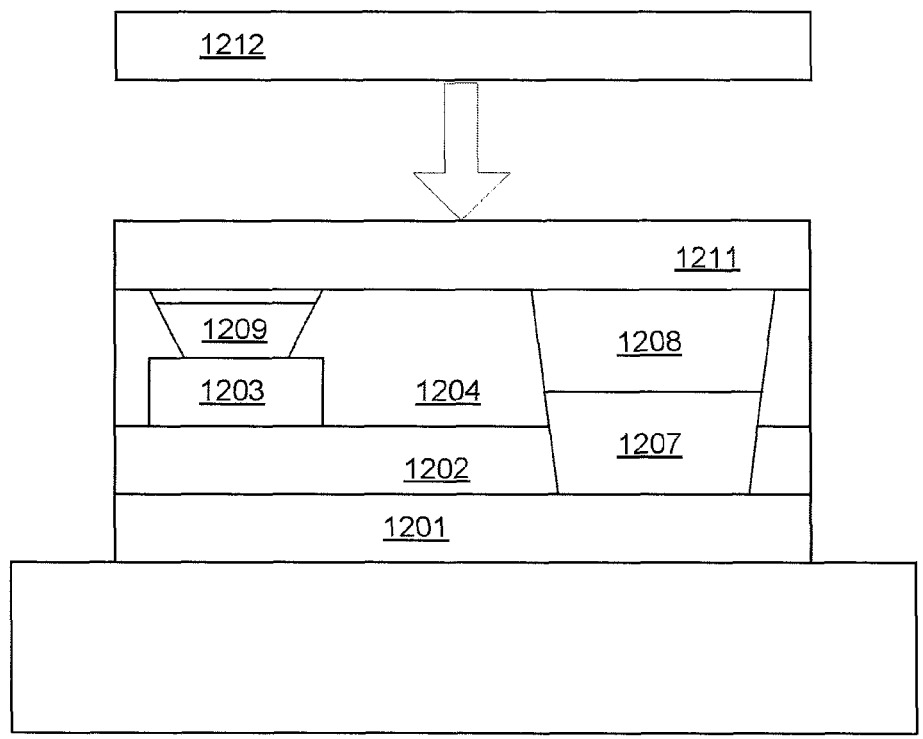
FIG. 12K illustrates a diagram depicting the step S1211 in the manufacturing method for organic light-emitting diode panel according to a preferred embodiment of the present invention.

In step S1211, the reference voltage layer 1212 is disposed on the emitting layer 1211. FIG. 12K illustrates a diagram depicting the step S1211 in the manufacturing method for organic light-emitting diode panel according to a preferred embodiment of the present invention. Referring to FIG. 12K, as such, the three-terminal OLED pixel, to which a reference voltage can be applied, as shown in FIG. 4 is completed.

Figure 13:
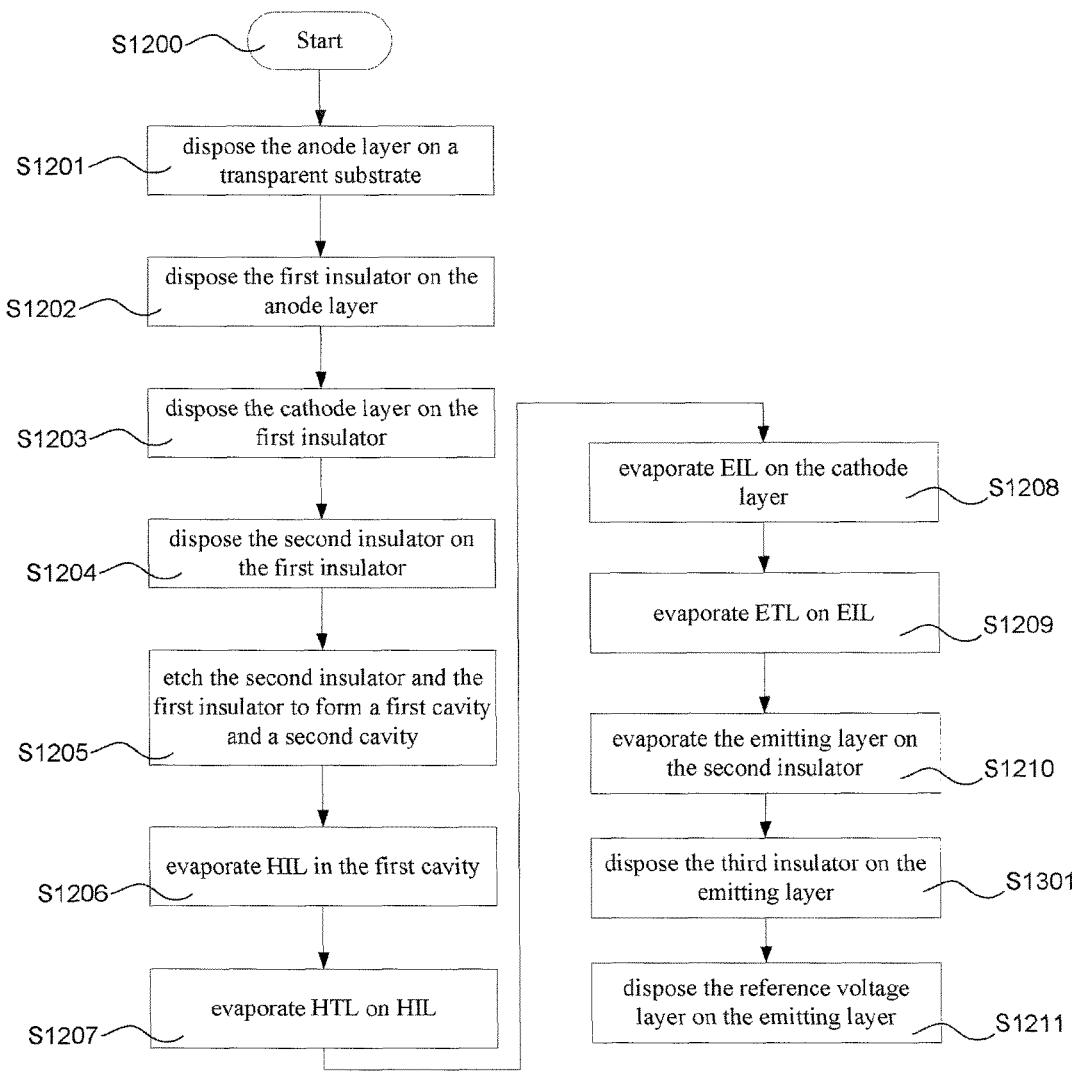
FIG. 13 illustrates a flowchart depicting the manufacturing method for organic light-emitting diode panel in FIG. 6 according to a preferred embodiment of the present invention.

FIG. 13 illustrates a flowchart depicting the manufacturing method for organic light-emitting diode panel in FIG. 6 according to a preferred embodiment of the present invention. Referring to FIG. 12 and FIG. 13, between the step S1210 and the step S1211, the method further includes the step as follow.

Figure 13A:
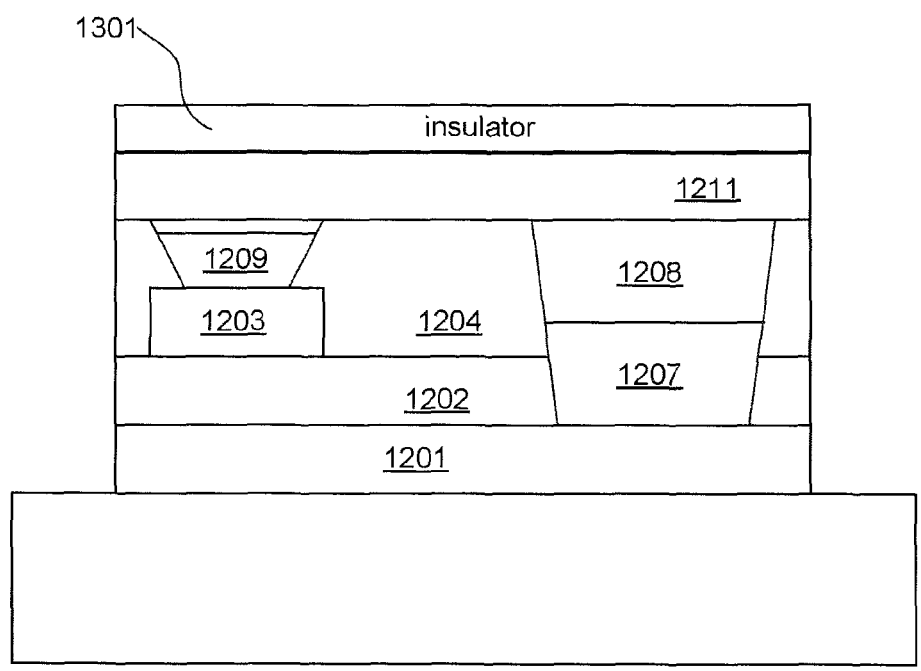
FIG. 13A illustrates a diagram depicting the step S1301 in the manufacturing method for organic light-emitting diode panel according to a preferred embodiment of the present invention.

In step S1301, a third insulator 1301 is disposed on the emitting layer 1211. As shown in FIG. 13A, FIG. 13A illustrates a diagram depicting the step S1301 in the manufacturing method for organic light-emitting diode panel according to a preferred embodiment of the present invention. Referring to FIG. 13, the insulator 1301 is a thin isolation film. Next, through the step S1211, the OLED pixel shown on FIG. 6 can be obtained.

Figure 14:
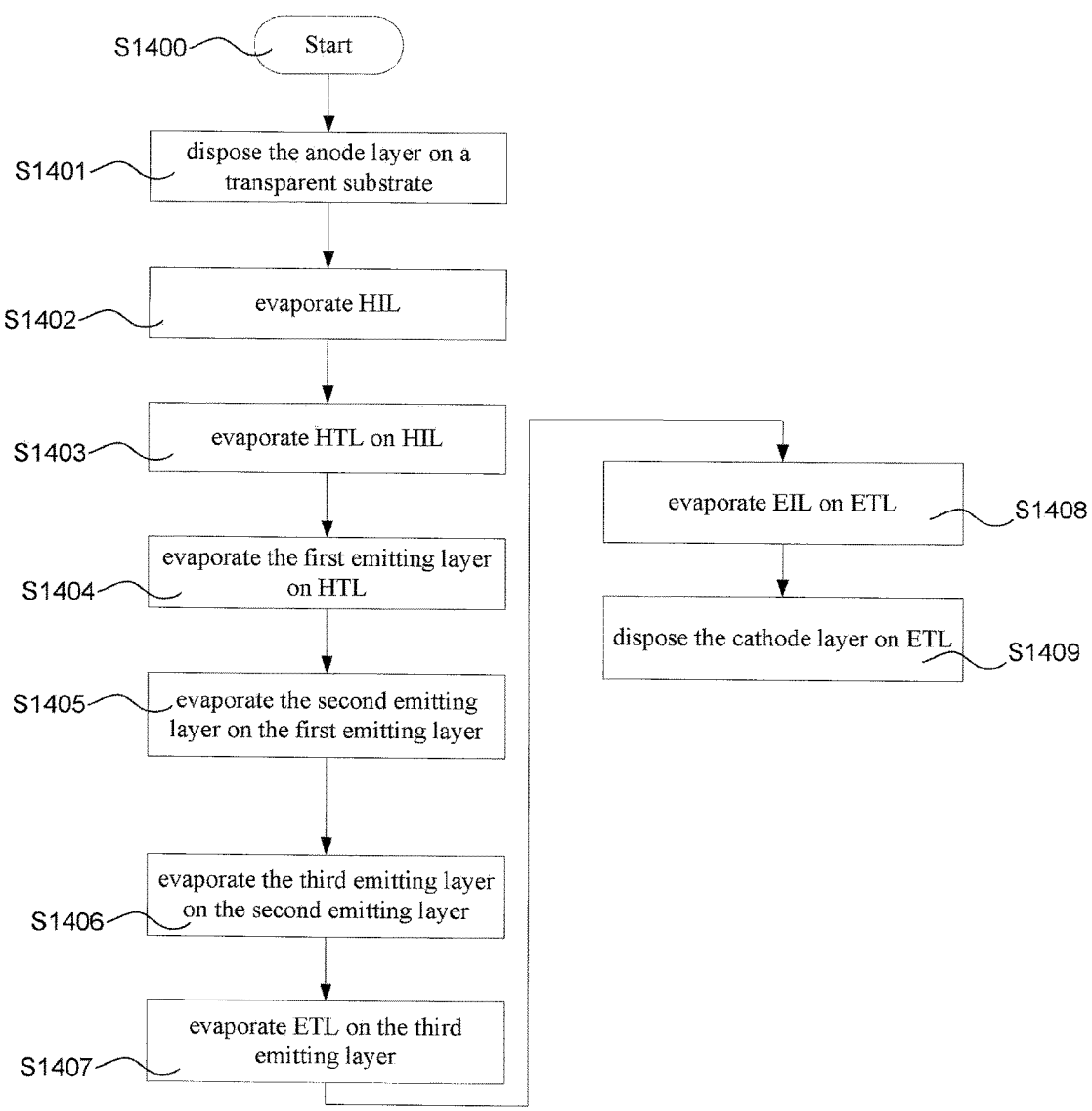
FIG. 14 illustrates a flowchart depicting the manufacturing method for organic light-emitting diode panel in FIG. 8A according to a preferred embodiment of the present invention.

FIG. 14 illustrates a flowchart depicting the manufacturing method for organic light-emitting diode panel in FIG. 8A according to a preferred embodiment of the present invention. Referring to FIG. 14, the manufacturing method for white light pixel of OLED panel includes the steps as follow.

In step S1400, the method starts.

Figure 14A:
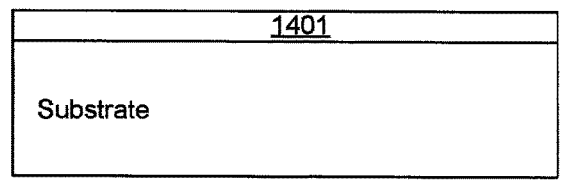
FIG. 14A illustrates a diagram depicting the step S1401 in the manufacturing method for organic light-emitting diode panel according to a preferred embodiment of the present invention.

In step S1401, the anode layer 1401 is disposed on a transparent substrate, such as a glass substrate. FIG. 14A illustrates a diagram depicting the step S1401 in the manufacturing method for organic light-emitting diode panel according to a preferred embodiment of the present invention. The anode layer 1401 may adopt a transparent conductor material or a non-transparent conductor material.

In step S1402, through the metal mask MSK141, the HIL 1402 is evaporated.

Figure 14B:
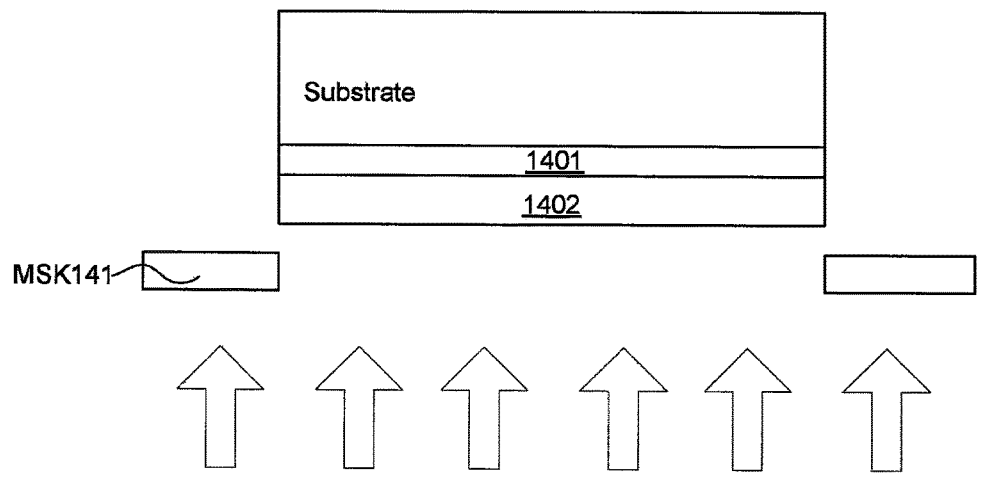
FIG. 14B illustrates a diagram depicting the step S1402 in the manufacturing method for organic light-emitting diode panel according to a preferred embodiment of the present invention.
Figure 14C:
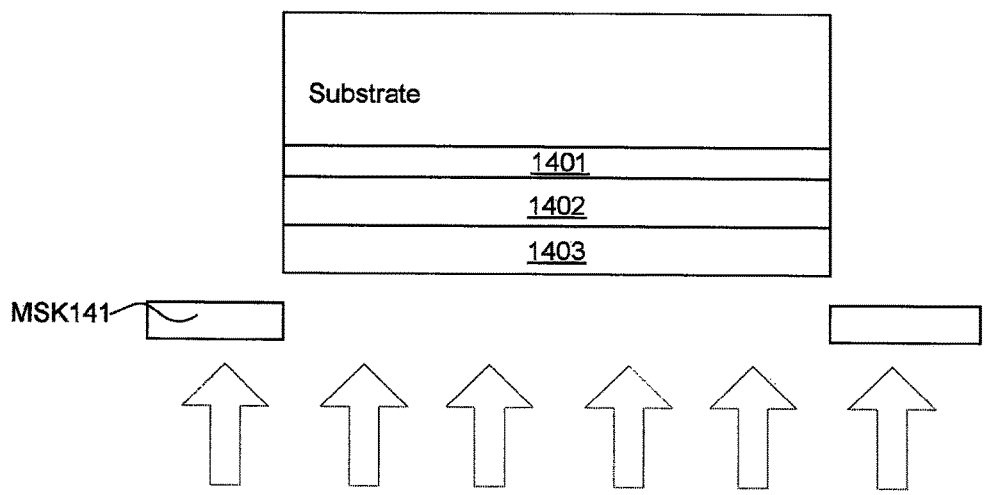
FIG. 14C illustrates a diagram depicting the step S1403 in the manufacturing method for organic light-emitting diode panel according to a preferred embodiment of the present invention.

FIG. 14B illustrates a diagram depicting the step S1402 in the manufacturing method for organic light-emitting diode panel according to a preferred embodiment of the present invention. In step S1403, the HTL 1403 is evaporated on the HIL 1402 through the metal mask MSK141. FIG. 14C illustrates a diagram depicting the step S1403 in the manufacturing method for organic light-emitting diode panel according to a preferred embodiment of the present invention.

Figure 14D:
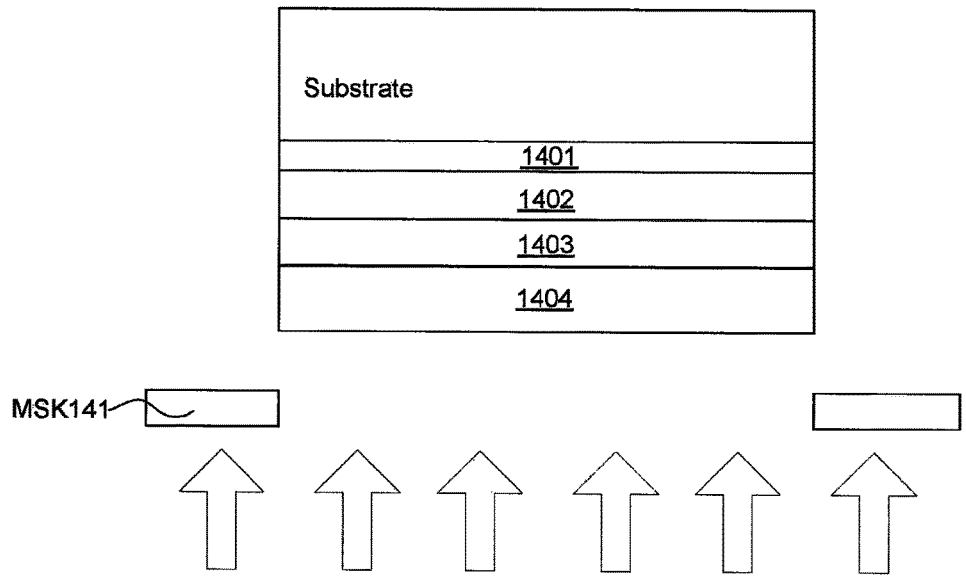
FIG. 14D illustrates a diagram depicting the step S1404 in the manufacturing method for organic light-emitting diode panel according to a preferred embodiment of the present invention.
Figure 14E:
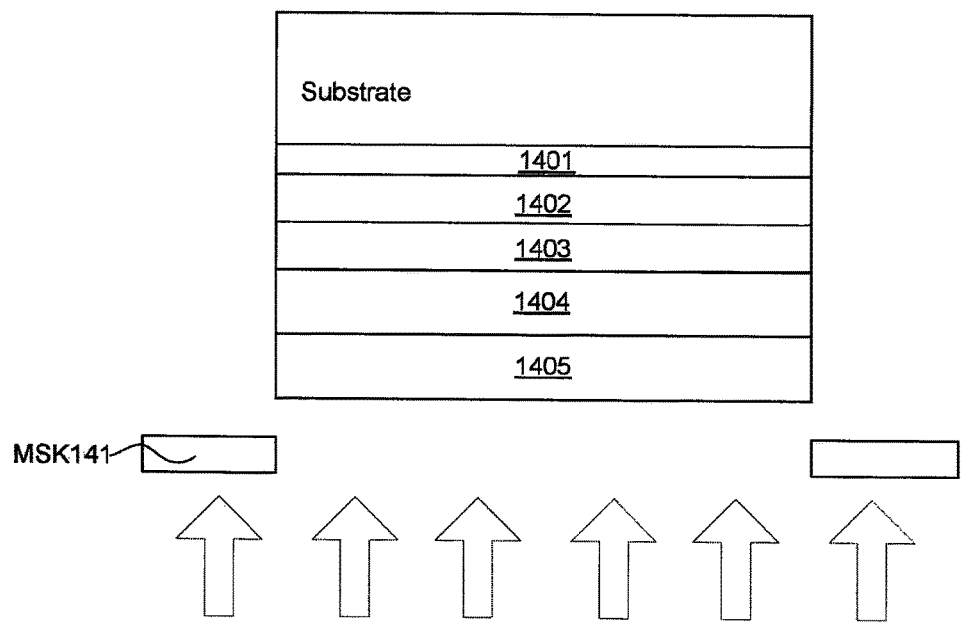
FIG. 14E illustrates a diagram depicting the step S1405 in the manufacturing method for organic light-emitting diode panel according to a preferred embodiment of the present invention.

In step S1404, the first emitting layer 1404 is evaporated on the HTL 1403 through the metal mask MSK141. FIG. 14D illustrates a diagram depicting the step S1404 in the manufacturing method for organic light-emitting diode panel according to a preferred embodiment of the present invention. In step S1405, the second emitting layer 1405 is evaporated on the first emitting layer 1404 through the metal mask MSK141. FIG. 14E illustrates a diagram depicting the step S1405 in the manufacturing method for organic light-emitting diode panel according to a preferred embodiment of the present invention.

Figure 14F:
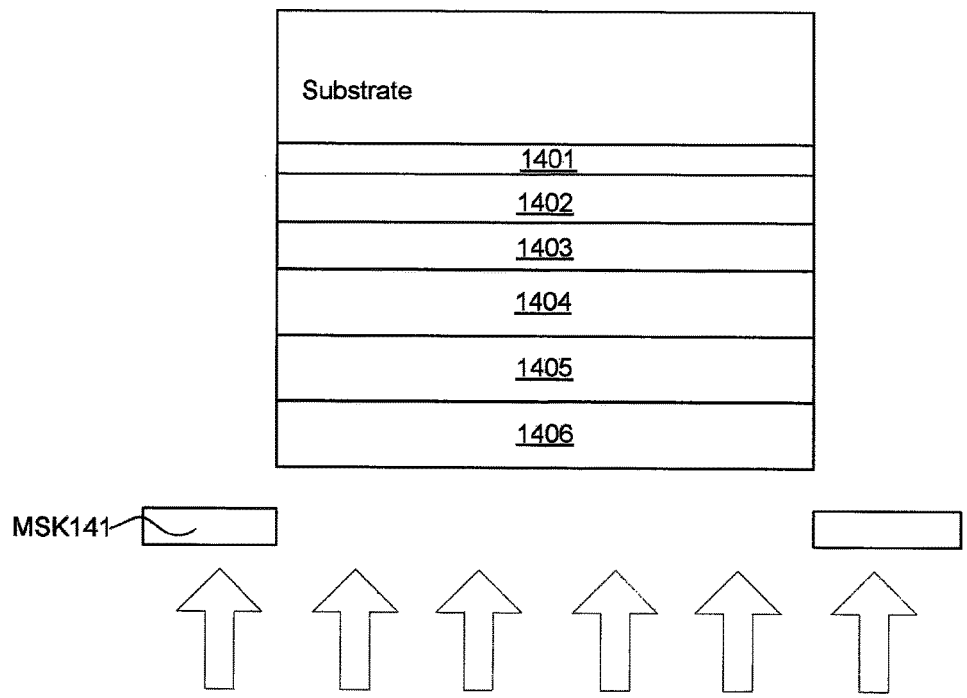
FIG. 14F illustrates a diagram depicting the step S1406 in the manufacturing method for organic light-emitting diode panel according to a preferred embodiment of the present invention.
Figure 14G:
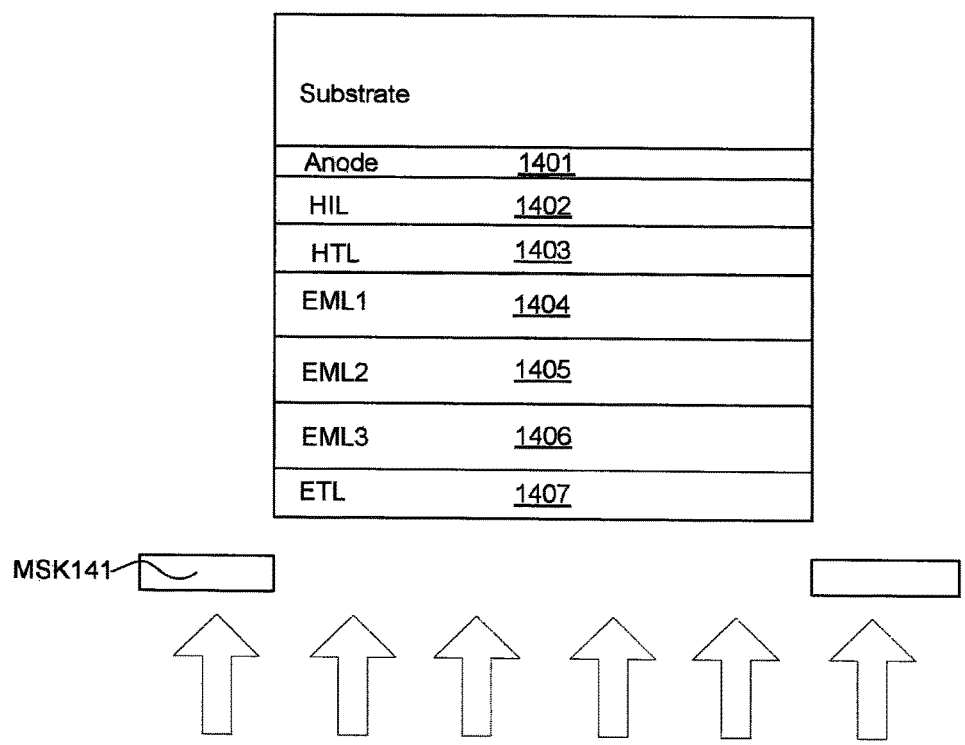
FIG. 14G illustrates a diagram depicting the step S1407 in the manufacturing method for organic light-emitting diode panel according to a preferred embodiment of the present invention.

In step S1406, the third emitting layer 1406 is evaporated on the second emitting layer 1405 through the metal mask MSK141. FIG. 14F illustrates a diagram depicting the step S1406 in the manufacturing method for organic light-emitting diode panel according to a preferred embodiment of the present invention. In step S1407, the ETL 1407 is evaporated on the third emitting layer 1406 through the metal mask MSK141. FIG. 14G illustrates a diagram depicting the step S1407 in the manufacturing method for organic light-emitting diode panel according to a preferred embodiment of the present invention.

Figure 14H:
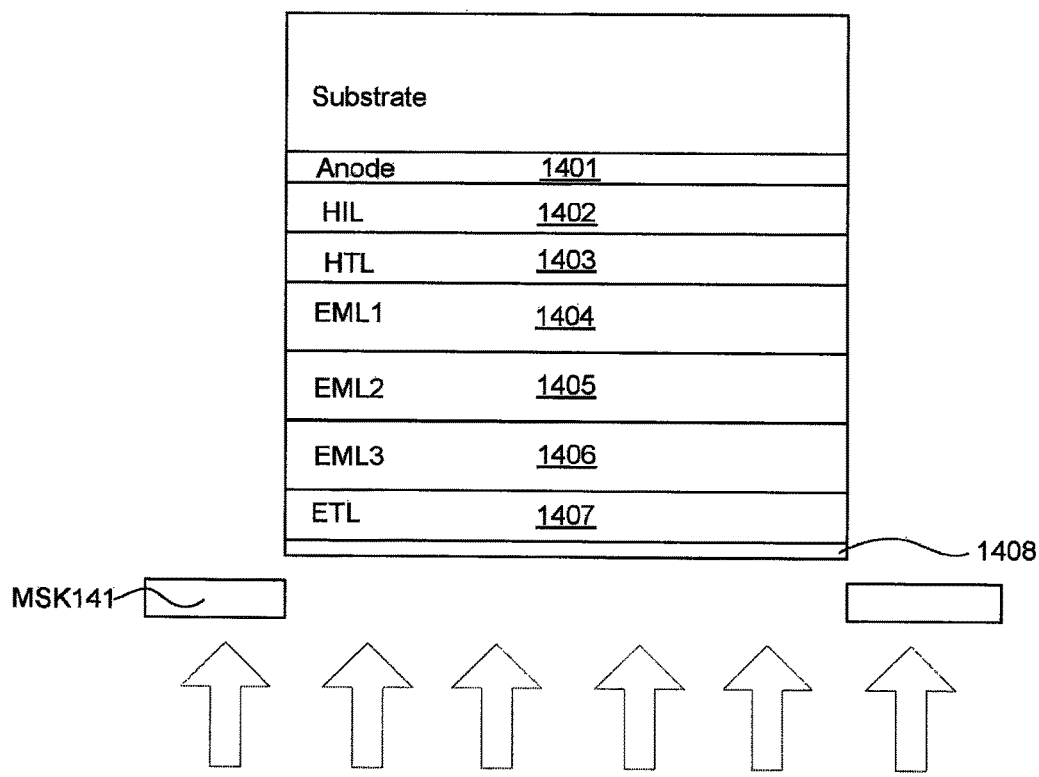
FIG. 14H illustrates a diagram depicting the step S1408 in the manufacturing method for organic light-emitting diode panel according to a preferred embodiment of the present invention.
Figure 14I:
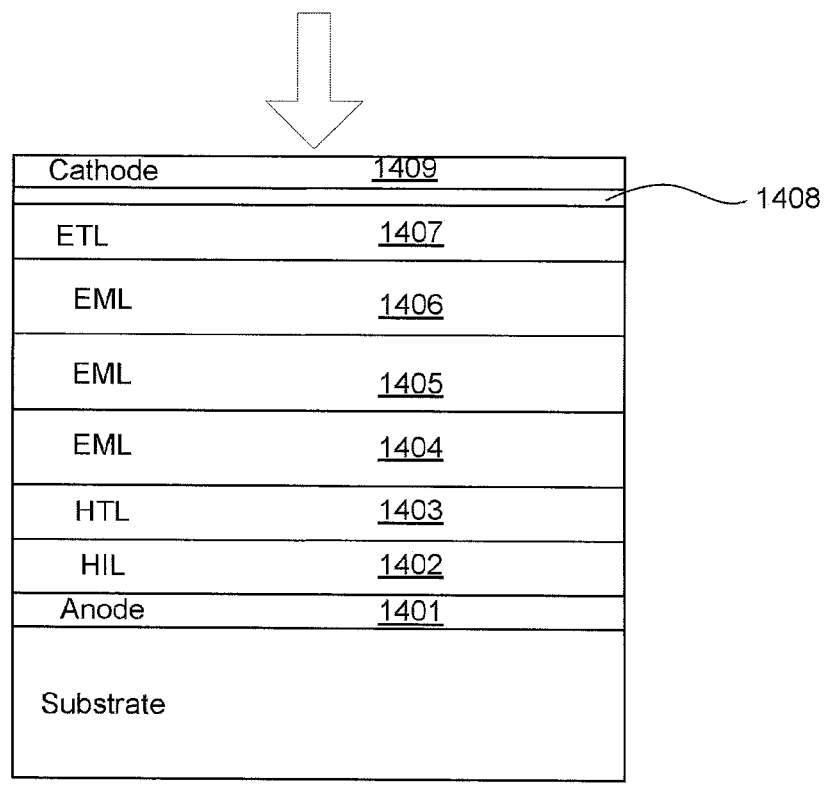
FIG. 14I illustrates a diagram depicting the step S1409 in the manufacturing method for organic light-emitting diode panel according to a preferred embodiment of the present invention.

In step S1408, the EIL 1408 is evaporated on the ETL 1407 through the metal mask MSK141. FIG. 14H illustrates a diagram depicting the step S1408 in the manufacturing method for organic light-emitting diode panel according to a preferred embodiment of the present invention. In step S1409, the cathode layer 1409 is disposed on the EIL 1408. FIG. 14I illustrates a diagram depicting the step S1409 in the manufacturing method for organic light-emitting diode panel according to a preferred embodiment of the present invention. Generally, the cathode layer 1409 may be a thin metal layer.

Figure 15:
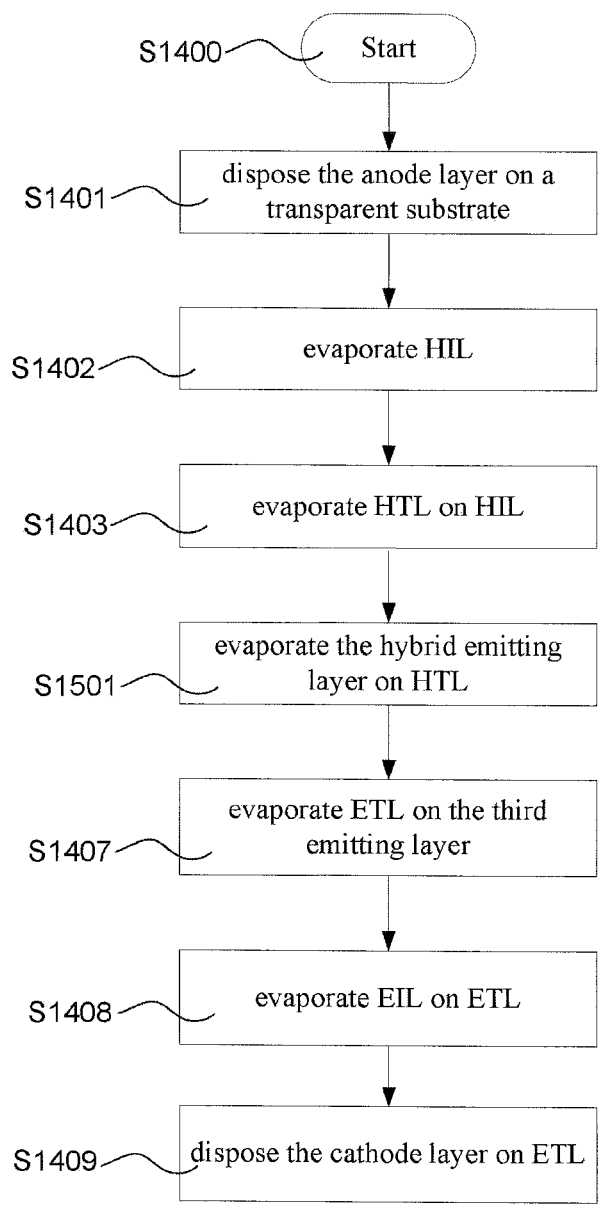
FIG. 15 illustrates a flowchart depicting the manufacturing method for organic light-emitting diode panel in FIG. 8B according to a preferred embodiment of the present invention.

FIG. 15 illustrates a flowchart depicting the manufacturing method for organic light-emitting diode panel in FIG. 8B according to a preferred embodiment of the present invention. Referring to FIG. 15, in this method, the steps S1404 to S1406 is canceled, and the method between the step S1403 and the step S1407 includes the step as follow.

Figure 15A:
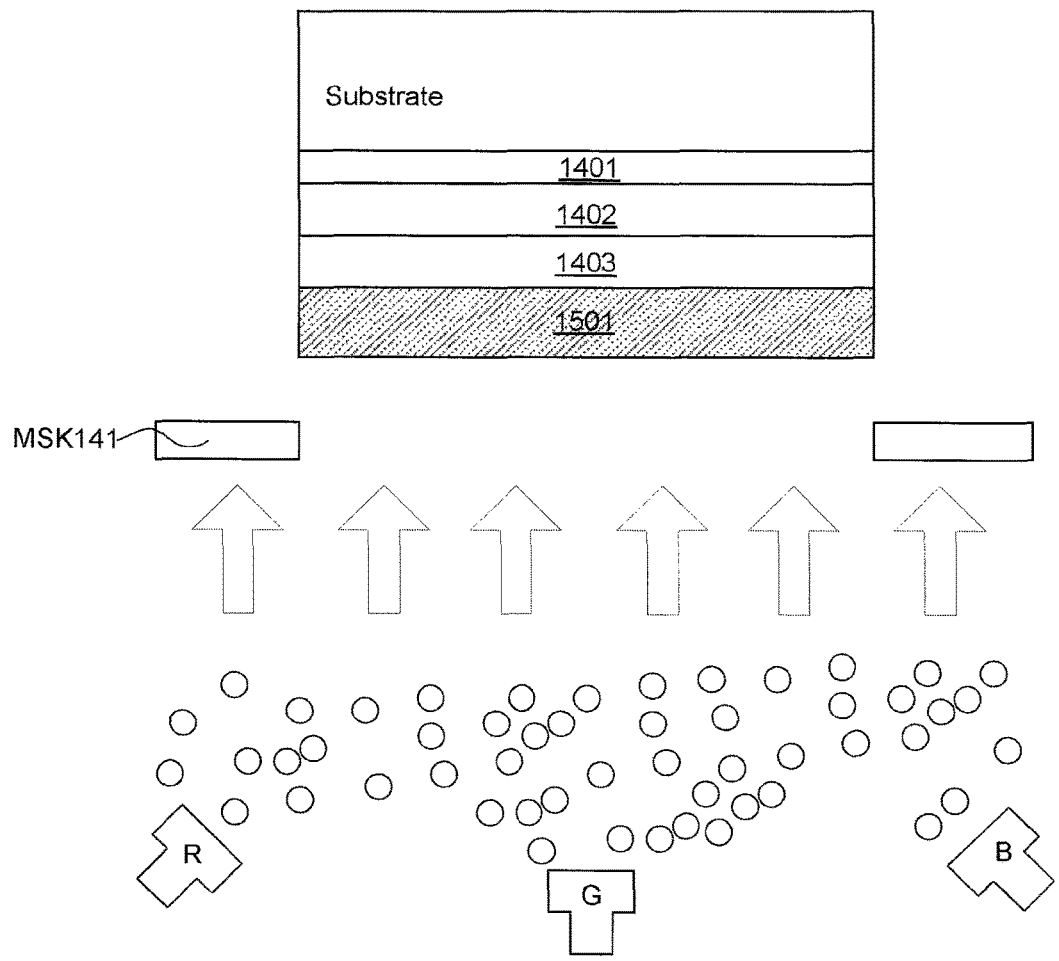
FIG. 15A illustrates a diagram depicting the step S1501 in the manufacturing method for organic light-emitting diode panel according to a preferred embodiment of the present invention.

In step S1501, the hybrid emitting layer 1501. FIG. 15A illustrates a diagram depicting the step S1501 in the manufacturing method for organic light-emitting diode panel according to a preferred embodiment of the present invention. Referring to FIG. 15A, in this embodiment, the hybrid emitting material of the hybrid emitting layer 1501 may be the material by mixing red, green and blue emitting material. Moreover, the color temperature can be also modified by the ways described above, the detailed description is thus omitted.

Figure 16:
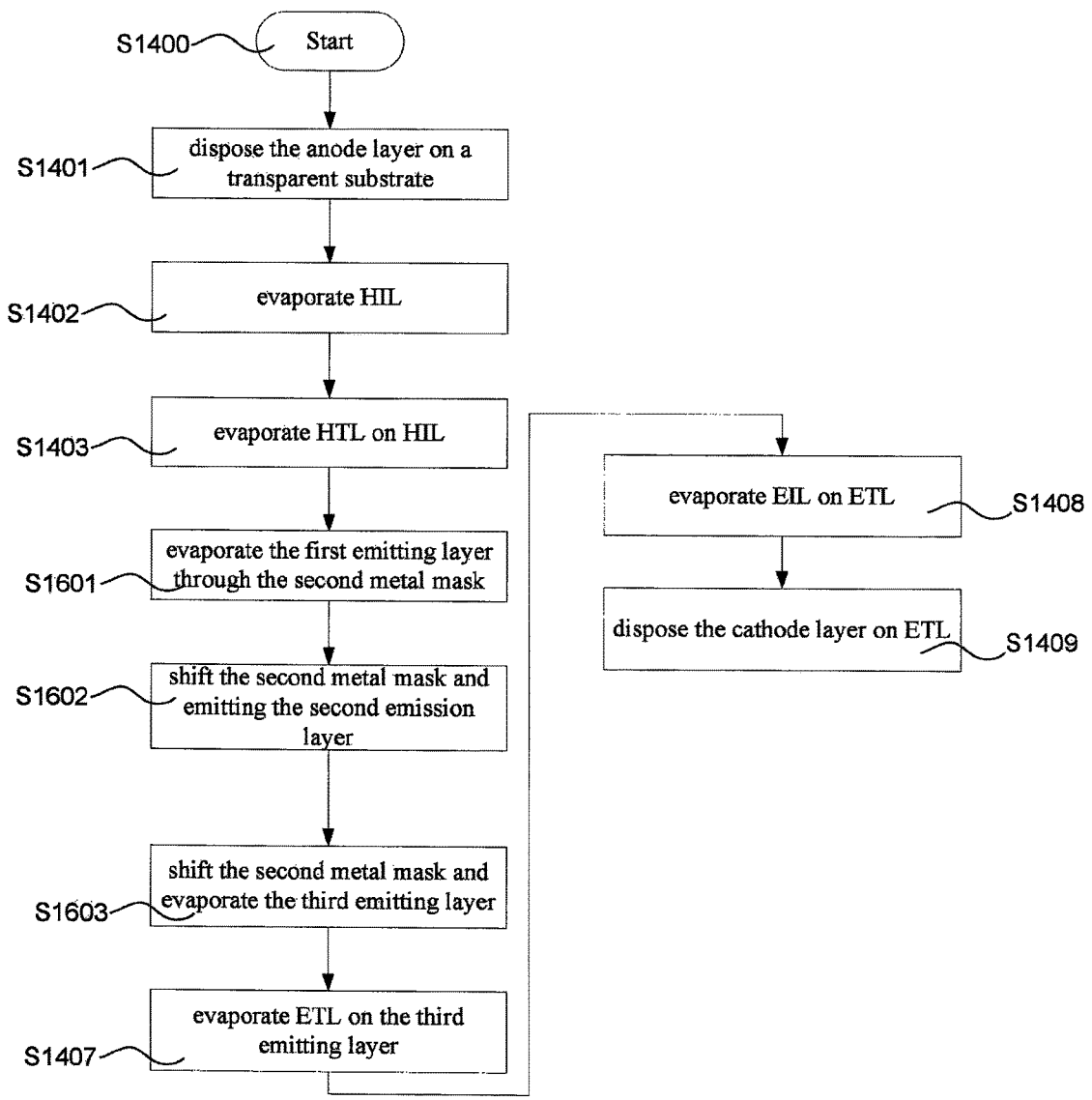
FIG. 16 illustrates a flowchart depicting the manufacturing method for organic light-emitting diode panel in FIG. 8C according to a preferred embodiment of the present invention.

FIG. 16 illustrates a flowchart depicting the manufacturing method for organic light-emitting diode panel in FIG. 8C according to a preferred embodiment of the present invention. Referring to FIG. 16, in this method, the steps S1404 to S1406 is canceled, and the method between the step S1403 and the step S1407 includes the steps as follows.

Figure 16A:
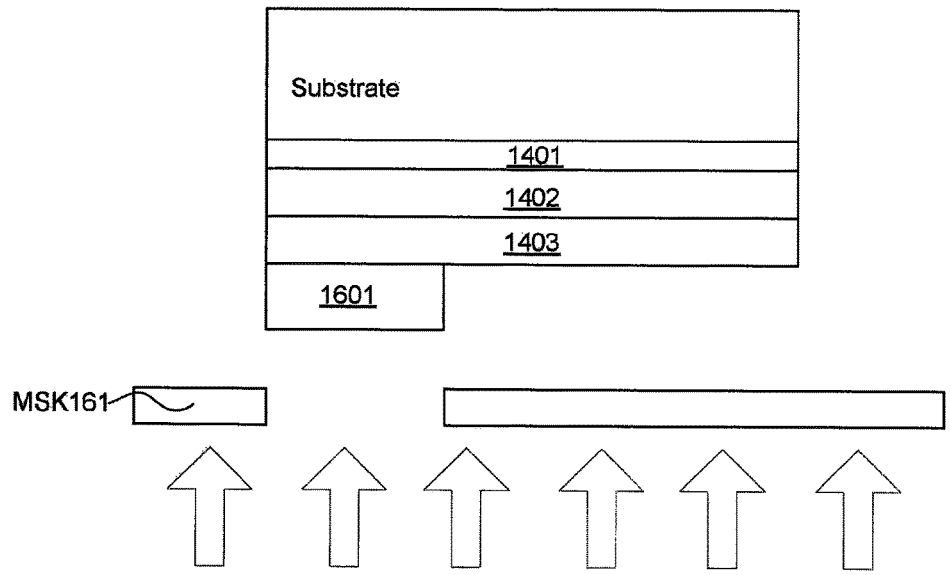
FIG. 16A illustrates a diagram depicting the step S1601 in the manufacturing method for organic light-emitting diode panel according to a preferred embodiment of the present invention.
Figure 16B:
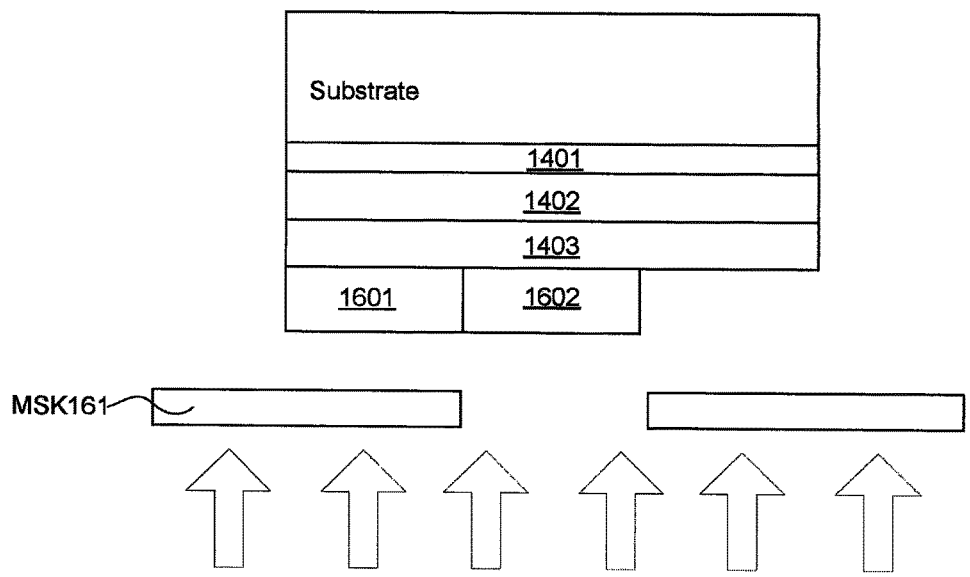
FIG. 16B illustrates a diagram depicting the step S1602 in the manufacturing method for organic light-emitting diode panel according to a preferred embodiment of the present invention.

In step S1601, the first emitting layer 1601 is evaporated through the second metal mask MSK161. FIG. 16A illustrates a diagram depicting the step S1601 in the manufacturing method for organic light-emitting diode panel according to a preferred embodiment of the present invention. In step S1602, the second metal mask MSK161 is shifted, and the second emitting layer 1602 is evaporated. FIG. 16B illustrates a diagram depicting the step S1602 in the manufacturing method for organic light-emitting diode panel according to a preferred embodiment of the present invention.

Figure 16C:
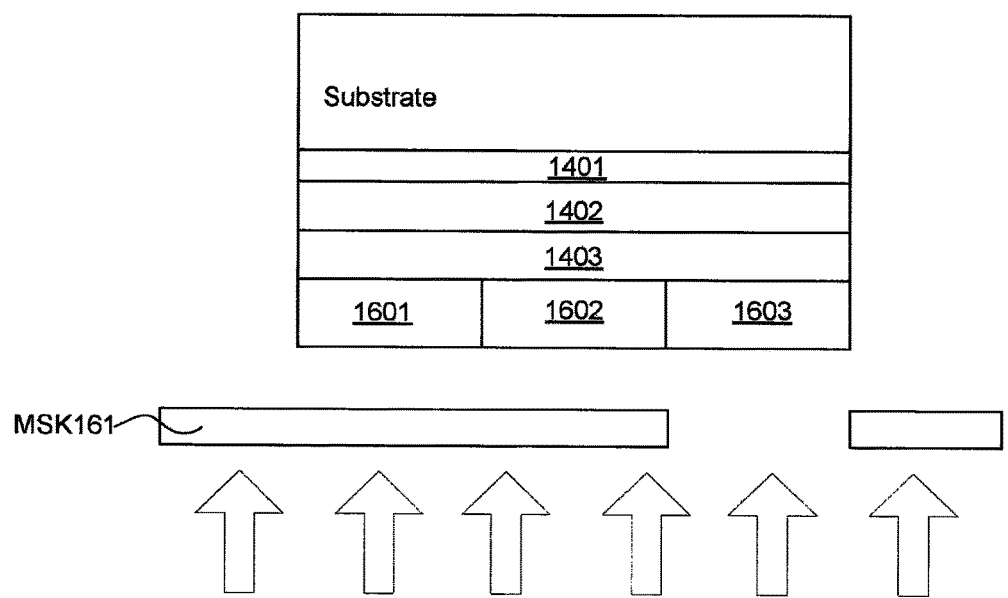
FIG. 16C illustrates a diagram depicting the step S1603 in the manufacturing method for organic light-emitting diode panel according to a preferred embodiment of the present invention.

In step S1603, the second metal mask MSK161 is further shifted, and the third emitting layer 1603 is evaporated. FIG. 16C illustrates a diagram depicting the step S1603 in the manufacturing method for organic light-emitting diode panel according to a preferred embodiment of the present invention. After the step S1603, the steps of evaporating the ETL, EIL and disposing the cathode layer are the same as above. The detailed description is herein omitted.

Figure 17:
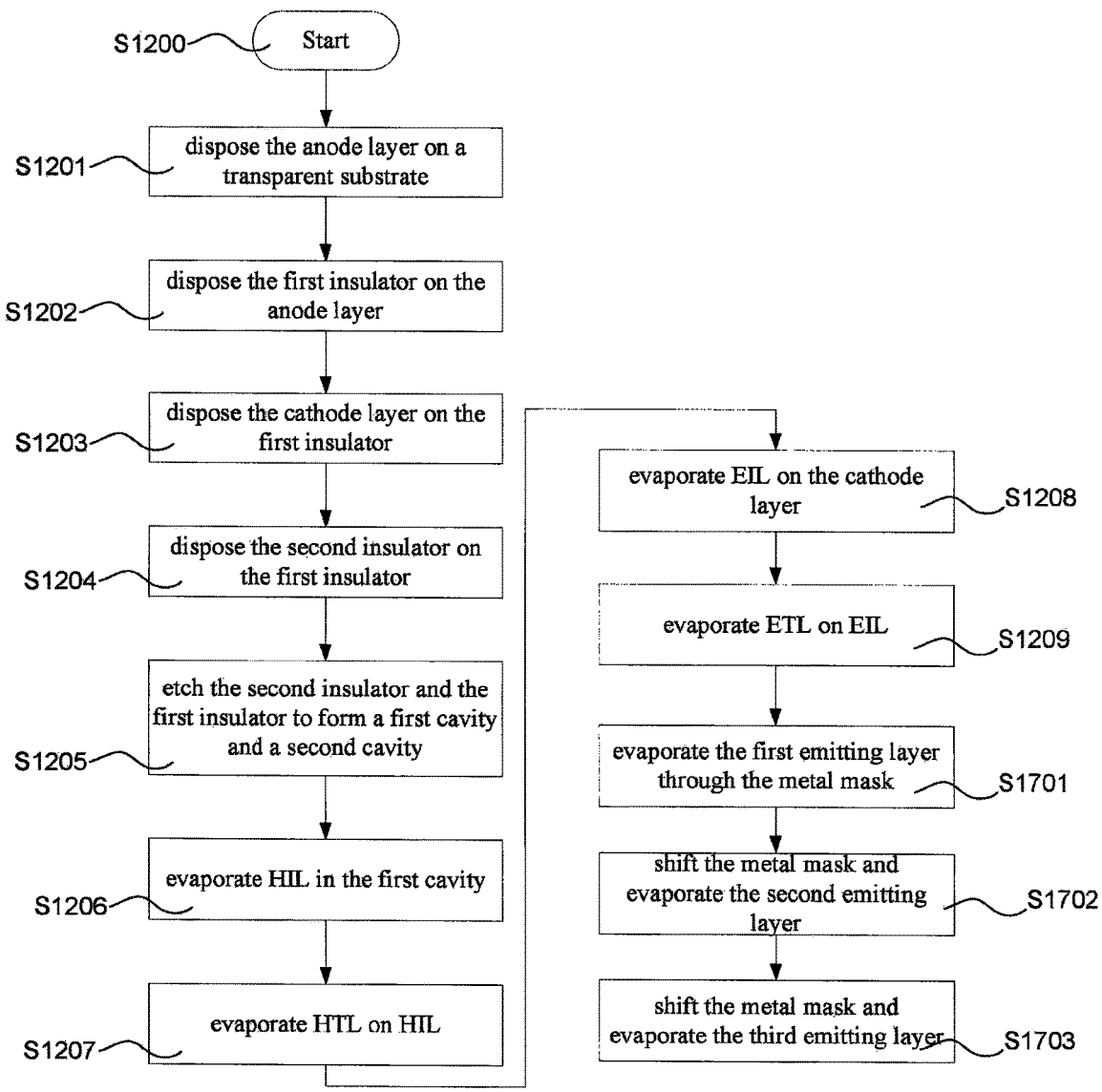
FIG. 17 illustrates a flowchart depicting the manufacturing method for organic light-emitting diode panel in FIG. 9A according to a preferred embodiment of the present invention.

FIG. 17 illustrates a flowchart depicting the manufacturing method for organic light-emitting diode panel in FIG. 9A according to a preferred embodiment of the present invention. Referring to FIG. 12 and FIG. 17, since the preceding steps of the manufacturing method for organic light-emitting diode panel in FIG. 9A are the same as the steps S1201 to S1209 in FIG. 12, the preceding steps can refer to the steps S1201 to S1209 and the corresponding FIG. 12A to FIG. 12I. Moreover, subsequent to the step S1209, the method further includes the steps as follow.

Figure 17A:
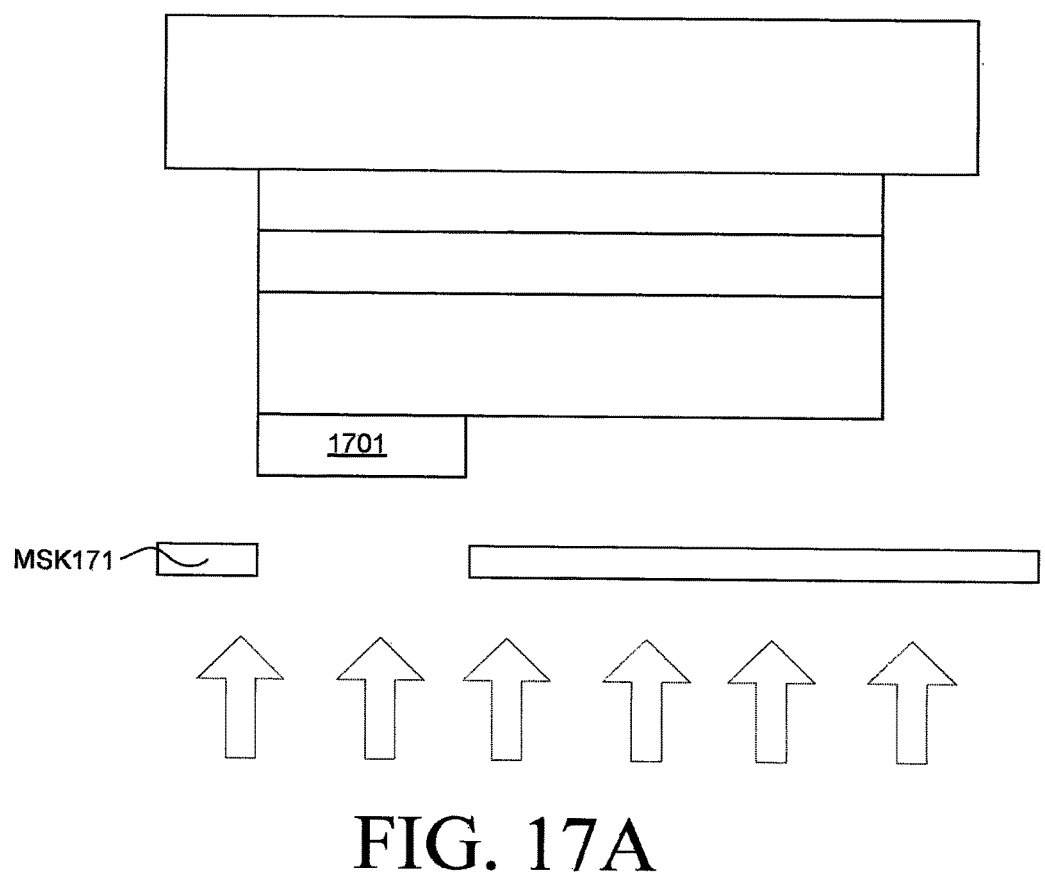
FIG. 17A illustrates a diagram depicting the step S1701 in the manufacturing method for organic light-emitting diode panel according to a preferred embodiment of the present invention.

In step S1701, the first emitting layer 1701 is evaporated through the second metal mask MSK171. As shown in FIG. 17A, FIG. 17A illustrates a diagram depicting the step S1701 in the manufacturing method for organic light-emitting diode panel according to a preferred embodiment of the present invention. Referring to FIG. 17A, the schematic diagram is that the first emitting layer 1701 is evaporated at FIG. 12I of the step S1209 after FIG. 12I of the step S1209 turning 180 degree.

Figure 17B:
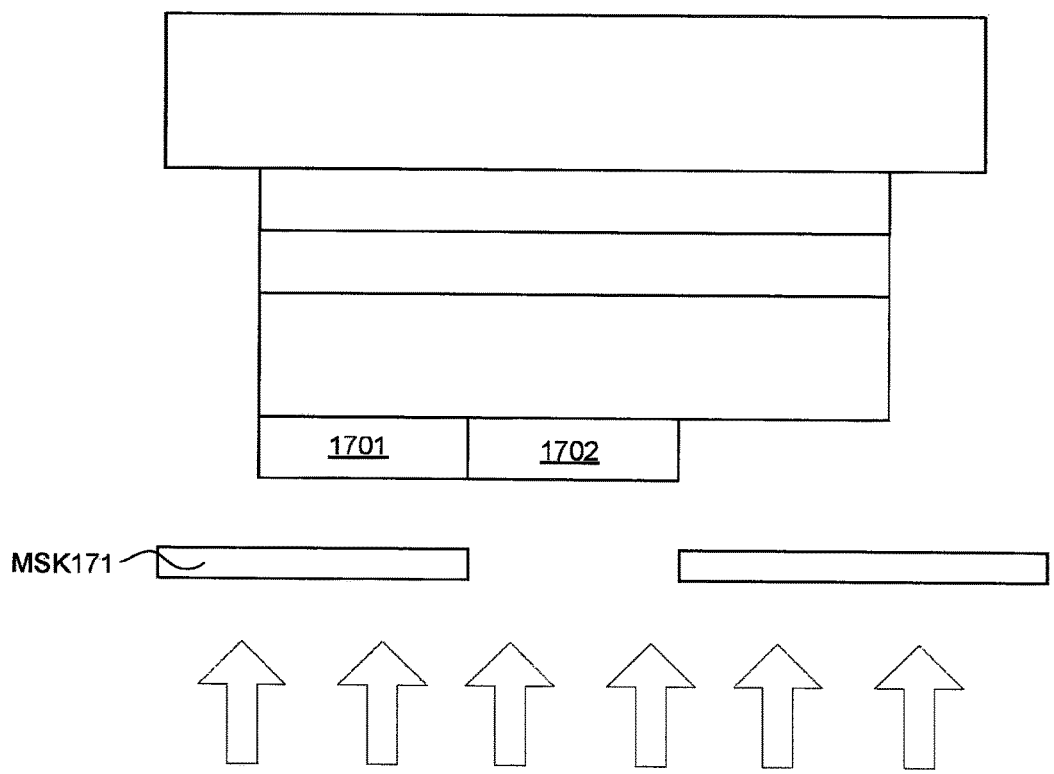
FIG. 17B illustrates a diagram depicting the step S1702 in the manufacturing method for organic light-emitting diode panel according to a preferred embodiment of the present invention.

In step S1702, the second metal mask MSK171 is shifted and the second emitting layer 1702 is evaporated. As shown in FIG. 17B, FIG. 17B illustrates a diagram depicting the step S1702 in the manufacturing method for organic light-emitting diode panel according to a preferred embodiment of the present invention.

Figure 17C:
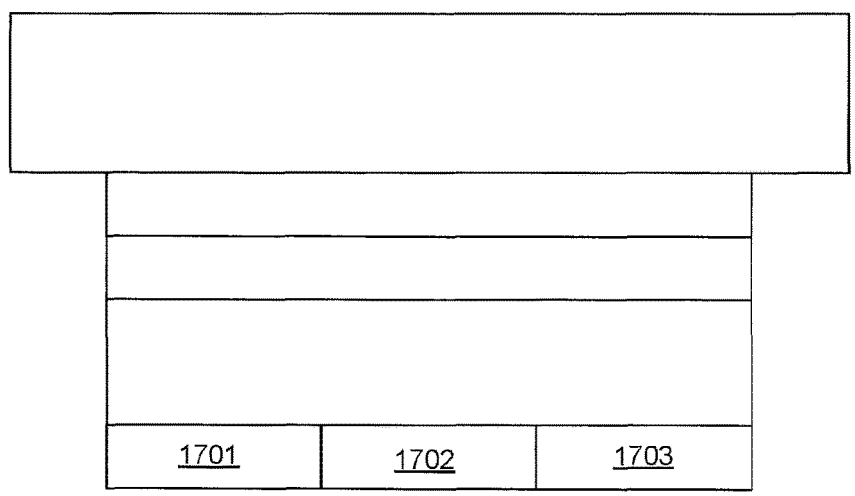
FIG. 17C illustrates a diagram depicting the step S1703 in the manufacturing method for organic light-emitting diode panel according to a preferred embodiment of the present invention.
Figure 17C:
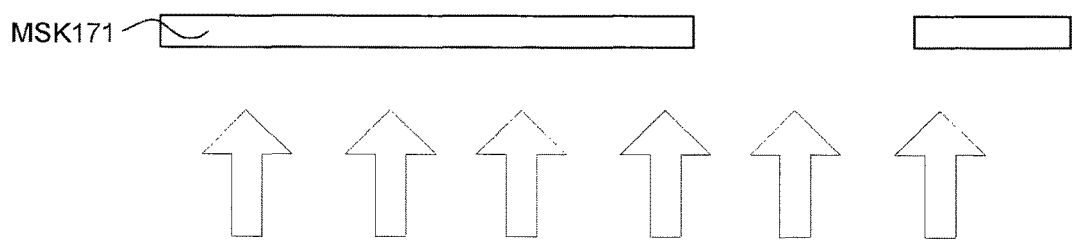

In step S1703, the second metal mask MSK171 is further shifted and the third emitting layer 1702 is evaporated. As shown in FIG. 17C, FIG. 17C illustrates a diagram depicting the step S1703 in the manufacturing method for organic light-emitting diode panel according to a preferred embodiment of the present invention. Generally, the first emitting layer 1701, the second emitting layer 1702 and the third emitting layer 1703 are respectively red, green and blue emitting materials.

Figure 18:
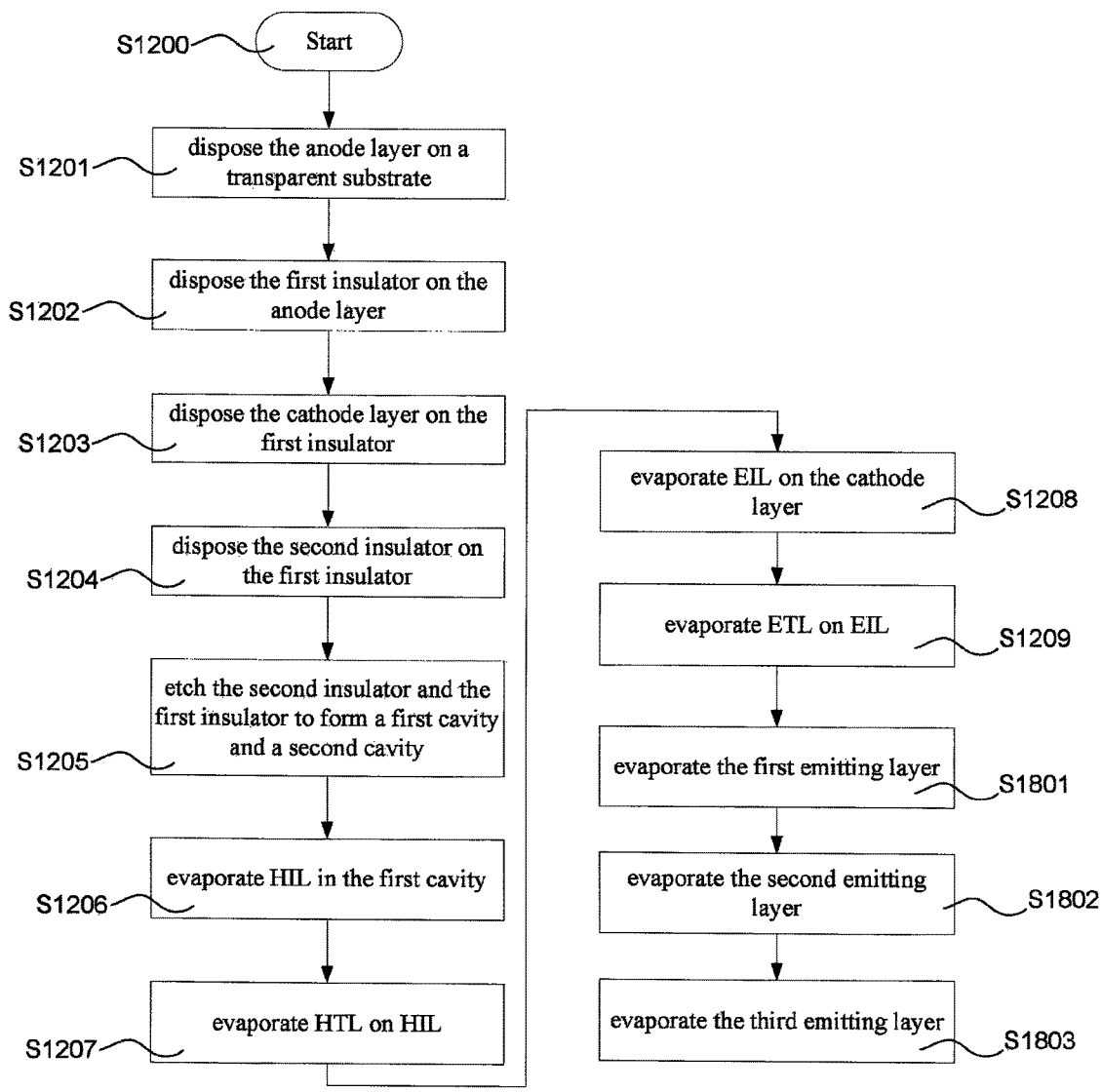
FIG. 18 illustrates a flowchart depicting the manufacturing method for organic light-emitting diode panel in FIG. 9B according to a preferred embodiment of the present invention.

FIG. 18 illustrates a flowchart depicting the manufacturing method for organic light-emitting diode panel in FIG. 9B according to a preferred embodiment of the present invention. Referring to FIG. 12 and FIG. 18, some steps of the manufacturing method for organic light-emitting diode panel in FIG. 9B are the similar to the steps S1201 to S1209 in FIG. 12, the similar steps in FIG. 12 can refer to the steps S1201 to S1209 and the corresponding FIGS. 12A-12I. Subsequent to the step S1209, the method further includes the steps as follow.

Figure 18A:
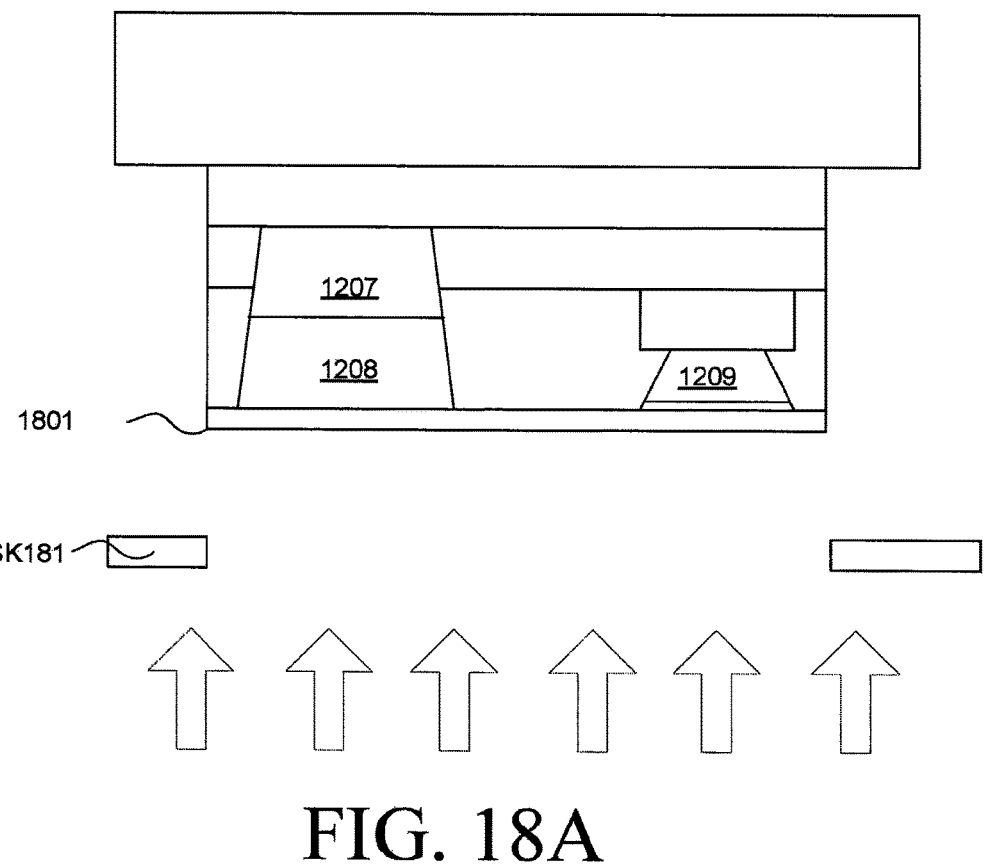
FIG. 18A illustrates a diagram depicting the step S1801 in the manufacturing method for organic light-emitting diode panel according to a preferred embodiment of the present invention.

In step S1801, the first emitting layer 1801 is evaporated. FIG. 18A illustrates a diagram depicting the step S1801 in the manufacturing method for organic light-emitting diode panel according to a preferred embodiment of the present invention. Referring to FIG. 18A, since the emitting layer 1801 is formed by the evaporating process, another metal mask MSK181 is required.

Figure 18B:
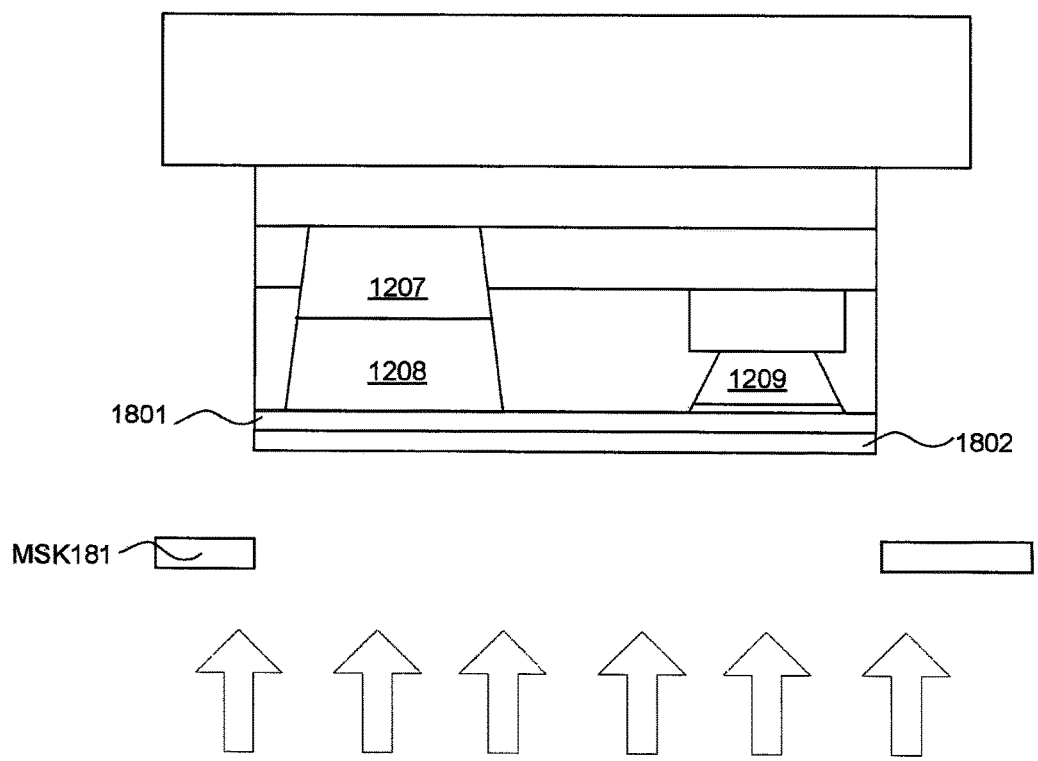
FIG. 18B illustrates a diagram depicting the step S1802 in the manufacturing method for organic light-emitting diode panel according to a preferred embodiment of the present invention.
Figure 18C:
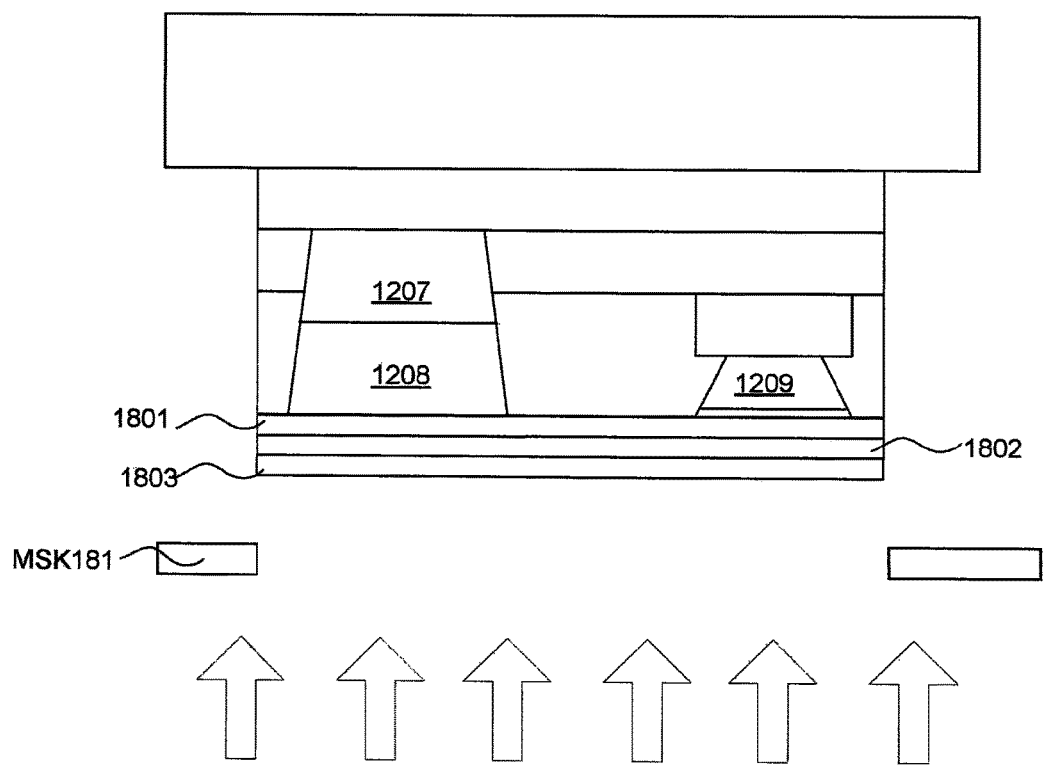
FIG. 18C illustrates a diagram depicting the step S1803 in the manufacturing method for organic light-emitting diode panel according to a preferred embodiment of the present invention.

In step S1802, the second emitting layer 1802 is evaporated. FIG. 18B illustrates a diagram depicting the step S1802 in the manufacturing method for organic light-emitting diode panel according to a preferred embodiment of the present invention. In step S1803, the third emitting layer 1803 is evaporated. FIG. 18C illustrates a diagram depicting the step S1803 in the manufacturing method for organic light-emitting diode panel according to a preferred embodiment of the present invention. Generally, the first emitting layer 1801, the second emitting layer 1802 and the third emitting layer 1803 may be respectively red, green and blue emitting materials.

Figure 19:
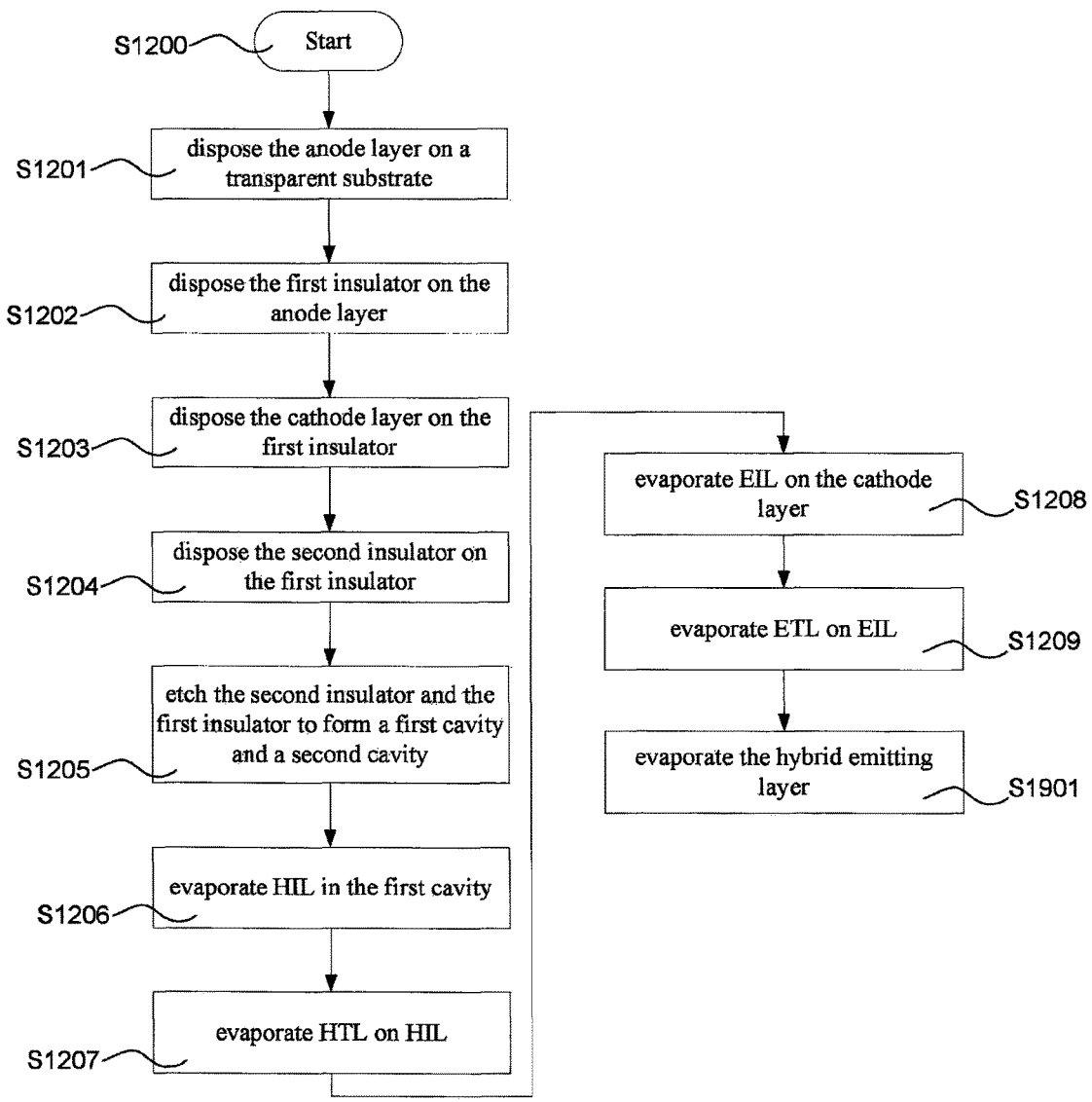
FIG. 19 illustrates a flowchart depicting the manufacturing method for organic light-emitting diode panel in FIG. 9C according to a preferred embodiment of the present invention.

FIG. 19 illustrates a flowchart depicting the manufacturing method for organic light-emitting diode panel in FIG. 9C according to a preferred embodiment of the present invention. Referring to FIG. 12 and FIG. 19, some steps of the manufacturing method for organic light-emitting diode panel in FIG. 9C are the similar to the steps S1201 to S1209 in FIG. 12, the similar steps in FIG. 12 can refer to the steps S1201 to S1209 and the corresponding FIGS. 12A-12I. Moreover, subsequent to the step S1209, the method further includes the step as follows.

Figure 19A:
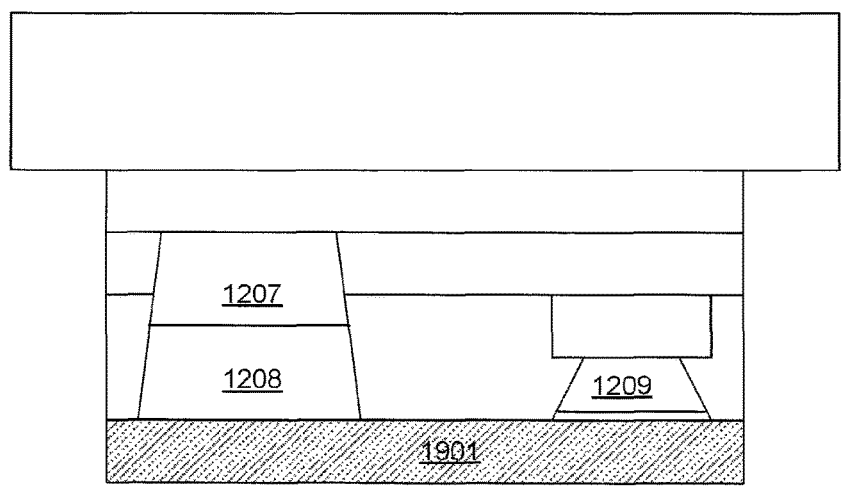
FIG. 19A illustrates a diagram depicting the step S1901 in the manufacturing method for organic light-emitting diode panel according to a preferred embodiment of the present invention.
Figure 19A:
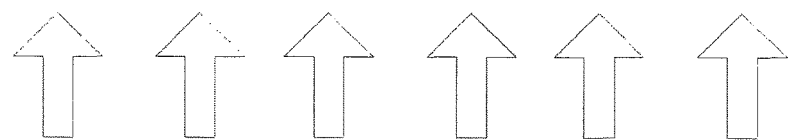

In step S1901, a hybrid emitting material 1901 is evaporated. As shown in FIG. 19A, FIG. 19A illustrates a diagram depicting the step S1901 in the manufacturing method for organic light-emitting diode panel according to a preferred embodiment of the present invention. Referring to FIG. 19A, the emitting layer 1801 is formed by the evaporating process, and another metal mask MSK181 is required. Further, the hybrid emitting material of the hybrid emitting material 1901 is generally a material mixing by red, green and blue emitting materials.

Figure 20:
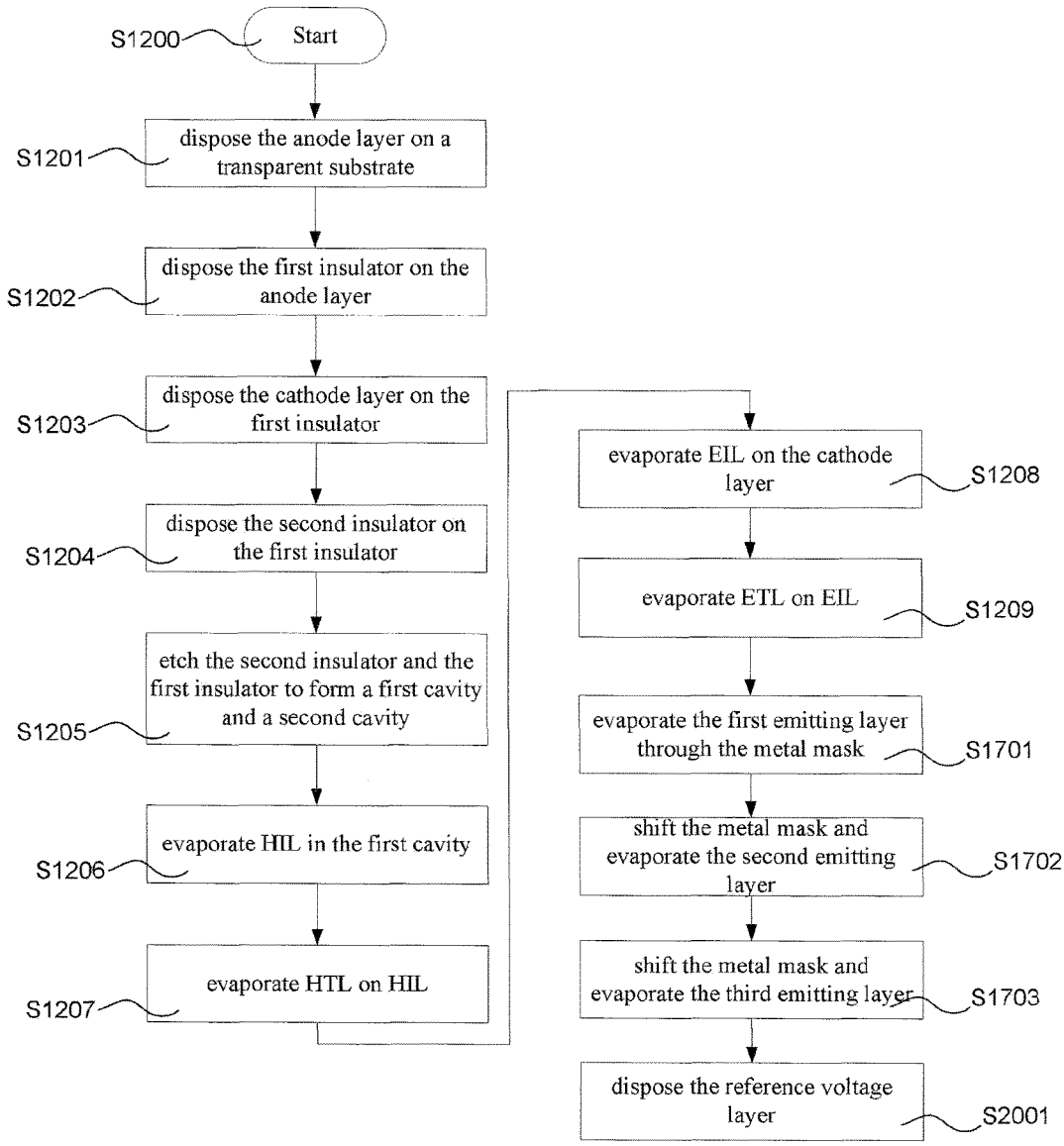
FIG. 20 illustrates a flowchart depicting the manufacturing method for organic light-emitting diode panel in FIG. 10A according to a preferred embodiment of the present invention.

FIG. 20 illustrates a flowchart depicting the manufacturing method for organic light-emitting diode panel in FIG. 10A according to a preferred embodiment of the present invention. Referring to FIGS. 12, 17 and 20, some steps of the manufacturing method for organic light-emitting diode panel in FIG. 10A are the similar to the steps S1201 to S1209 in FIG. 12 and the steps S1701 to S1703 in FIG. 17, the similar steps in FIGS. 12 and 17 can refer to the steps S1201 to S1209 and the corresponding FIGS. 12A-12I and the steps S1701 to S1703 and the corresponding FIG. 17A to FIG. 17C. Moreover, subsequent to the step S1703, the method further includes the step as follows.

Figure 20A:
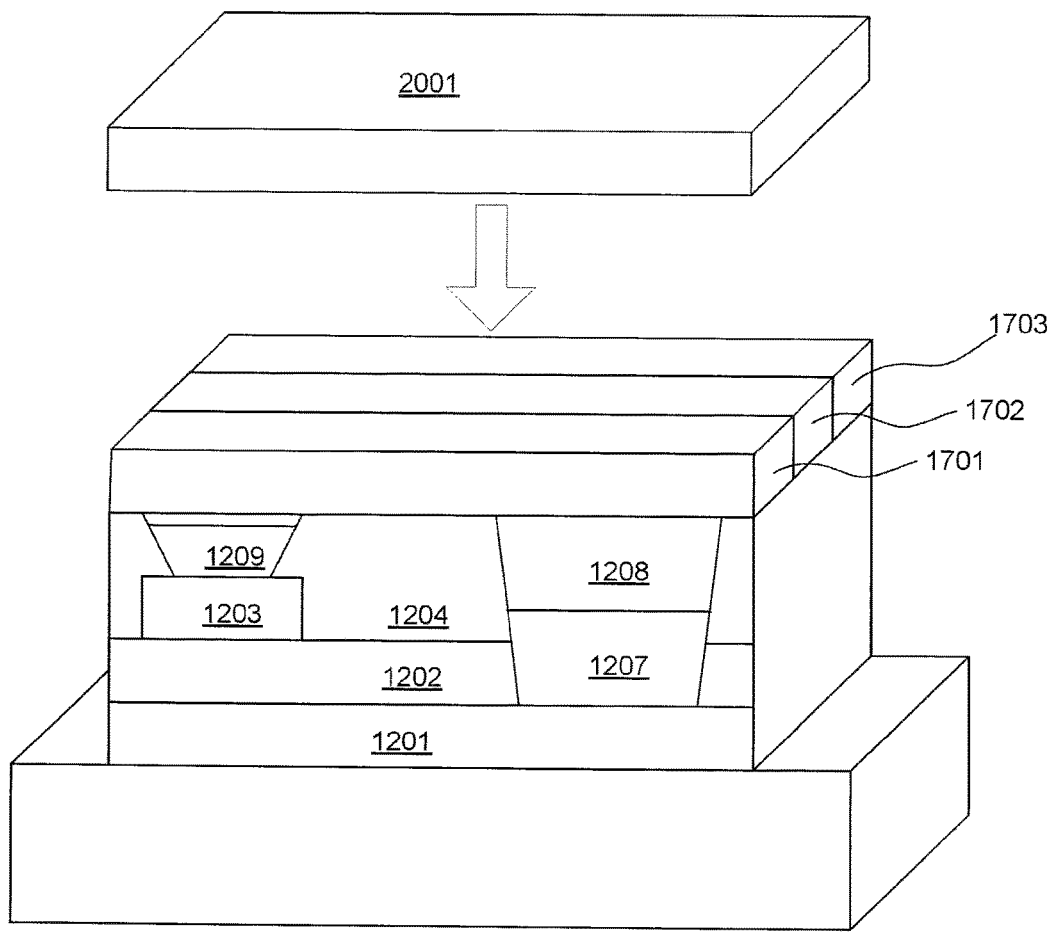
FIG. 20A illustrates a diagram depicting the step S2001 in the manufacturing method for organic light-emitting diode panel according to a preferred embodiment of the present invention.

In step S2001, a reference voltage layer 2001 is disposed. FIG. 20A illustrates a diagram depicting the step S2001 in the manufacturing method for organic light-emitting diode panel according to a preferred embodiment of the present invention. Referring to FIG. 20A, in order to eliminate the breakdown occurring at the bottom of the emitting layers 1701, 1702, 1703, in this embodiment, the reference voltage layer 2001 is additionally disposed on the upper layer of the emitting layers 1701, 1702, 1703. The reference voltage layer 2001 is used to serve as the reference voltage electrode. Since the operation is described above, the detailed description is herein omitted.

Figure 21:
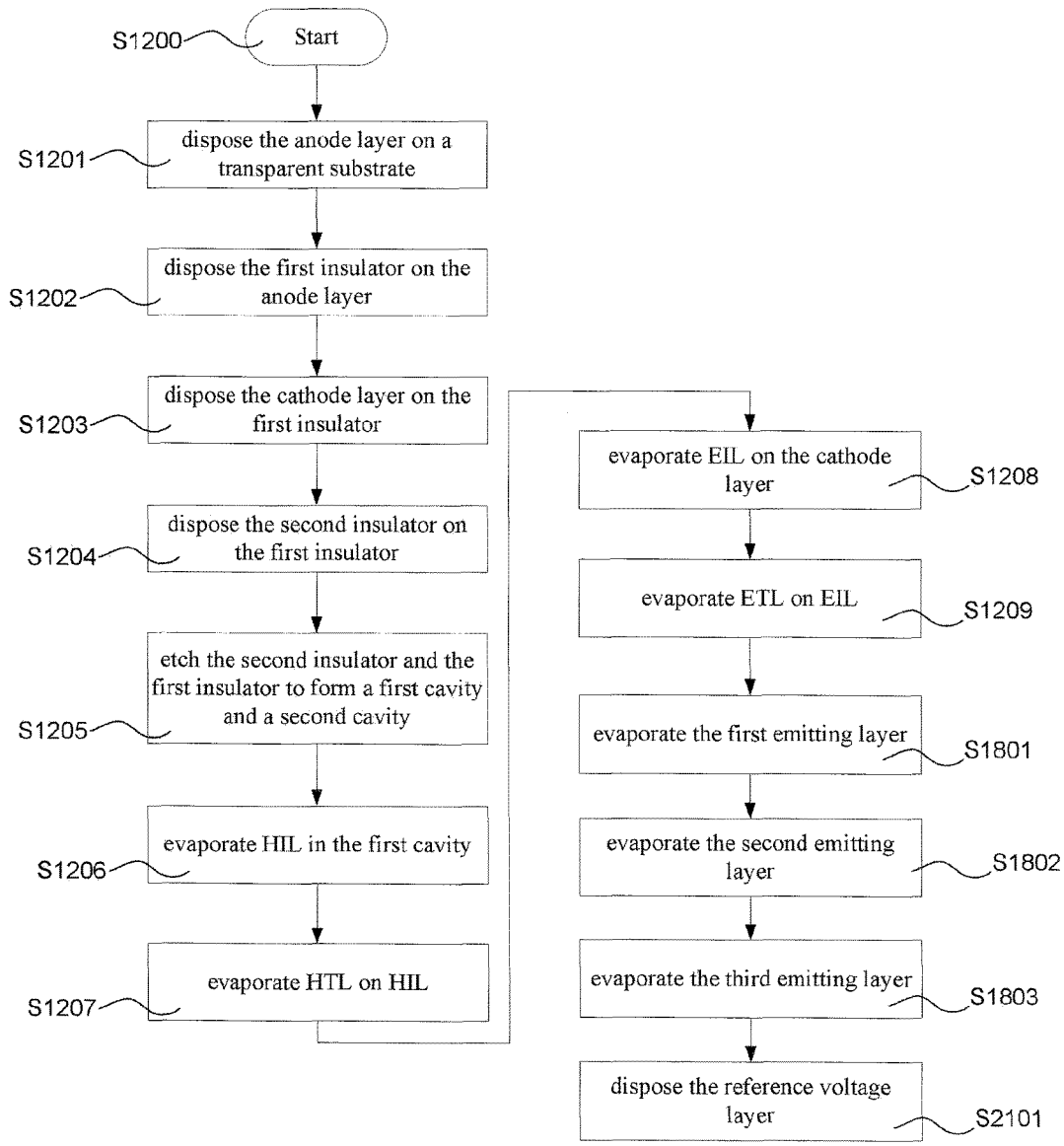
FIG. 21 illustrates a flowchart depicting the manufacturing method for organic light-emitting diode panel in FIG. 10B according to a preferred embodiment of the present invention.

FIG. 21 illustrates a flowchart depicting the manufacturing method for organic light-emitting diode panel in FIG. 10B according to a preferred embodiment of the present invention. Referring to FIG. 12, FIG. 18 and FIG. 21, some steps of the manufacturing method for organic light-emitting diode panel in FIG. 10B are the similar to the steps S1201 to S1209 in FIG. 12 and the steps S1801 to S1803 in FIG. 18, the similar steps in FIGS. 12 and 18 can refer to the steps S1201 to S1209 and the corresponding FIGS. 12A-12I and the steps S1801 to S1803 and the corresponding FIG. 18A to FIG. 18C. Moreover, subsequent to the step S1803, the method further includes the step as follows.

Figure 21A:
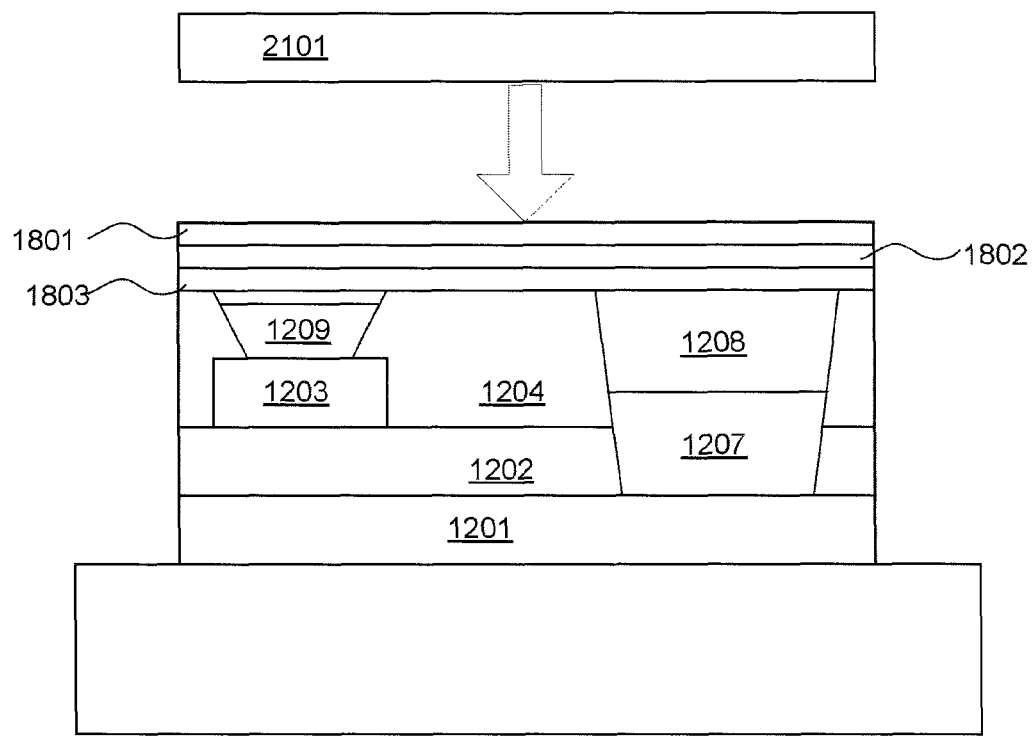
FIG. 21A illustrates a diagram depicting the step S2101 in the manufacturing method for organic light-emitting diode panel according to a preferred embodiment of the present invention.

In step S2101, the reference voltage layer 2101 is disposed. As shown in FIG. 21A, FIG. 21A illustrates a diagram depicting the step S2101 in the manufacturing method for organic light-emitting diode panel according to a preferred embodiment of the present invention. Referring to FIG. 21A, since the operation is the same as the operation in FIG. 20A, the redundant description is herein omitted.

Figure 22:
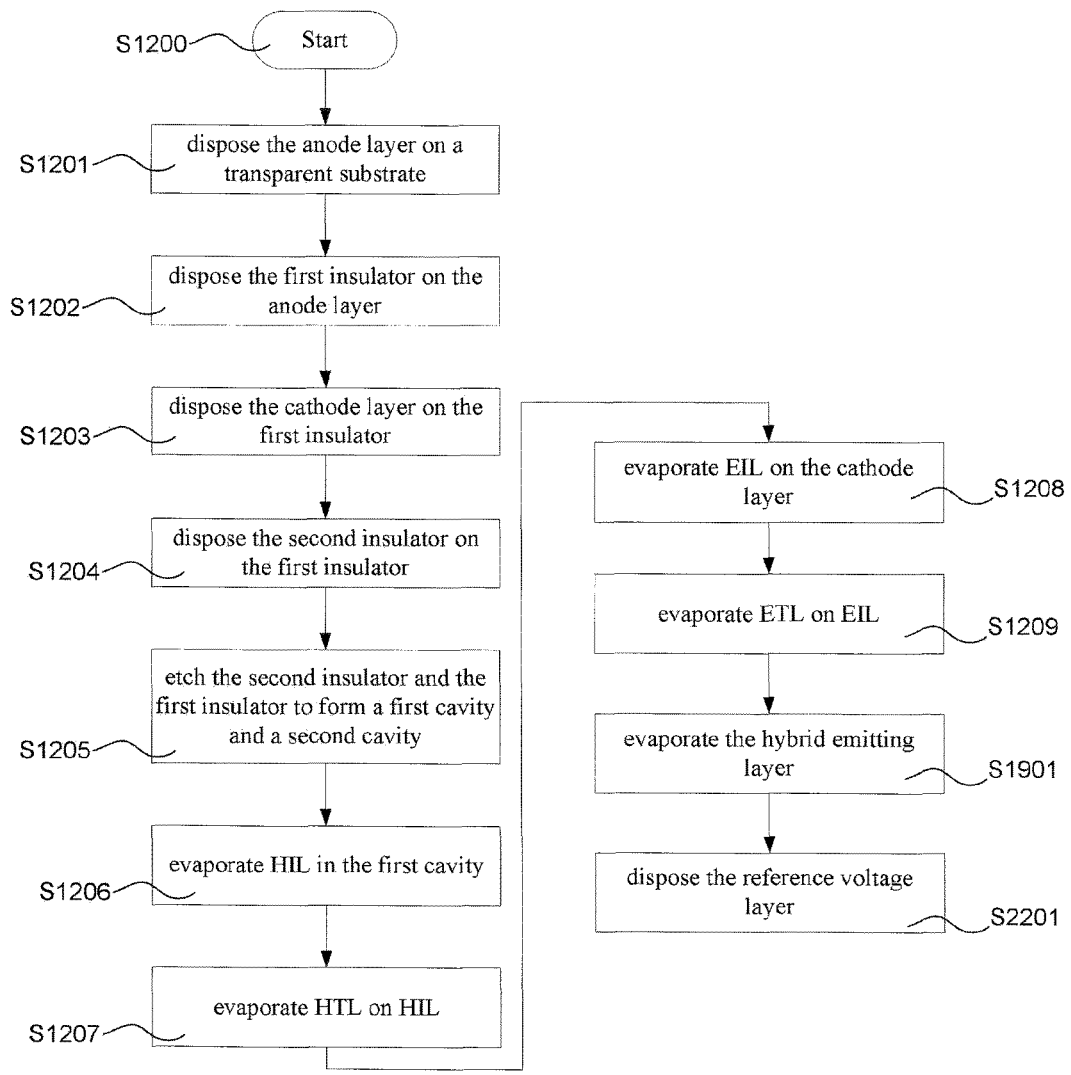
FIG. 22 illustrates a flowchart depicting the manufacturing method for organic light-emitting diode panel in FIG. 10C according to a preferred embodiment of the present invention.

FIG. 22 illustrates a flowchart depicting the manufacturing method for organic light-emitting diode panel in FIG. 10C according to a preferred embodiment of the present invention. Referring to FIG. 12, FIG. 19 and FIG. 22, some steps of the manufacturing method for organic light-emitting diode panel in FIG. 10C are the similar to the steps S1201 to S1209 in FIG. 12 and the step S1901 in FIG. 19, the similar steps in FIGS. 12 and 18 can refer to the steps S1201 to S1209 and the corresponding FIGS. 12A-12I and the step S1901 and the corresponding FIG. 19A. Moreover, subsequent to the step S1901, the method further includes the step as follows.

Figure 22A:
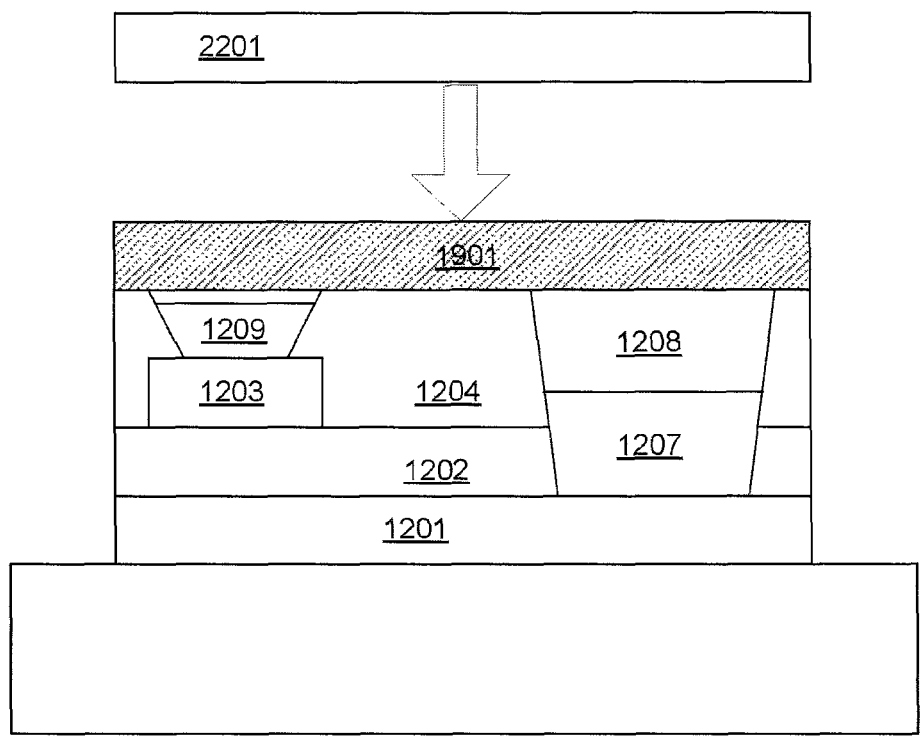
FIG. 22A illustrates a diagram depicting the step S2201 in the manufacturing method for organic light-emitting diode panel according to a preferred embodiment of the present invention.

In step S2201, the reference voltage layer 2201 is disposed. As shown in FIG. 22A, FIG. 22A illustrates a diagram depicting the step S2201 in the manufacturing method for organic light-emitting diode panel according to a preferred embodiment of the present invention. Referring to FIG. 22A, the operation in this embodiment is the same as the operation in FIG. 20A, the redundant description is herein omitted.

Figure 23:
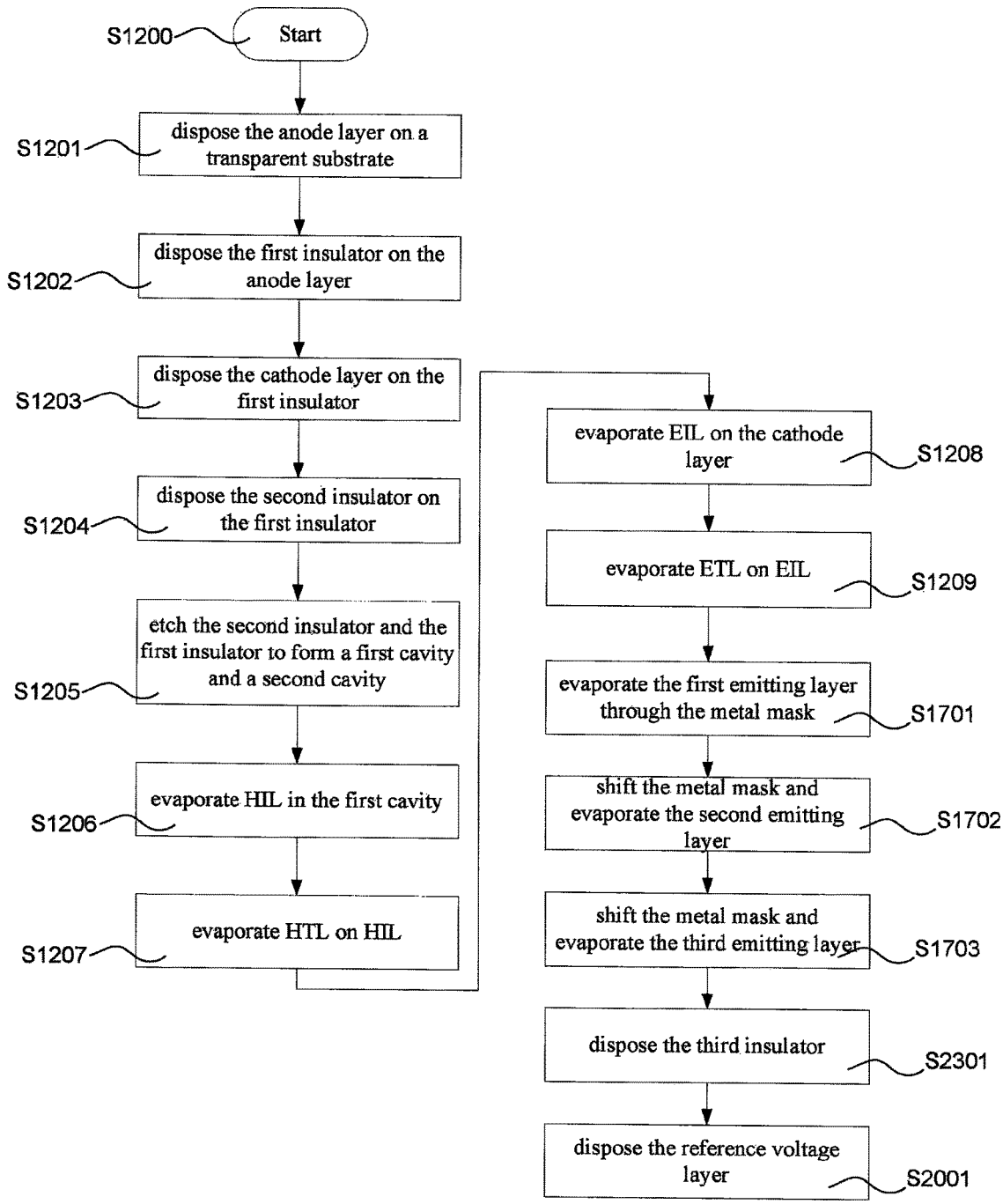
FIG. 23 illustrates a flowchart depicting the manufacturing method for organic light-emitting diode panel in FIG. 11 according to a preferred embodiment of the present invention.

FIG. 23 illustrates a flowchart depicting the manufacturing method for organic light-emitting diode panel in FIG. 11 according to a preferred embodiment of the present invention. Referring to FIG. 20 and FIG. 23, since some steps of the manufacturing method for organic light-emitting diode panel in FIG. 11 are the similar as the steps S1201 to S1209 and the steps S1701 to S1703 in FIG. 20, those steps can refer to the steps S1201 to S1209 and the corresponding FIGS. 12A-12I and the steps S1701 to S1703 and the corresponding FIGS. 17A-17C. Moreover, subsequent to the step S1703, the method further includes the step as follows.

Figure 23A:
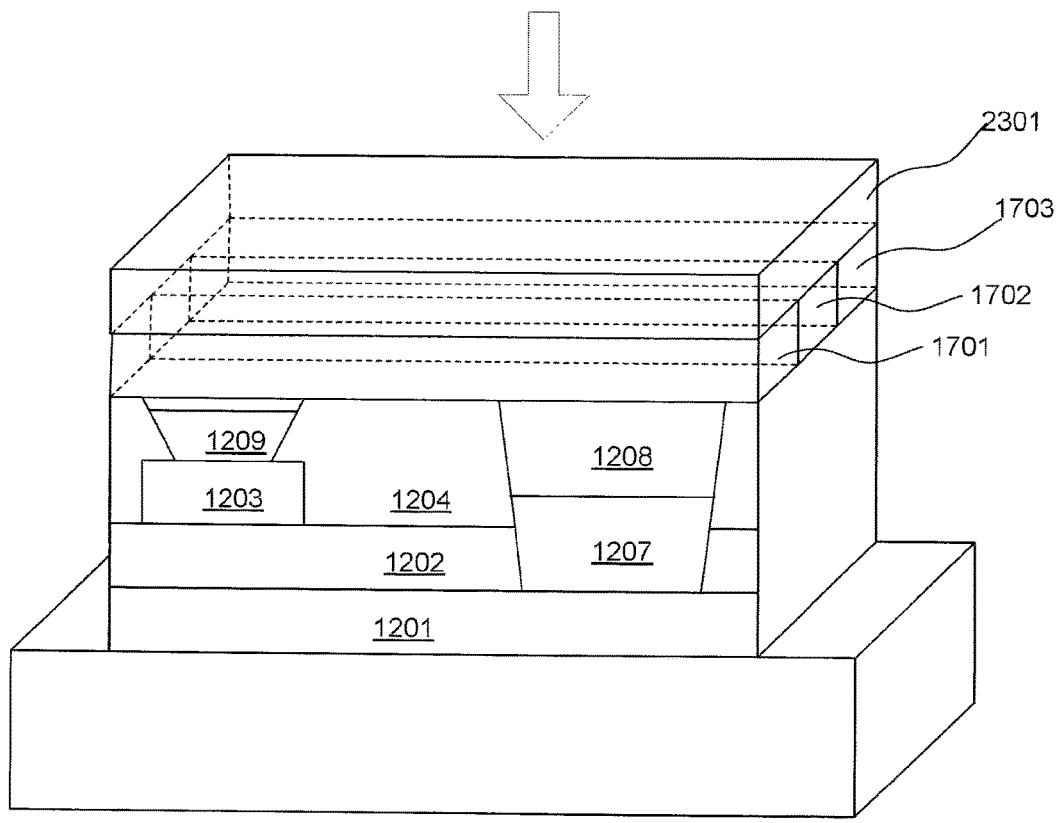
FIG. 23A illustrates a diagram depicting the step S2301 in the manufacturing method for organic light-emitting diode panel according to a preferred embodiment of the present invention.

In step S2301, the third insulator 2301 is disposed on the first emitting layer 1701 to the third emitting layer 1703. As shown in FIG. 23A, FIG. 23A illustrates a diagram depicting the step S2301 in the manufacturing method for organic light-emitting diode panel according to a preferred embodiment of the present invention. Referring to FIG. 23A, the third insulator 2301 is a thin isolation film. Next, through the step S2001 to form the reference voltage layer, the OLED pixel shown on FIG. 11 is obtained.

Similarly, the insulator can be disposed between the emitting layer and reference voltage layer in FIG. 10B and FIG. 10C, such that the white OLED pixel becomes three terminal OLED. Since the operation is described before, the duplicate description is herein omitted. It is noted that although the three emitting materials are mixed in the abovementioned embodiments, it may use two emitting materials such as yellow and cyan emitting materials to emit white light. Accordingly, the abovementioned embodiments are not intended to limit the present invention.

Figure 24:
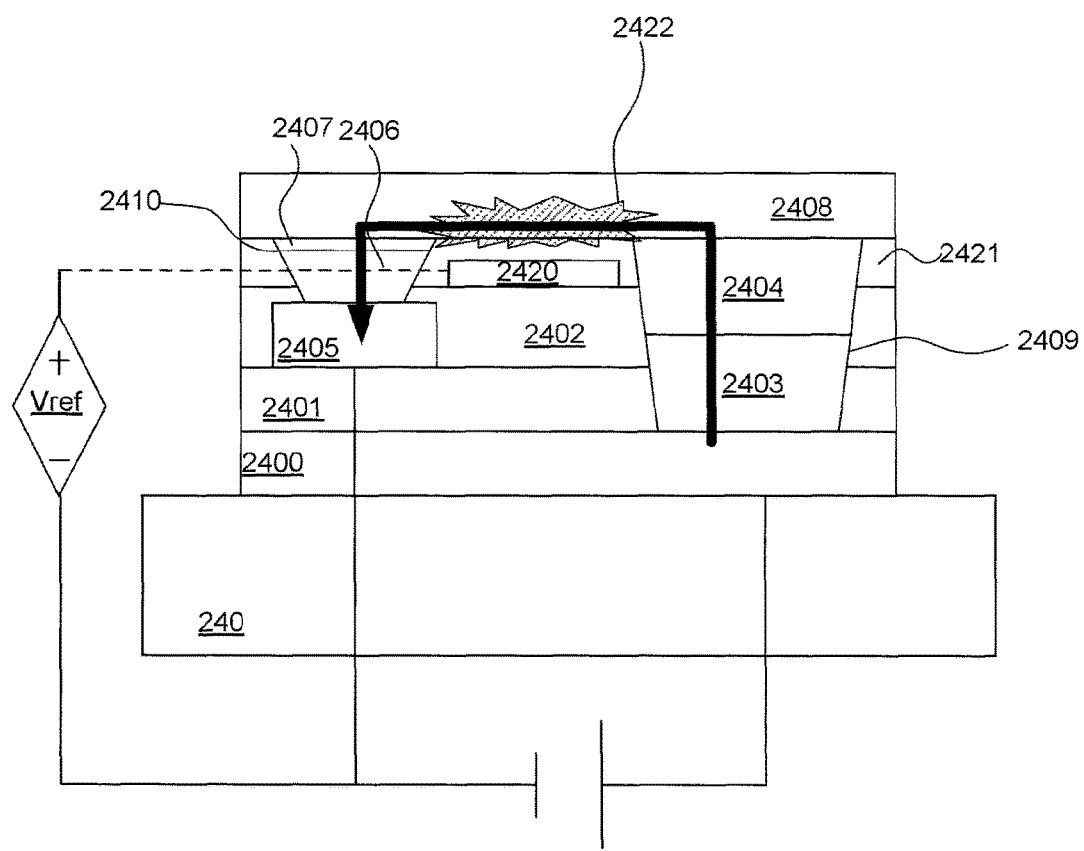
FIG. 24 illustrates a structure diagram depicting a pixel of the OLED panel according to a preferred embodiment of the present invention.

FIG. 24 illustrates a structure diagram depicting a pixel of the OLED panel according to a preferred embodiment of the present invention. Referring to FIG. 24, the anode layer and the cathode layer are disposed by non-stacked structure. The pixel includes an anode layer 2400, a first insulator 2401, a second insulator 2402, an HIL 2403, an HTL 2404, a cathode layer 2405, an EIL 2406, an ETL 2407, an emitting layer 2408, a third insulator 2421 and a reference voltage layer 2420.

According to the embodiment of the present invention, the emitting layer is horizontally disposed to achieve top emission. The reference voltage layer been disposed between the first cavity 2409 and the second cavity 2410 is served as the reference voltage electrode. To control the pixel, a reference voltage is applied to the reference voltage layer 2420 to induce the emitting layer 2408 generating more minority carrier. Thus, the holes and electrons in the emitting layer 2408 are easily combined to produce photons. Therefore, the lower driving voltage between the anode and the cathode is required to make the pixel emit light. And, the luminous efficiency of the pixel is increased at the same time.

Since the reference voltage layer 2420 is disposed below the emitting layer 2408, the luminous efficiency would not be affected. Thus, more variety of material can be adopted as the reference voltage layer 2420, for example, it can be a transparent conductor layer or a non transparent conductor layer. Furthermore, the present embodiment increases the process stability, the process yield, and reduces the cost, the damage possibility of the emitting layer 240. Thereby, the reliability of the product is improved. The present embodiment may also solve the breakdown of the in-plane OLED.

In this embodiment, since the reference voltage layer 2420 is disposed under the emitting layer 2408. When the reference voltage Vref is applied to the reference voltage layer 2420, the minority carrier injection would be increased to enhance the luminance. However, the current would pass the shortest path, and the current would trend to flow through the bottom side of the emitting layer. In the worst case, the breakdown 2422 would occur at the bottom side of the emitting layer 2408. In order to avoid the situation, several embodiments are provided in following paragraphs.

Figure 25:
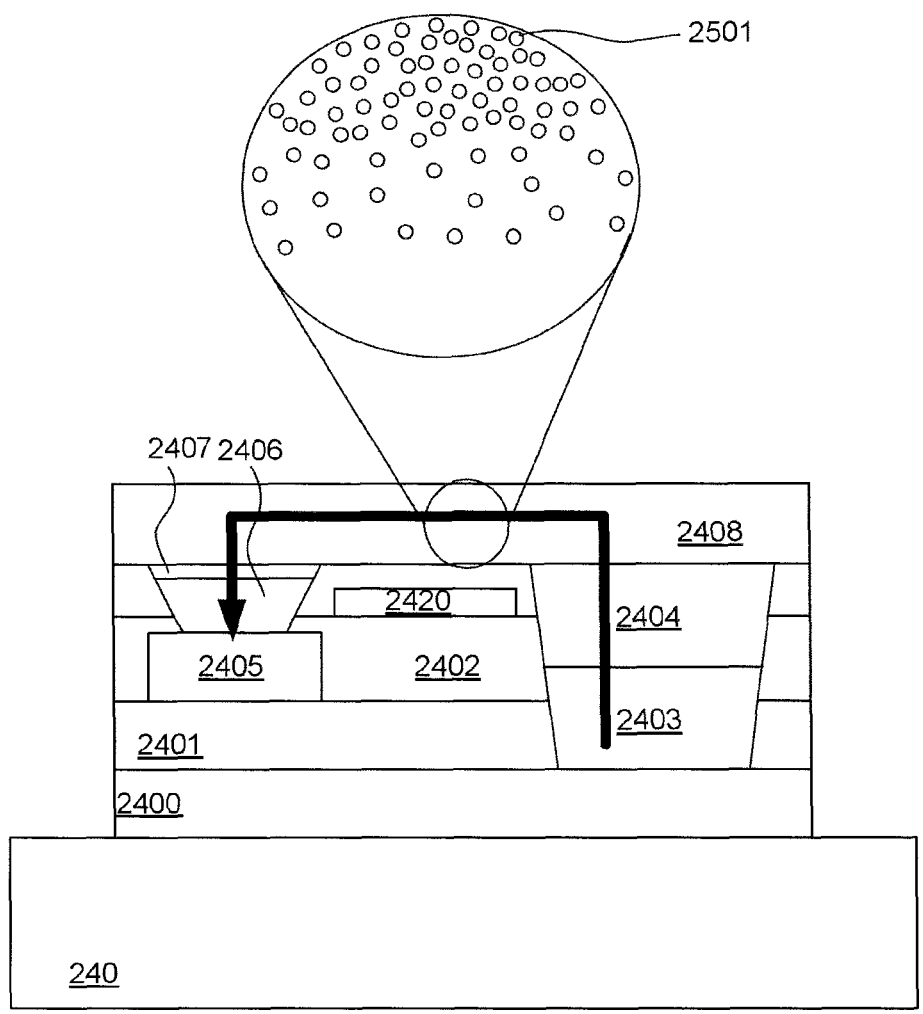
FIG. 25 illustrates a structure diagram depicting the emitting layer 2408 of the pixel of the OLED panel according to a preferred embodiment of the present invention.

FIG. 25 illustrates a structure diagram depicting the emitting layer 2408 of the pixel of the OLED panel according to a preferred embodiment of the present invention. Referring to FIG. 25, in this embodiment, the emitting layer 2408 is additionally doped a donor (n-type) dopant or an acceptor (p-type) dopant 2501. During the process of the emitting layer 2408, the organic material with donor or acceptor 2501 is evaporated. Alternatively, an organic material with donor or acceptor is further re-evaporated on the emitting layer 2408. By controlling the distribution of the dopant concentration in the emitting layer during the doping process, the resistance value distribution of the emitting layer can be controlled. And, the subsequent current flow is controlled.

Figure 26:
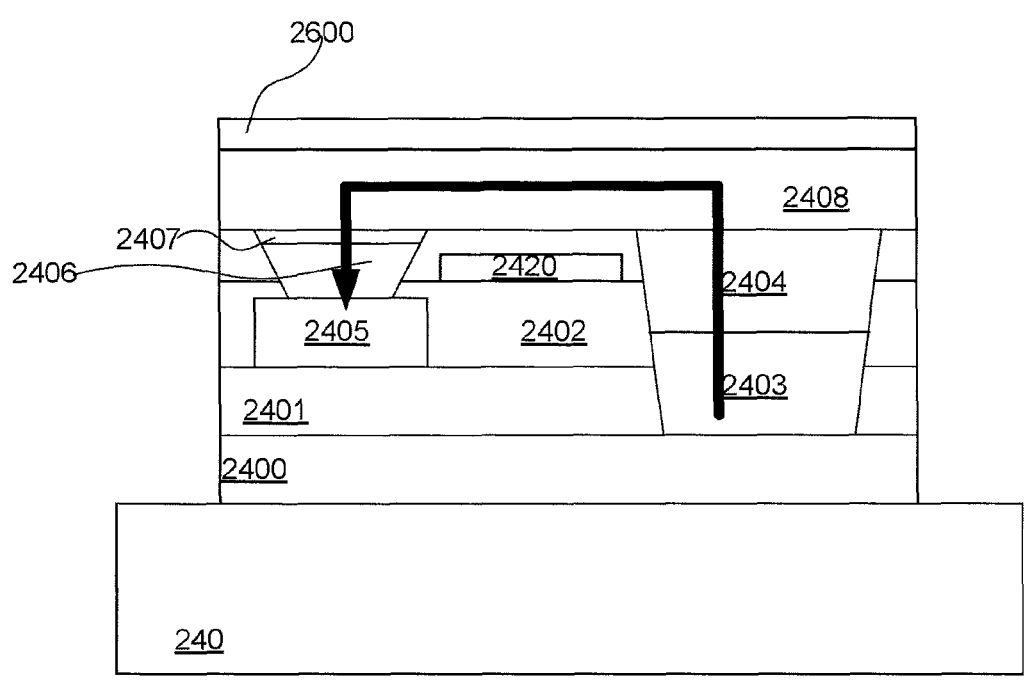
FIG. 26 illustrates a structure diagram depicting a pixel of the OLED panel according to a preferred embodiment of the present invention.

FIG. 26 illustrates a structure diagram depicting a pixel of the OLED panel according to a preferred embodiment of the present invention. Referring to FIG. 26, a low impedance material 2600 is evaporated on the emitting layer 2408. By the affection of the low impedance material 2600, the current is divided such that the current would not only flow through the shortest path. And, the breakdown of the OLED is eliminated.

Similarly, the pixel circuit in FIG. 7 can be adopted in this embodiment, and at least one TFT used by each pixel can be reduced to achieve the same display effect. In addition, the anode layer 2400 and the reference voltage layer 2420 can also adopt the non-transparent conductor material. Therefore, more variety of material can be adopted in the present invention.

Figure 27:
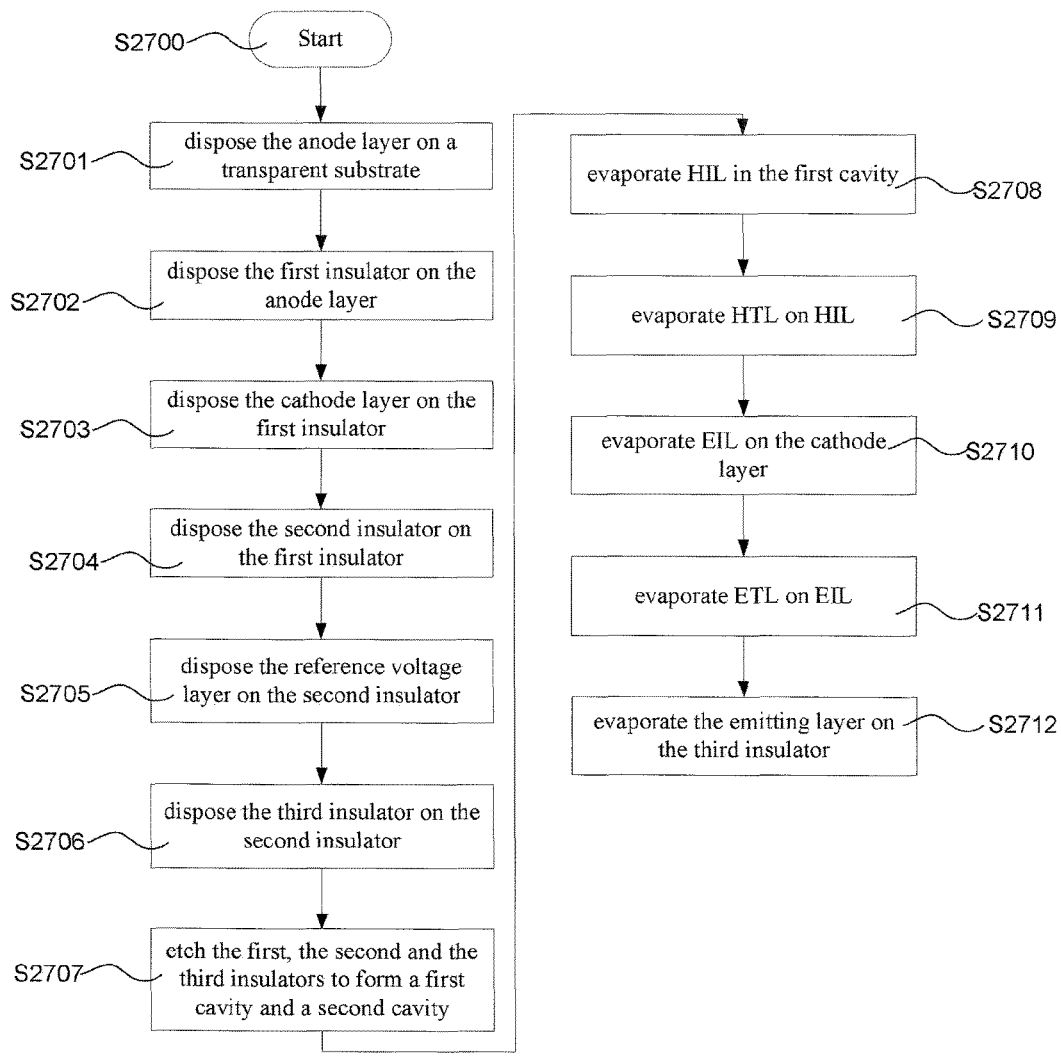
FIG. 27 illustrates a flowchart depicting the manufacturing method for organic light-emitting diode panel in FIG. 24 according to a preferred embodiment of the present invention.

FIG. 27 illustrates a flowchart depicting the manufacturing method for organic light-emitting diode panel in FIG. 24 according to a preferred embodiment of the present invention. The similar steps can refer to FIG. 12 and FIGS. 12A-12K, and the detailed description is omitted. In this embodiment, only the different steps S2705-S2707 are described.

Figure 27A:
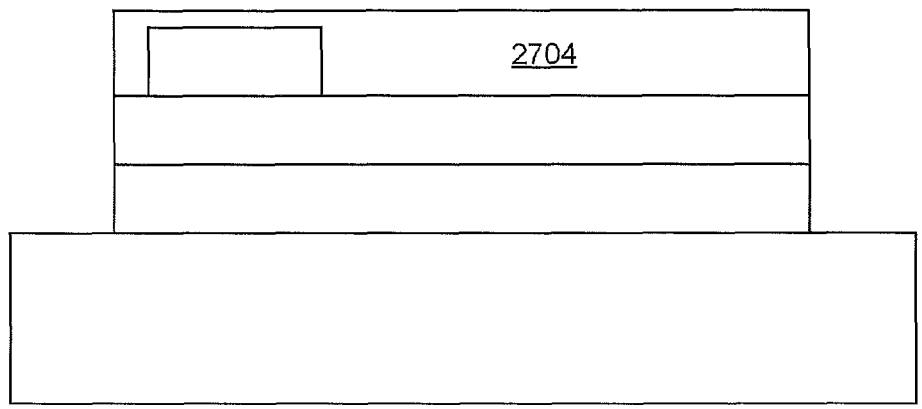
FIG. 27A illustrates a diagram depicting the step S2704 in the manufacturing method for organic light-emitting diode panel according to a preferred embodiment of the present invention.
Figure 27B:
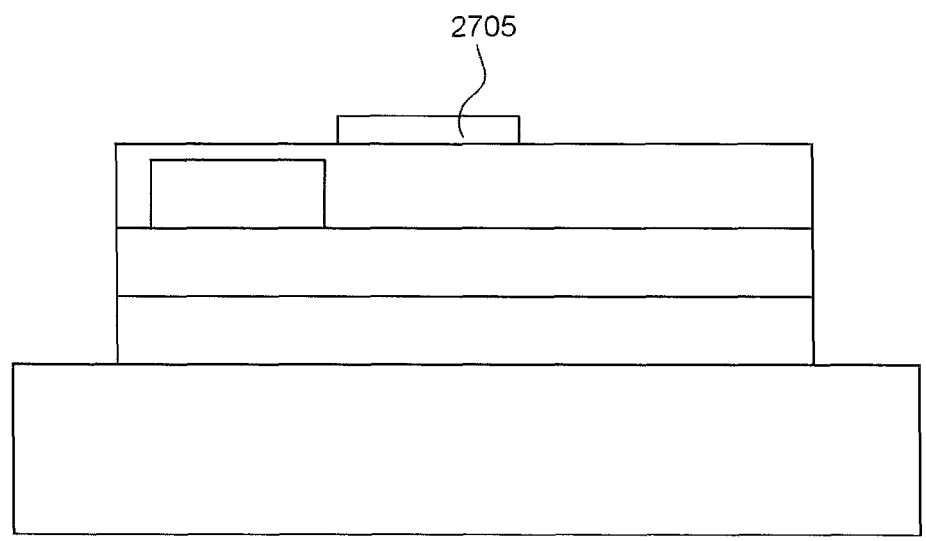
FIG. 27B illustrates a diagram depicting the step S2705 in the manufacturing method for organic light-emitting diode panel according to a preferred embodiment of the present invention.
Figure 27C:
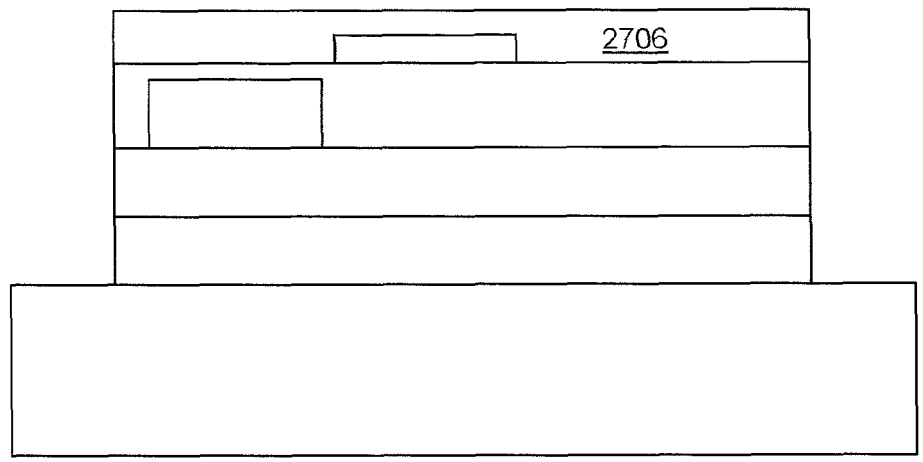
FIG. 27C illustrates a diagram depicting the step S2706 in the manufacturing method for organic light-emitting diode panel according to a preferred embodiment of the present invention.

In step S2705, after finish the step S2704, as shown in FIG. 27A, the reference voltage layer 2705 is disposed on the second insulator 2704 as shown in FIG. 27B. In step S2706, the third insulator 2706 is disposed on the second insulator 2704, as shown in FIG. 27C.

Figure 27D:
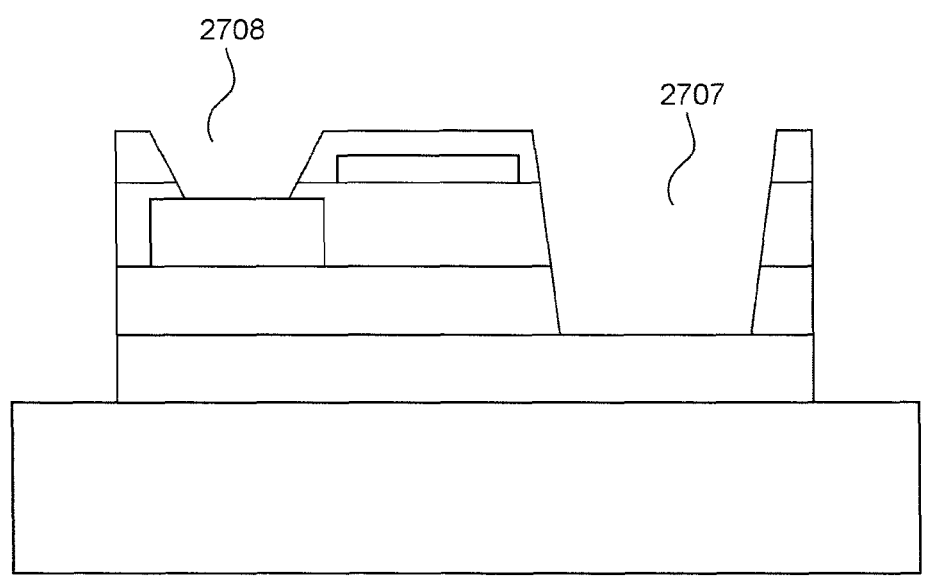
FIG. 27D illustrates a diagram depicting the step S2707 in the manufacturing method for organic light-emitting diode panel according to a preferred embodiment of the present invention.

In step S2707, the first insulator 2702, the second insulator 2704 and the third insulator 2706 are etched to generate a first cavity 2707 and a second cavity 2708 such that the anode layer 2701 and the cathode layer 2703 is exposed, as shown in FIG. 27D. In addition, the bottom of the second cavity 2708 is the cathode layer 2703, the material of the cathode layer 2703 may be the metal. Thus, the cathode layer 2703 would not be etched. It is noted that the reference voltage layer 2705 in this embodiment is disposed between the first cavity 2707 and the second cavity 2708. That is to say, the reference voltage layer 2705 can be disposed before the emitting layer to prevent the emitting layer from the damage caused by the high temperature process.

Figure 28:
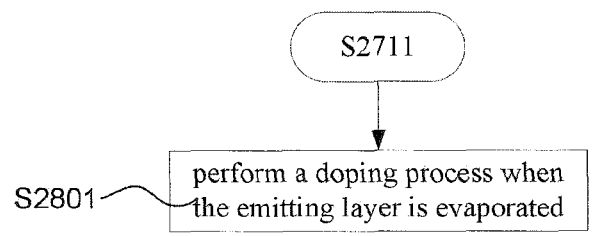
FIG. 28 illustrates a simplified flowchart depicting the manufacturing method for organic light-emitting diode panel according to a preferred embodiment of the present invention.

In the abovementioned embodiment, in order to effetely solve the breakdown of the 3-terminal OLED, two method can be adopted. FIG. 28 illustrates a simplified flowchart depicting the manufacturing method for organic light-emitting diode panel according to a preferred embodiment of the present invention. As shown in FIG. 28, In addition to the abovementioned steps S2700 to S2712, the method further includes the step as follow.

In step S2801, a doping process is performed when the emitting layer is evaporated. The doping carrier may be an organic material with donor dopant or an organic material with acceptor dopant. Thus, the electrical conduction of the upper layer of the emitting layer would be increased, and the current would trend to flow through the upper layer. The present invention is not limited thereto. In a preferred embodiment, the step S2801 may be performed during the process of the emitting layer 2408 since the dopant can be evaporated with the emitting layer 2408. Also, the step S2801 may be performed after the process of the emitting layer 2408. Therefore, the present invention is not limited thereto.

Figure 29:
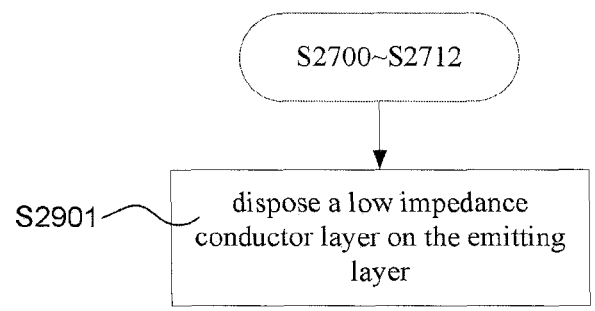
FIG. 29 illustrates a simplified flowchart depicting the manufacturing method for organic light-emitting diode panel according to a preferred embodiment of the present invention.

The abovementioned embodiment adopts the doping process to control the carrier concentration distribution of the organic emitting layer such that the concentration of the upper layer is higher. Thus, the current is adjusted to incline toward the upper layer of the emitting layer. Referring to FIG. 29, subsequent to the step S2712, the method further includes the step as follow.

In step S2901, a low impedance conductor layer is disposed on the emitting layer. The low impedance conductor layer may be the low impedance organic material, a transparent conductor or a thin film metal. By reducing the impedance of the upper layer, the current tends to flow to the upper layer, thereby the breakdown of the 3-terminal OLED in the embodiment of the present invention is eliminated.

In summary, the spirit of the present invention is to change the structure of OLED. The original stack manufacturing process is changed to the planar process, and the aperture rate is increased. Furthermore, a reference voltage layer is further added on the emitting layer such that the pixel can be operated as a 3-terminal device. As such, if the OLED pixel in the present invention is able to function as an active matrix OLED panel, at least one TFT can be removed compared to the traditional OLED pixel design. Thus, the process and the circuit complexity can be greatly reduced and the manufacturing cost can be also reduced.

In a further embodiment, between the insulators, a reference voltage layer is embedded. By the reference voltage layer, the current path in the emitting layer is controlled so that the OLED pixel can be controlled as the three terminal devices. Since this reference voltage layer is buried inside the insulators, the light transmittance is increased, and more variety of material can be adopted. And, the material is not limited to the transparent material.

In addition, in the white OLED, the stack structure of the white light OLED in the prior art is changed to a parallel structure in the present invention. And, the metal mask shifting method is adopted for the manufacturing method in the embodiments of the present invention, and manufacturing process is simplified. And, compared with the conventional manufacture, the manufacturing steps in the embodiments are more streamlined.

While the present invention has been described by way of examples and in terms of preferred embodiments, it is to be understood that the present invention is not limited thereto. To the contrary, it is intended to cover various modifications. Therefore, the scope of the appended claims should be accorded the broadest interpretation so as to encompass all such modifications.

What is claimed:

1. An organic light-emitting diode panel, comprising:
   at least a pixel, wherein the pixel comprises:
   an anode layer disposed on a substrate;
   a hole injection layer disposed on the anode layer;
   a hole transport layer disposed on the hole injection layer;
   an electron injection layer;
   an electron transport layer disposed on the electron injection layer;
   an emitting layer, disposed between the hole injection layer and the electron injection layer, wherein the emitting layer comprises at least a first color material and a second color material; and
   a cathode layer, disposed at a side the same as the anode layer opposite to the emitting layer;

wherein the pixel emits white light by mixing a first color light and a second color light, which are respectively emitted from the first color material and the second color material, wherein the pixel further comprises:

a first insulator, disposed on the anode layer, wherein the cathode layer is disposed on the first insulator; and a second insulator, disposed on the anode layer, having a first cavity and a second cavity, wherein a bottom of the second cavity exposes the cathode layer and a bottom of the first cavity exposes the anode layer.

2. The organic light-emitting diode panel according to claim 1, wherein the emitting layer comprises:

a first color emitting layer, disposed on the hole injection layer, comprising the first color material;

a second color emitting layer, disposed on the first color emitting layer, comprising the second color material; and a third color emitting layer, disposed on the second color emitting layer, comprising a third color material, wherein the electron injection layer is disposed on the third color emitting layer, wherein the pixel emits the white light by mixing the first color light, the second color light and a third color light, which are respectively emitted from the first color material, the second color material and the third color material.

3. The organic light-emitting diode panel according to claim 1, wherein the emitting layer comprises:

a first color emitting layer, disposed on the hole injection layer, comprising the first color material;

a second color emitting layer, disposed by a side of the first color emitting layer, comprising the second color material; and a third color emitting layer, disposed by a side of the second color emitting layer, comprising a third color material, wherein the electron injection layer is disposed on the emitting layer, wherein the pixel emits the white light by mixing the first color light, the second color light and a third color light, which are respectively emitted from the first color material, the second color material and the third color material.

4. The organic light-emitting diode panel according to claim 1, wherein the emitting layer further comprises:

a third color material, wherein the pixel emits the white light by mixing the first color light, the second color light and a third color light, which are respectively emitted from the first color material, the second color material and the third color material.

5. The organic light-emitting diode panel according to claim 1, wherein the hole injection layer is disposed on the first cavity, and disposed on the anode layer, the hole transport layer is disposed on the first cavity and disposed on the hole injection layer, the electron injection layer is disposed on the second cavity and disposed on the cathode layer, the electron transport layer is disposed on the second cavity and disposed on the electron injection layer, and the emitting layer is disposed on the second insulator.

6. The organic light-emitting diode panel according to claim 5, wherein the pixel further comprises:

a reference voltage layer, disposed on a side of the emitting layer, wherein a three-terminal OLED is formed by the anode layer, the cathode layer and the reference voltage layer.

7. The organic light-emitting diode panel according to claim 6, wherein the pixel further comprises:

a third insulator, disposed between the reference voltage layer and the emitting layer.

8. The organic light-emitting diode panel according to claim 6, wherein the reference voltage layer is disposed on the emitting layer.

9. The organic light-emitting diode panel according to claim 6, wherein the pixel further comprises:

an insulator, disposed on the anode layer and cathode layer, having a first cavity and a second cavity, wherein a bottom of the second cavity exposes the cathode layer and a bottom of the first cavity exposes the anode layer;

wherein the reference voltage layer is disposed under the emitting layer and in the insulator between the first cavity and the second cavity.

10. A manufacturing method for an organic light-emitting diode panel, comprising:

providing at least a pixel, wherein the pixel is fabricating by steps comprising:

disposing an anode layer on a substrate;

disposing a cathode layer on the substrate;

evaporating a hole injection layer on the anode layer;

evaporating a hole transport layer on the hole injection layer;

evaporating an electron injection layer on the cathode layer;

evaporating an electron transport layer on the electron injection layer; and evaporating an emitting layer between the hold injection layer and the electron injection layer, wherein the emitting layer comprises at least a first color material and a second color material, wherein the cathode layer is disposed at a side the same as the anode layer opposite to the emitting layer, wherein the manufacturing method further comprises:

disposing a first insulator on the anode layer, wherein the cathode layer is disposed on the first insulator;

disposing a second insulator on the first insulator; and etching the first insulator and the second insulator to form a first cavity and a second cavity, wherein the first cavity and the second cavity respectively exposes the anode layer and the cathode layer.

11. The manufacturing method according to claim 10, wherein the hole injection layer and the hole transport layer are evaporated in the first cavity, and the electron injection layer and the electron transport layer are evaporated in the second cavity.

12. The manufacturing method according to claim 10, wherein evaporating the emitting layer on the second insulator comprises:

evaporating the first color material;

evaporating the second color material by a side of the first color material; and evaporating a third color material by a side of the second color material.

13. The manufacturing method according to claim 10, wherein evaporating the emitting layer on the second insulator comprises:

evaporating the first color material;

evaporating the second color material on the first color material; and evaporating a third color material on the second color material.

14. The manufacturing method according to claim 10, wherein evaporating the emitting layer on the second insulator comprises the first color material and the second color material being evaporated at the same process.

15. The manufacturing method according to claim 10, further comprising:
 disposing a reference voltage layer on a side of the emitting layer.

16. The manufacturing method according to claim 15, wherein disposing the reference voltage layer on the emitting layer further comprises:
 disposing a third insulator between the reference voltage layer and the emitting layer.

* * * * *